US005863682A

United States Patent [19]
Abe et al.

[11] Patent Number: 5,863,682
[45] Date of Patent: Jan. 26, 1999

[54] CHARGED PARTICLE BEAM WRITING METHOD FOR DETERMINING OPTIMAL EXPOSURE DOSE PRIOR TO PATTERN DRAWING

[75] Inventors: Takayuki Abe; Susumu Oogi, both of Kawasaki; Takashi Kamikubo, Tokyo; Hirohito Anze, Kawasaki, all of Japan

[73] Assignee: Kabushiki Kaisha Toshiba, Kawasaki, Japan

[21] Appl. No.: 804,260

[22] Filed: Feb. 21, 1997

[30] Foreign Application Priority Data

Feb. 23, 1996 [JP] Japan .................................. 8-036441
Jan. 31, 1997 [JP] Japan .................................. 9-019396

[51] Int. Cl.$^6$ ............................. G03F 9/00; G03C 5/00
[52] U.S. Cl. ......................... 430/30; 430/296; 430/942; 250/492.2; 250/492.3
[58] Field of Search ........................... 430/30, 296, 942; 250/492.2, 492.3

[56] References Cited

U.S. PATENT DOCUMENTS

| 5,008,553 | 4/1991 | Abe ....................................... 250/492.2 |
| 5,051,598 | 9/1991 | Ashton et al. ........................ 250/492.2 |
| 5,305,225 | 4/1994 | Yamaguchi et al. ................ 364/474.02 |
| 5,451,487 | 9/1995 | Abe et al. .............................. 430/296 |

FOREIGN PATENT DOCUMENTS 2512184  4/1996  Japan .

OTHER PUBLICATIONS

Takayuki Abe, et al. The Representative Figure Method for the Proximity Effect Correction [III], Journal of Vacuum Science & Technology B, vol. 9, No. 6, (pp. 3059–3062), Nov./Dec., 1991.

Takayuki Abe, et al. "Representative Figure Method for Proximity Effect Correction", Japanese Journal of Applied Physics, vol. 30, No. 3B, (pp. L528–L531), Mar., 1991.

Fumio Murai, et al. "Fast Proximity Effect Correction Method Using a Pattern Area Density Map", Journal of Vacuum Science & Technology B, vol. 10, No. 6, (pp. 3072–3076), Nov./Dec., 1992.

Takayuki Abe. "Reticle Fabrication by High Acceleration Voltage Electron Beam: Representative Figure Method for Proximity Effect Correction [VI]", Journal of Vacuum Science & Technology B, vol. 14, No. 4, (pp. 2474–2484), Jul./Aug., 1996.

Takayuki Abe, et al. "Representative Figure Method for Proximity Effect Correction [II]", Japanese Journal of Applied Physics, vol. 30, No. 11A, (pp. 2965–2968), Nov., 1991.

J. M. Pavkovich. "Proximity Effect Correction Calculations by the Integral Equation Approximate Solution Method" Journal of Vacuum Science & Technology B, vol. 4, No. 1, (pp. 159–163), Jan./Feb., 1986.

Mihir Parikh. "Self–Consistent Proximity Effect Correction Technique for Resist Exposure (Spectre)", Journal of Vacuum Science & Technology, vol. 15, No. 3, (pp. 931–933), May/Jun., 1978.

T. R. Groves. "Efficiency of Electron–Beam Proximity Effect Correction", Journal of Vacuum Science & Technology B, vol. 11, No. 6, (pp. 2746–2753), Nov./Dec., 1993.

*Primary Examiner*—Christopher G. Young
*Attorney, Agent, or Firm*—Oblon, Spivak, McClelland, Maier & Neustadt, P.C.

[57] ABSTRACT

A charged particle beam writing method for determining an optimal exposure dose for each position in a pattern to be drawn on a target before actually drawing the pattern by irradiating the target with charged particles and drawing the pattern with the obtained optimal exposure doses, comprising the first step of determining the first approximate optimal exposure dose for each position on said target, the second step of determining the second optimal exposure dose for each position on said target by determining a corrective value di for correcting said first approximate optimal exposure dose obtained by multiplying the error in the exposure dose of the position produced when exposed to said first approximate optimal exposure dose by a regulation coefficient of a value substantially equal to the exposure dose U(x, y) to back scattering charged particles and adding said corrective value to said first approximate optimal exposure dose, said exposure dose being variable as a function of the location (x, y) of the position, the third step of repeating one of (1) the second step for a predetermined number of times, (2) the second step until each of said second approximate optimal exposure doses tends to converge, and (3) the second step until all the errors in said second approximate optimal exposure doses are found within a predetermined value.

20 Claims, 28 Drawing Sheets

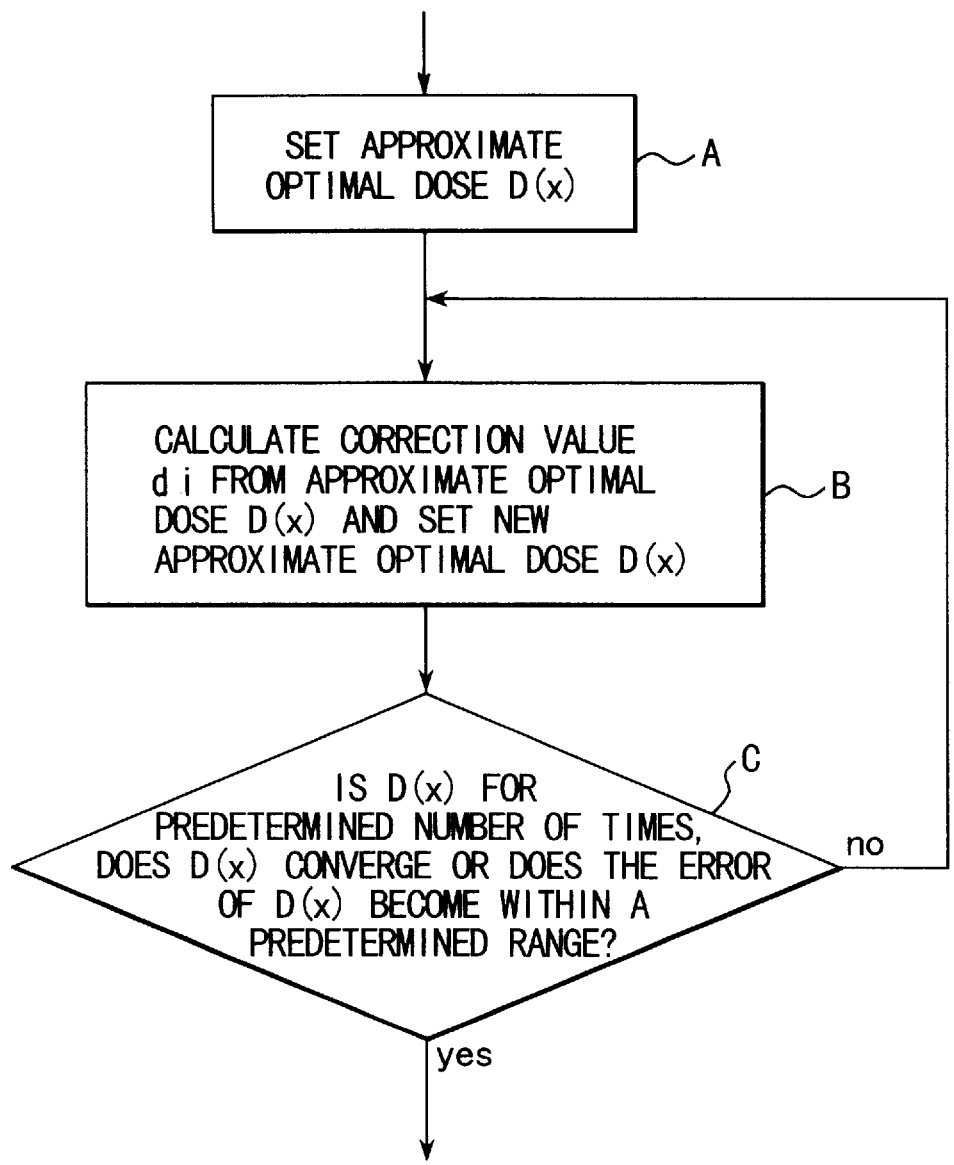
F I G. 3

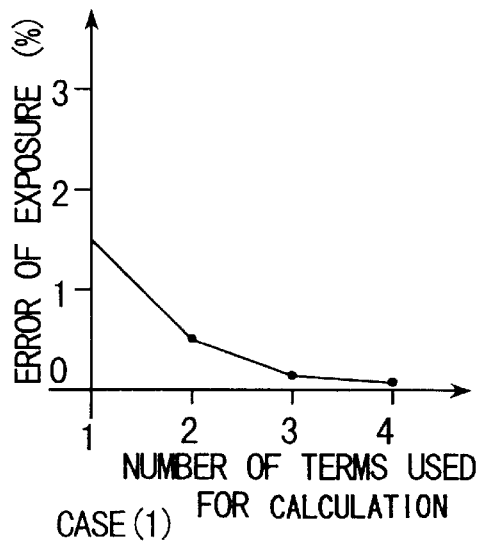
F I G. 8A
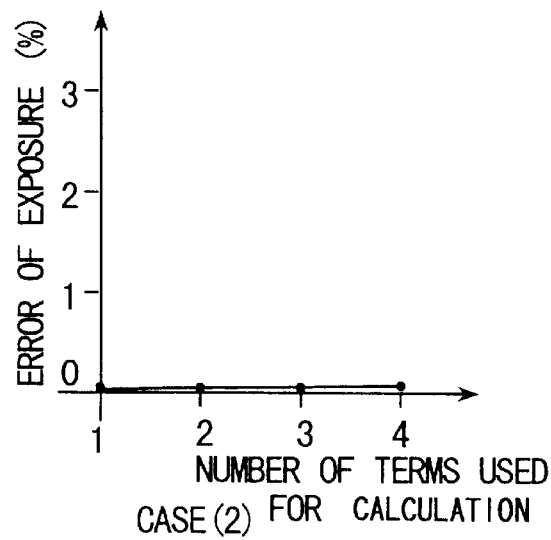
F I G. 8B
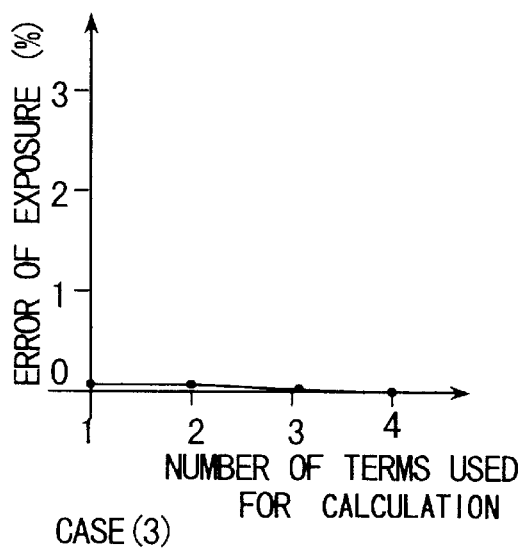
F I G. 8C
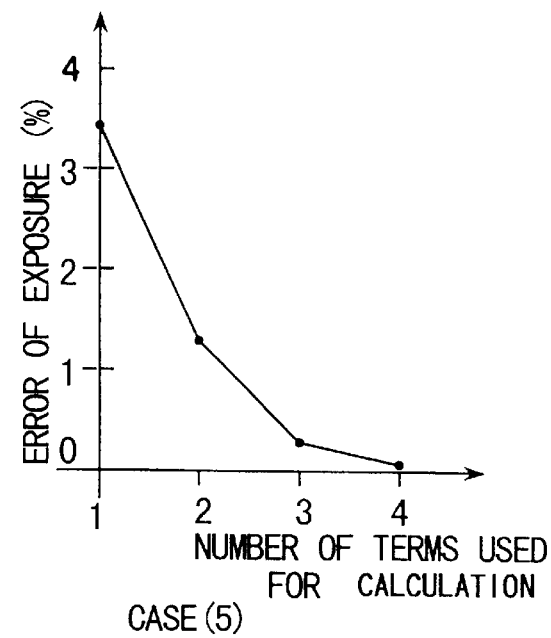
F I G. 8D

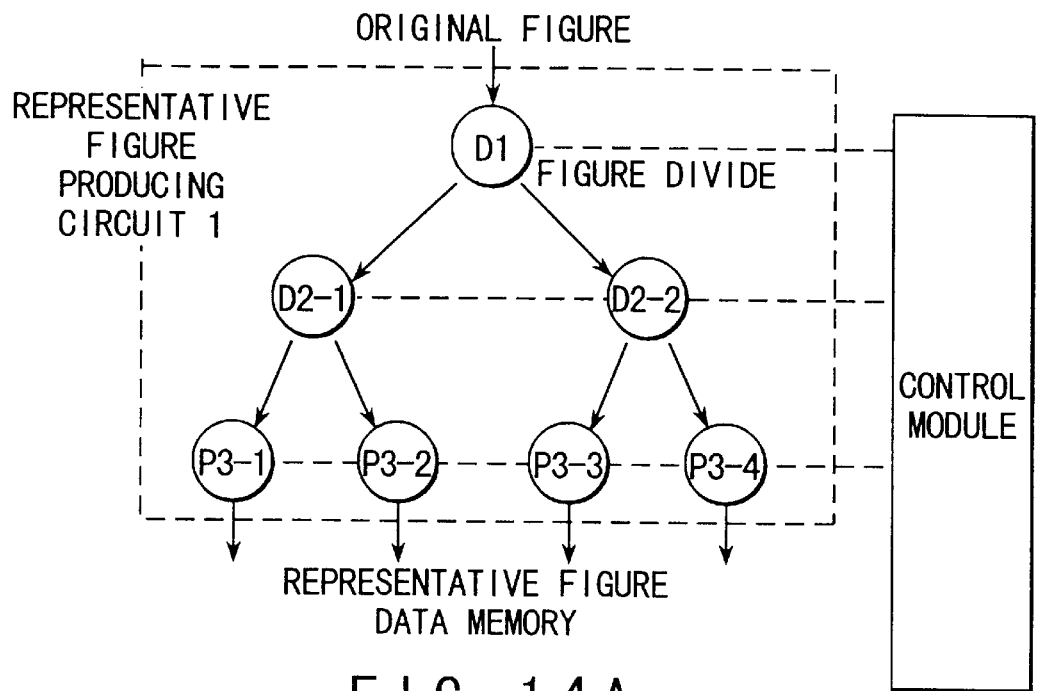
F I G. 14A
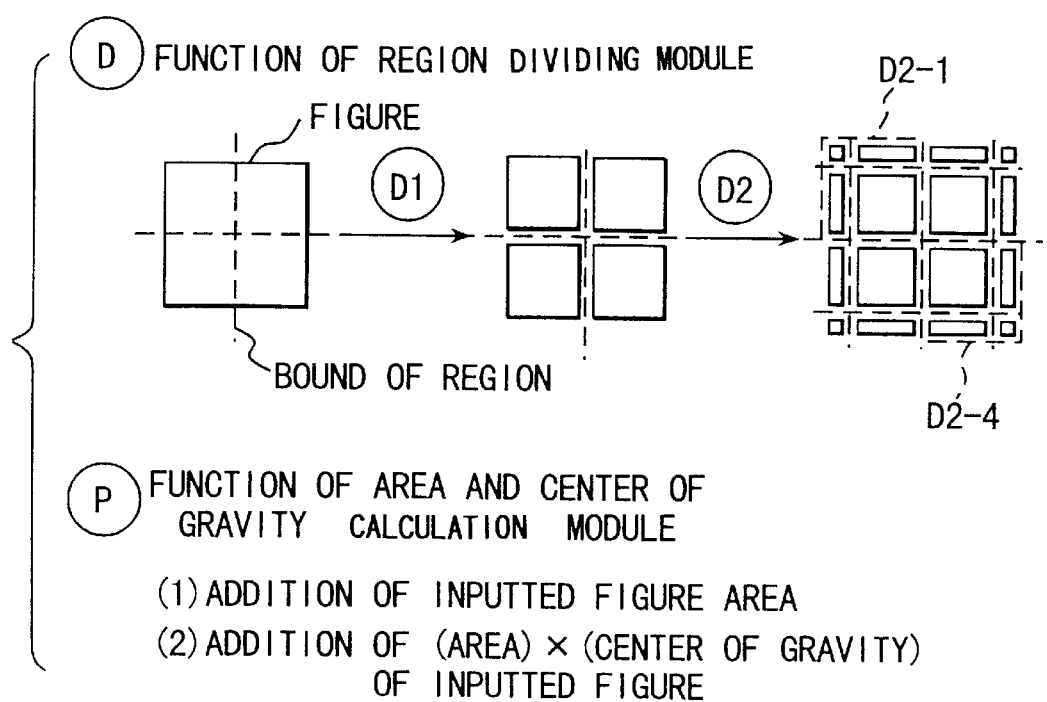
F I G. 14B

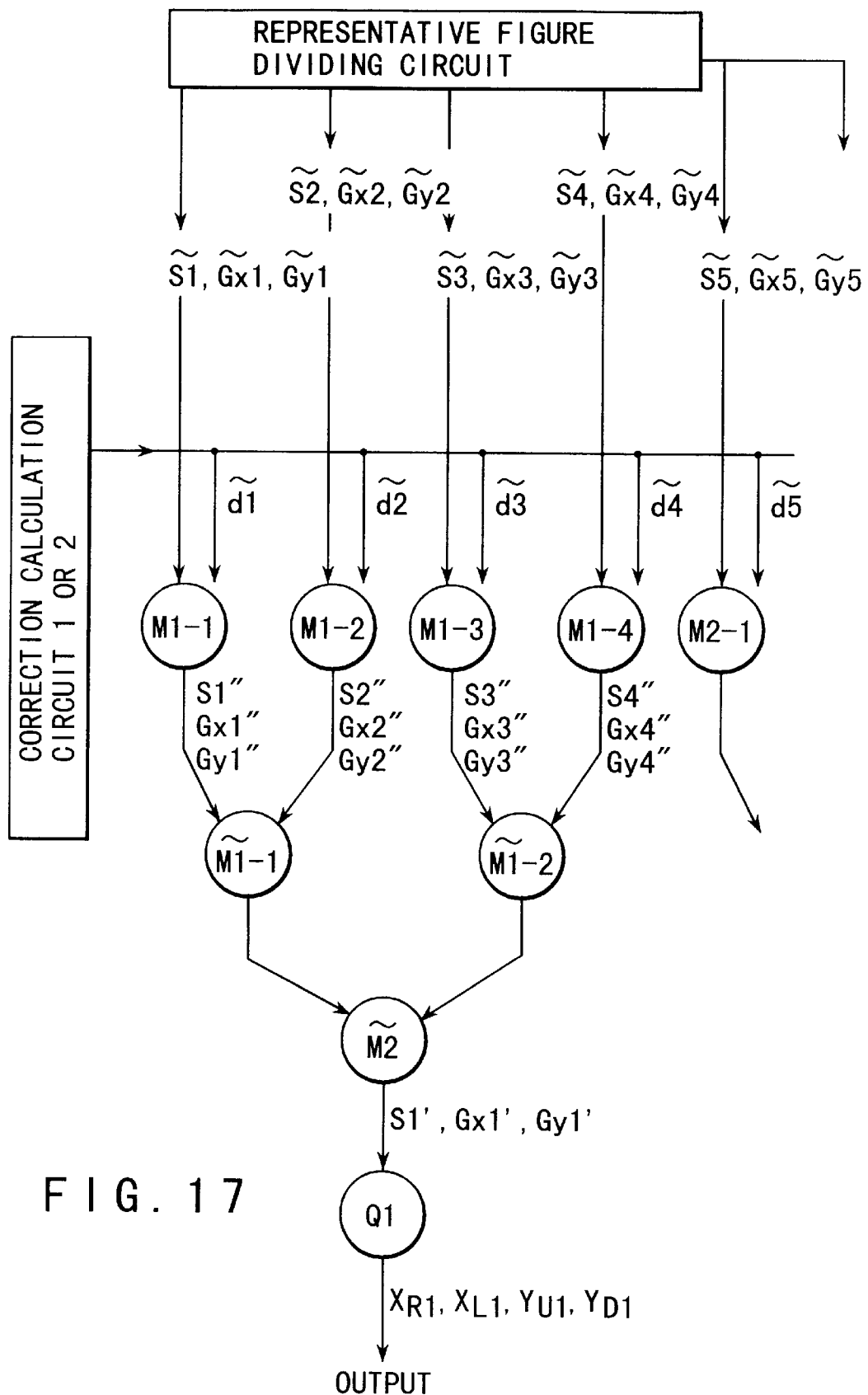
F I G. 17

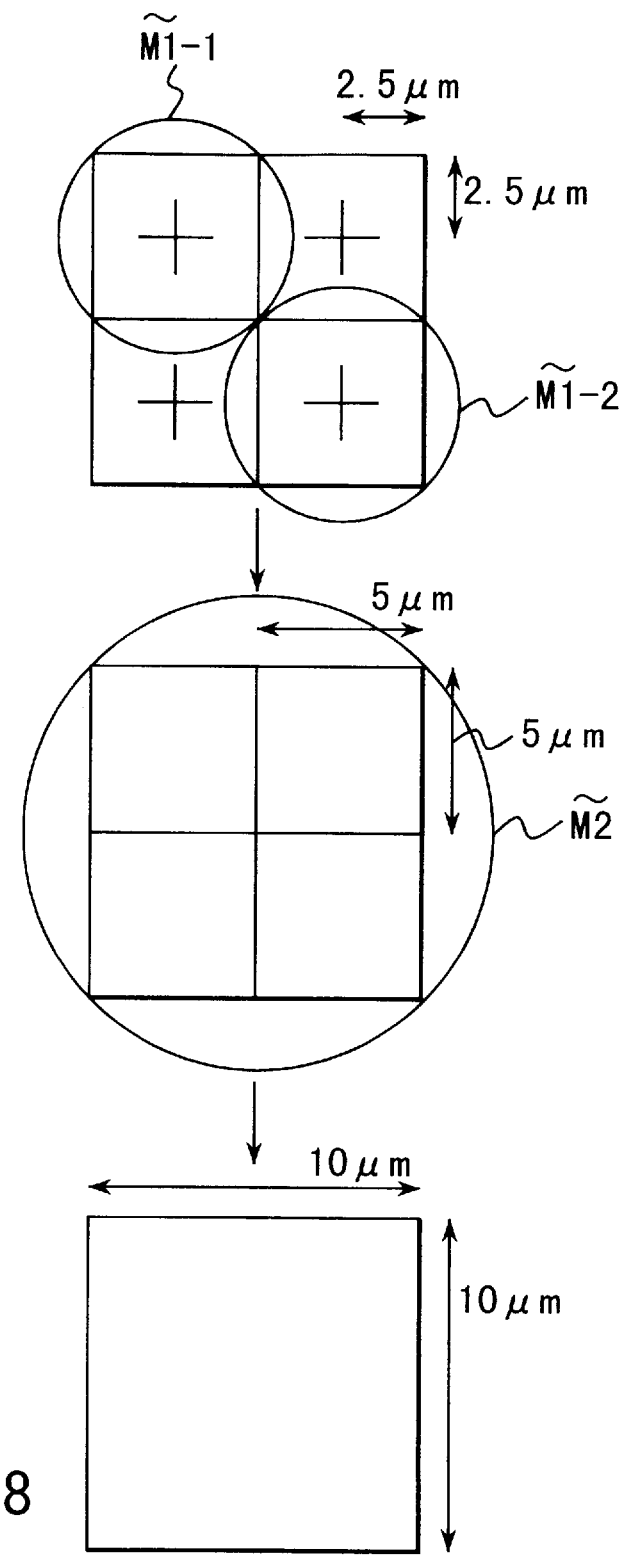
F I G. 18

CORRECTION CALCULATION CIRCUIT 1

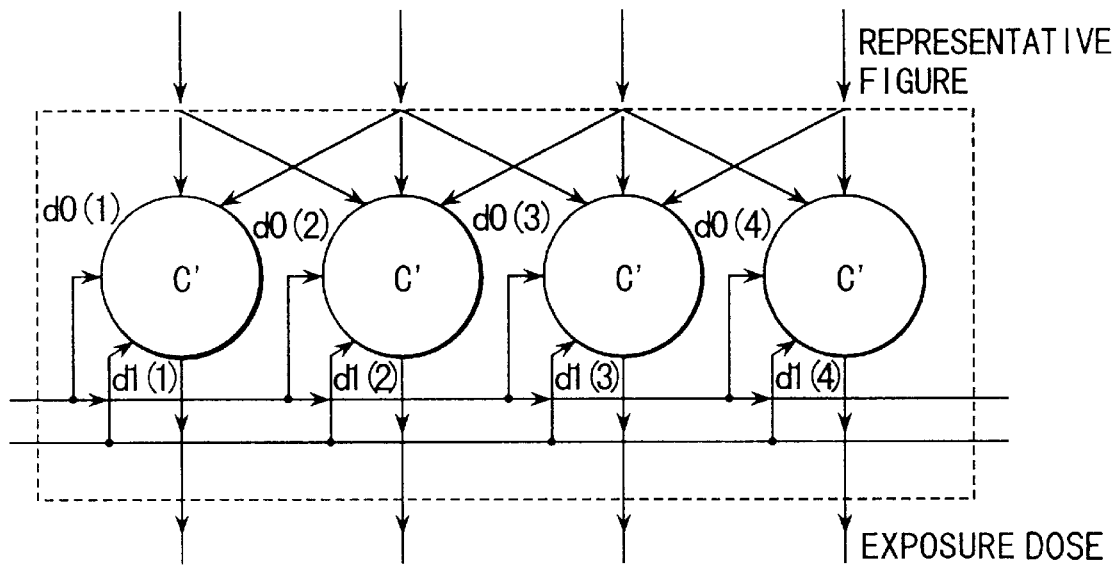

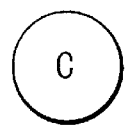 FUNCTION OF CORRECTION CALCULATION MODULE
CALCULATION OF CORRECTED EXPOSURE DOSE FROM CORRECTED REPRESENTATIVE FIGURE

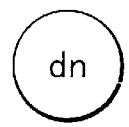 FUNCTION OF EXPOSURE DOSE CORRECTION MODULE
CALCULATION OF CORRECTIVE VALUE FOR CORRECTED EXPOSURE DOSE FROM CORRETED EXPOSURE DOSE COMPUTED LAST TIME AND CORRECTED EXPOSURE DOSE COMPUTED THIS TIME

FIG. 19

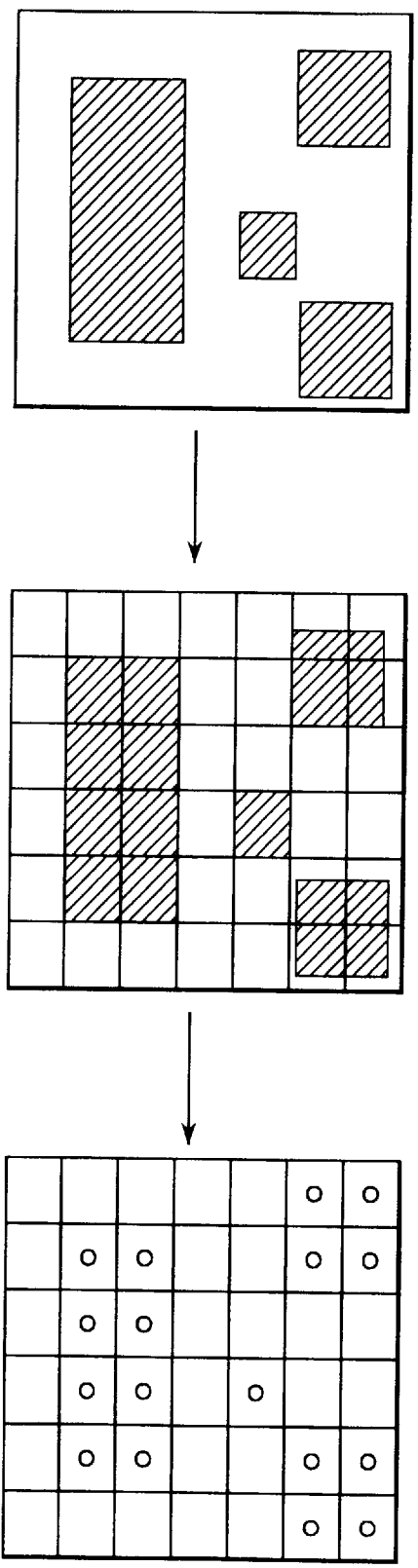
F I G. 23

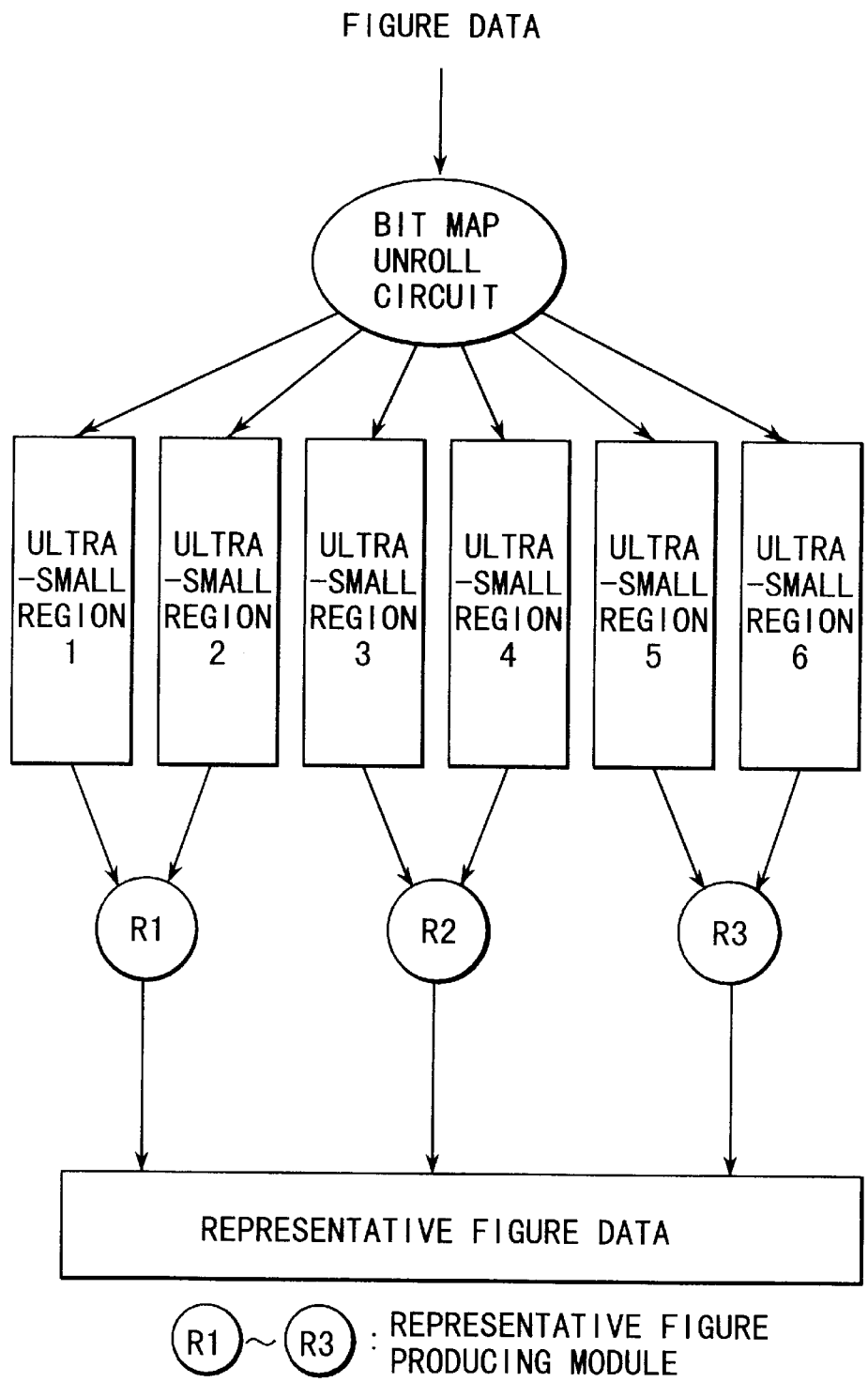
F I G. 24

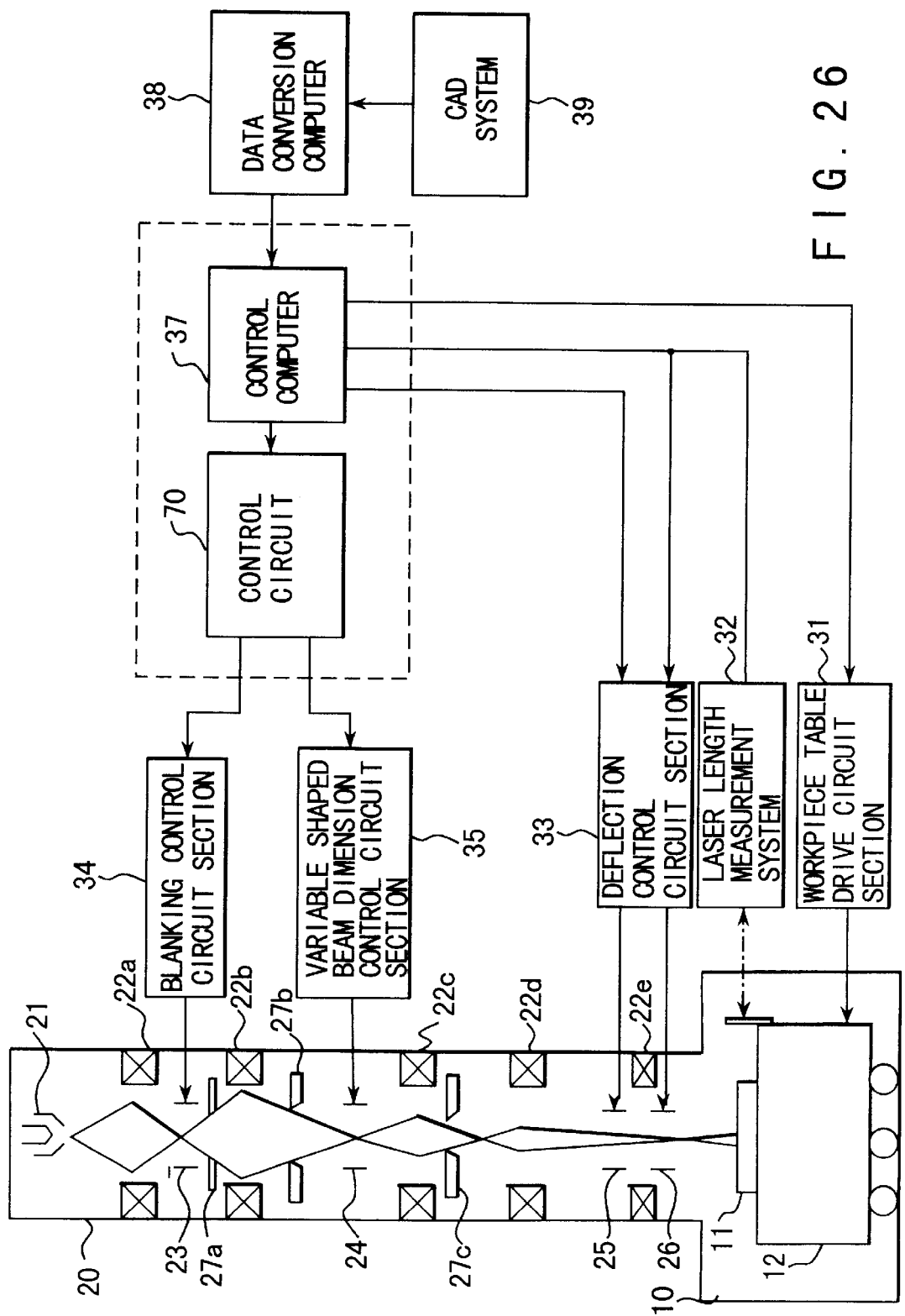
F I G. 26

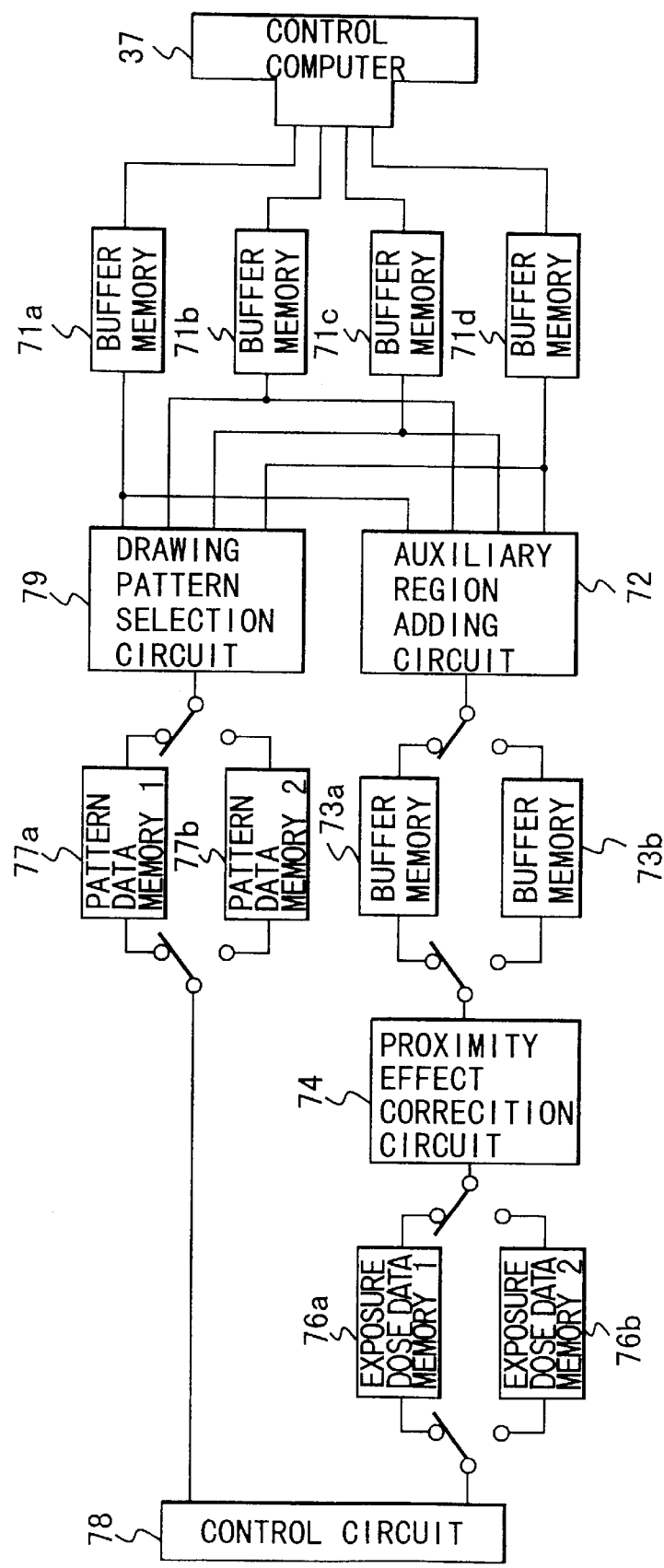
F I G. 2 8

CHARGED PARTICLE BEAM WRITING METHOD FOR DETERMINING OPTIMAL EXPOSURE DOSE PRIOR TO PATTERN DRAWING

BACKGROUND OF THE INVENTION

This invention relates to the technology of charged particle lithography and, more particularly, relates to a charged particle beam writing method and writing system to reduce a proximity effect.

In recent years, electron beam writing system have popularly been used for drawing fine patterns on samples such as semiconductor wafers and mask substrates. However, such apparatus are accompanied by a problem of distorted patterns given rise to by back scattering electrons, which is called as proximity effect.

The exposure dose correction method is an effective way of correcting the proximity effect. With this method, the exposure dose by electron beams is defined for each position to be exposed to electron beams on the sample as a function of the size of drawing pattern and the line density of the pattern to be drawn. Known techniques for defining the exposure dose include (a) the one using a matrix (M. Parikh, J. App. Phys. 19, p4371, p4378, p4383 (1979)) and (b) the one using simple approximation formulas (e.g., J. M. Parkovich, Journal of Vacuum Science & Technology B4, p159 (1986)).

With technique (a), the relationship between the exposure dose and the exposure dose is expressed in terms of a matrix for each position to be exposed to electron beams on the sample and an optimal exposure dose is obtained for the position by determining an inverse matrix for the given matrix. This technique is advantageous in that the determined optimal exposure dose is accurate if a sufficiently small figure is used for determining the exposure dose. On the other hand, it has a disadvantage of consuming enormous time for various calculations. For instance, several hundred to several thousand hours may be required to correct the exposure dose for an entire LSI chip for direct drawing.

With technique (b), an approximate optimal exposure dose D, is determined by calculation using, for example, the following formulas.

$$D' = C/(\tfrac{1}{2} + \eta U) \qquad \text{(i)}$$

$$U = (1/\pi) \int \exp\{-(x-x')^2\} dx' \qquad \text{(ii)}$$

where C is a constant and η is the ratio of the exposure dose of the applied resist to forward scattering electron beams to the exposure dose of the resist to back scattering electron beams. The integral of parameter U is determined for the area to be patterned.

(In the following description, the size, length and position of the figure are normalized so as to make the amplitude of back scattering $\sigma_b$ equal to 1.)

It will be understood by referring to FIG. 1 that equation (ii) can be transformed into formula (iii) below.

$$U = \Sigma \{ erf(x_{Ri}-x) - erf(x_{Li}-x) \} \times \{ erf(y_{Ui}-y) - erf(y_{Di}-y) \} \qquad \text{(iii)}$$

where erf represents an error function and the integration range is between 0 and u.

$$erf = \pi^{-\frac{1}{2}} \int \exp(-u^2) du \qquad \text{(iv)}$$

Thus, the exposure dose is estimated at position (x, y) and the addition using Σ is conducted for rectangles located, at least partly, within a circle having its center at (x, y) and a radius of about 2 to 3. The circle may be replaced by a square or a rectangle having its center also at (x, y) and sides that are about 4 to 6 long.

Calculations using formulas (iii) and (iv) can be carried out very quickly if the following procedures are employed.
(I) Prepare in advance a table for the error function.
(II) Determine the value of parameter U for each peripheral figure, using the table of (I) and carrying out the calculation of formula (iii).
(III) Determine an approximate optimal exposure dose, using the result of (II) and formula (i).

As will be seen from above, the technique of using approximation can be operated very quickly. In fact, the operation of correcting the LSI pattern directly drawn by electron beams can be carried out in an hour for a chip by also using the representative figure method. Note however, the obtained result represents an approximate value after all.

FIGS. 2A and 2B illustrate the error that occurs with the approximation technique. FIG. 2B shows the absorbed energy amount in a resist observed along the dotted chain line of FIG. 2A when a pattern as shown in FIG. 2A is irradiated with electron beams. In FIG. 2B, the solid line shows the ideal exposure dose, whereas the broken line shows the approximate exposure dose obtained by formula (i).

As shown in FIGS. 2A and 2B, the error in the exposure dose can be as large as 3 to 4%, which has been neglected but is not negligible when lines with a minimal width of less than 0.2 μm are drawn directly by electron beams. In the case of preparing a reticle, the lines on the reticle may show a width that is as small as less than 0.5 μm.

Calculations for proximity effect correction are performed for the entire area of the pattern to be formed by lithography to consequently give rise to a problem as described below if calculations are carried out for proximity effect correction within the electron beam writing system. For instance, if the calculations for proximity effect correction takes an hour and the lithographic operation also takes an hour, the time consumed for the entire operation including the operation of proximity effect correction will be two hours.

A huge amount of data is required for drawing a large LSI pattern and a high precision level is required for drawing an LSI pattern with an enhanced degree of integration. As a result, the time required for the calculations involved in the operation of proximity effect correction will become enormous than ever. If the time consumed for the calculations using hardware is held to a realistic level, the electron beam writing system cannot carry out a pattern drawing operation without a large set of figure data necessary for drawing a pattern. Thus, the time required for the calculations can significantly reduce the operating efficiency of the electron beam writing system. In some cases, the operation of proximity effect correction can take a large part of the operating hours of an electron beam writing system.

In short, known techniques of correcting the proximity effect by correcting the exposure dose are accompanied by the following problems. Firstly, while those involving the use of a matrix may be precise, they can consume a large amount of time for calculations. Secondly, accuracy is sacrificed if approximation is used for the calculations in order to reduce the time consumption. Thirdly, the time consumed for proximity effect correction increases with the increase in the size of the pattern to be drawn and the rise of the required precision level to consequently reduce the operating efficiency of the charged particle writing system.

BRIEF SUMMARY OF THE INVENTION

An object of the present invention is to provide a charged particle beam writing method that can carry out the calculations involved in the operation of drawing a pattern on a target (sample) within a time comparable to the time consumed for drawing the pattern by the approximation method and with a precision level comparable to that of the matrix method and to a charged particle writing system using such a method.

Another object of the invention is to provide a charged particle beam writing method that can reduce the time required for proximity effect correction and improve the operation of charged particle lithography and to a charged particle writing system using such a method.

The gist of the present invention is to calculate the approximate exposure dose and thereafter sequentially calculate correction values to be used for respective corrections in order to quickly get to an ideal optimal exposure dose. In order to further reduce the time required for calculations for calculating an approximately optimal exposure dose, the representative figure is subjected to a recalculation process, using a weight that may be the newest approximate exposure dose or the value by which the exposure dose is to be corrected.

According to a first aspect of the invention, a charged particle beam writing method for determining an optimal exposure dose for each position in a pattern to be drawn on a target before actually drawing the pattern by irradiating the target with charged particles and drawing the pattern with the obtained optimal exposure doses, is characterized by comprising: the first step of determining the first approximate optimal exposure dose for each position on said target; the second step of determining the second optimal exposure dose for each position on said target by determining a corrective value di for correcting said first approximate optimal exposure dose obtained by multiplying the error in the exposure dose of the position produced when exposed to said first approximate optimal exposure dose by a regulation coefficient of a value substantially equal to the exposure dose U(x, y) to back scattering charged particles and adding said corrective value to said first approximate optimal exposure dose, said exposure dose being variable as a function of the location (x, y) of the position; the third step of repeating one of (1) the second step for a predetermined number of times, (2) the second step until each of said second approximate optimal exposure doses tends to converge, and (3) the second step until all the errors in said second approximate optimal exposure doses are found within a predetermined value.

In above, configuration, if the exposure dose of the applied resist at location (x', y') is g(x-x', y-y') when charged particles are made to strike a single position (x, y) and the exposure dose to back scattering charged particles at location (x, y) is expressed by $U(x,y)=\int g(x-x',y-y')$, when the entire pattern is exposed to a unique and even exposure dose, the first approximate optimal exposure dose for location (x, y) of each position to be used in said first step is set to $C_1/(K_1+K_2 U(x, y))^{m_1}$, and the error in the exposure dose to be used in said second step is made equal to $\int\{d_{i-1}(x,y) - d_{i-1}(x',y')\}g(x-x',y-y')\,dx'dy'$, where $d_{i-1}$ is the corrective value obtained by the immediately preceding step or equal to $\int\{D_{i-1}(x,y) - D_{i-1}(x',y')\}g(x-x',y-y')\,dx'dy'$ using $D_{i-1}$ is the exposure dose obtained by the immediately preceding step, the corrective value $d_i$ being obtained by multiplying the error in the exposure dose by a regulation coefficient of $C_2/(K_3+K_4 U(x, y))^{m_2}$, or $C_2/(K_3+K_4 \tilde{D}(x, y))^{m_2}$, where $\tilde{D}(x, y)$ is one of the several approximate exposure doses obtained by said second step, $C_1$ is a constant to be regulated in correspondence to the level of standard exposure dose, $K_1$ and $K_3$ are constants for regulating the influence of the resolution of charged particles and that of the front scattering and have respective values between 0.2 and 1.0, $K_2$ and $K_4$ are values, each expressing a degree of proximity effect and having a value between $0.5\eta$ and $3\eta$ where $\eta$ is the ratio of the exposure dose of the resist to forward scattering charged particles to that of the resist to back scattering charged particles when the resist has a overall area entirely exposed to charged particles and sufficiently greater than the area exposed to back scattering charged particles, and n and m are exponents having appropriate respective values between 0.5 and 3. For determining the exposure dose U(x, y) to back scattering charged particles, the entire area to be lithographed is divided into small regions (first small regions), each being substantially equal to or smaller than the area exposed to back scattering charged particles to determine several different values characteristic to more than one element patterns existing inside each of the small regions, and the exposure dose U(x, y) is determined by using said several characteristic values or by determining one to several simple figures having several characteristic values same as said several characteristic values and using these figures in place of the original LSI pattern. The several characteristic values are those representing the surface areas of all the element patterns existing in the first small regions or the centers of gravity of the all the element patterns existing in the first small regions.

For instance, an optimal exposure dose D(x, y) may be determined in the following way.

$$D(x, y) = d_0(x, y) + d_1(x, y) + d_2(x, y) + \ldots d_0(x, y) = 1/\{\tfrac{1}{2} + \eta U(x,y)\}$$

(the first approximate optimal exposure dose indicated by (A) in FIG. 3)

$$d_i(x, y) = \eta \times d_0(x, y) \times \{d_{i-1}(x, y)U(x, y) - V_i(x)\}$$

where $\eta \times d_0(x, y)$ on the right side represents the regulation coefficient and the remaining terms represent the exposure dose error of the absorbed energy amount. Additionally, $$U(x) = \int \exp\{-(x-x')^2\}dx'/\pi$$

$$V_i(x) = \int \exp\{-(x-x')^2\}d_{i-1}(x')dx'/\pi$$

An integral range of U and Vi is a drawing part (pattern region).

In addition to the use of a representative figure, Steps of determining by calculating one of the effective exposure dose U and $\eta U$ by back scattered charged particles, an approximate optimal exposure dose and a corrective value for effectively correcting the approximate optimal exposure dose for each small region (second small region) sufficiently smaller than the area exposed to back scattering charged particles and used to divide the entire area to be lithographed; as operation of calculating the error in the exposure dose, determining a corrective value for correcting the approximate optimal exposure dose or a new approximate optimal exposure dose either by using the characteristic values for each of the first small regions determined in the preceding step (a) or by using new characteristic values obtained by determining new characteristic values characterizing each of said first small regions, using the corrective value $d_{i-1}$ obtained in the immediately preceding step or the weight of the approximate optimal exposure dose $D_{i-1}$ obtained in the preceding steps, or by determining new figures obtained from said new characteristic values to replace the original figures in each of the first small regions for each of the minute regions in the figures produced on the basis of said characteristic values; and carrying out a weighting operation for each of the locations (a), using the second small regions as units are further provided. In one of said step of determining correction amounts and said step of determining approximate optimal exposure dose, the first regions have surface areas sufficiently smaller than the amplitude σ of the back scattering and the characteristic values are obtained by multiplying the surface area of the pattern in each of said first small regions by the corrective value $d_{i-1}$ obtained in the immediately preceding step or the weight of the approximate optimal exposure dose $D_{i-1}$ obtained in the preceding steps. In the above step of determining new characteristic values, the first small regions have surface areas between ½ and 2 times of the amplitude σ of the back scattering and the characteristic values characterizing each of said first small regions are surface area=$\Sigma S_j$, center of gravity $_x=(\Sigma G_{xj}S_j)/(\Sigma S_j)$, and center of gravity $_y=(\Sigma G_{yj}S_j)/(\Sigma S_j)$ where, σ covers all the second small regions located within the first small regions, $S_j$ represents the new surface area of the inside of each of said second small regions effectively obtained by multiplying the surface area of the pattern found within the second small region j that is sufficiently smaller than the amplitude å of the back scattering existing in each of the first small regions by the corrective value $d_{i-1}$, and $G_{xj}$ and $G_{yj}$ represent the center of gravity of said pattern.

According to the first aspect of the invention, there is also provided a charged particle writing system for drawing a desired pattern on a target by irradiating the target with charged particles and modifying the exposure dose for each position on the pattern to be drawn in order to correct the proximity effect, is characterized by comprising: a first means for determining the first approximate optimal exposure dose for each position on said specimen; a second means for determining the second optimal exposure dose for each position on the specimen by determining a corrective value $d_i$ for correcting said first approximate optimal exposure dose obtained by multiplying the error in the exposure dose of the position produced when exposed to said first approximate optimal exposure dose by a regulation coefficient of a value substantially equal to the exposure dose U(x, y) to back scattering charged particles and adding said corrective value to said first approximate optimal exposure dose, said exposure dose being variable as a function of the location (x, y) of the position; a third means for drawing the pattern, using the optimal exposure dose for each position obtained by said second means. A fourth means for repeating the operation similar to that of said second means until each of said second approximate optimal exposure doses tends to converge or until all the errors in said second approximate optimal exposure doses are found within a predetermined value is further provided.

Now, the effect of the first aspect of the present invention will be described in items [I] through [V] below.

[I] The solution of exposure dose of the invention

According to the first aspect of the invention, an optimal exposure dose is precisely determined for each position on the target and a pattern is drawn on the target by using the determined optical exposure doses. The method for precisely obtaining optimal exposure doses will be described in item [IV] below. Here, the effect of the invention will be described firstly. While the use of electron beams are assumed in the following description, the description essentially applies also to ion beams.

The exposure dose of beams can be expressed by means of an n-nominal series such as a Fourier series, where n tentatively indicates the extent of variation.

$$D(x)=\Sigma d_n(x) \quad (1)$$

$$d_0(x)=1/\{\tfrac{1}{2}+\eta U(x)\} \quad (2)$$

$$d_n(x)=\eta d_0(x)\{d_{n-1}(x)\cdot U(x)-V_n(x)\}(n \geq 1) \quad (3)$$

$$U(x)=\int \exp\{-(x-x')^2\}dx'/\pi \quad (4)$$

$$V_n(x)=\int \exp\{-(x-x')^2\}d_{n-1}(x')dx'/\pi \quad (5)$$

where Σ covers a range between n=0 and infinity and the range of integration corresponds to that of the pattern to be drawn for both U and V, whereas η represents the ratio of the effective exposure dose of (exposure dose of the resist to) forward scattering electron beams to the effective does of (exposure dose of the resist to) back scattering electron beams. The range of integration corresponds to that of the entire area exposed to electron beams (the entire pattern) in the strict sense but may alternatively be those of a simple figure such as a circle having a diameter three times greater than the amplitude of the back scattering and the center located at position x.

Function $d_n(x)$ is a part of optimal exposure dose D(x) that corresponds to the n-th term characterizing one of the variations for function D(x). U(x) is the effective exposure dose of the resist for back scattering electron beams (hereinafter referred to as a back scattering exposure dose) when the pattern is drawn without correcting the proximity effect. Function $V_n(x)$ represents the back scattering exposure dose when the pattern is drawn with the exposure dose of the next lower order or $d_{n-1}(x)$.

The following conclusions can be drawn from the above equations. A Pavkovich's approximation is obtained if only the first term of equation (1) is used. In other words, the Pavkovich's approximation gives rise to an error attributable to the neglect of all the succeeding terms starting from the second term. Thus, the error produced by a known direct drawing technique is attributable to the neglect of all the succeeding terms starting from the second term.

[II] The accuracy of the obtained exposure dose and a quick convergence

It can be concluded from equation (3) that D(x) represents a perturbation development of $\eta^2/\{\tfrac{1}{2}+\eta U(x)\}^2$ (as will be described in greater detail in [V] below). Since both η and $\{\tfrac{1}{2}+\eta U(x)\}$ are raised to the second power, it will be seen that series (1) converges quickly.

FIG. 4 schematically illustrates the result of a simulation using a large pattern and a smaller pattern located close to the large one (a typical example for which any known techniques cannot provide a reliable level of accuracy). If estimated conservatively, it will be understood that the use of the first three terms can provide a practical and reliable level of accuracy (with an error level of 0.5% or less).

Thus, with the above technique, the accuracy of correction can be improved by increasing the number of terms to be used in equation (1), which converges very quickly and hence can be calculated at high speed as will be seen from FIG. 4.

[III] Correction of representative figure method

As will be described below, the above described method matches well to the representative figure method and allows high speed processing operations. The time (quantity) consumed for the calculation of function $d_n(x)$ is mostly dedicated to the operation of determining the value of function $U(x)$ (when $n=0$) and that of function $V_n(x)$ (when $n \geq 1$). However, the conventional representative figure processing operations can be used for determining the value of function $U(x)$. Additionally, as shown below, the representative figure method can be used for determining the value of function $V_n(x)$. Equation (5) above can be transformed to equation (6) below. Note that, however, the range of integration for V is that of the old representative figure.

$$V_n(x) = \int \exp\{-(x-x')^2\} \cdot \{d_{n-1}(x')dx'\}/\pi \qquad (6)$$

This transformation is possible because the error between the integration using the original pattern and the one using the old representative figure is negligible. The above formula represents an integration where minute area dx' is weighted with a lower order exposure dose $d_{n-}(x')$. Therefore, if the old representative figure is divided into small sections and a new representative figure is prepared by weighting the area of each of the divided pattern with a lower order exposure dose $d_{n-1}(x')$, the value of $V_n$ can be determined by using the equation below. Note that the range of integration for V corresponds to that of the new representative figure.

$$V_n(x) = \int \exp\{-(x-x')^2\} dx'/\pi \qquad (7)$$

The following procedural steps are used when equation (7) is employed for the calculation of $V_n(x)$.

(a) Prepare a representative figure from the original pattern for each of the first regions.

The size of each region is substantially equal to the amplitude $\sigma_b$ of back scattering: about 10 to 15 μm (50 kV, Si direct drawing).

(b) Calculate $d_0(x)$ after calculating U, thereafter calculate $V_i$ by the following procedure. Therefore, set i=1 to initialize.

(c) Prepare a new representative figure.

(i) The old representative figure is divided by the second small regions.

The size of each region is substantially equal to the selected exposure dose, that is, sufficiently smaller than the amplitude $\sigma_b$ of back scattering: 2 μm (50 kV, Si direct drawing).

(ii) The area of the pattern or the representative figure in each of the regions of (i) is weighted with $d_{i-1}$ to determine the area and the center of gravity of each of the second regions.

(d) Carry out calculations for $V_i$ by using equation (7) and the representative figure of (c) and also for $d_i(x)$ by using equation (3).

(e) Increment i and repeat (c) and (d). After repeating (c) and (d) for a predetermined number of times (e.g., once), determine optimal exposure dose D(x), using $$D = d_0 + d_1 + d_2 + \ldots + d_n$$

Of the above procedural steps, (a) and (b) are same as those of the conventional approximation. Since the calculation operations of (d) is mostly dedicated to $V_n$, the time required for (d) is substantially equal to the time consumed for (b). The time required for the calculations of (c) is shorter than the time required for (a) because the inputs of (a) include many small patterns with an minimal line width of not greater than 0.5 μm whereas those of (c) include only a single old representative figure for each of the first regions.

If the time required for (a), (b) and (c) is T and (c) takes T/5, then 2T will be spent for conventional approximation method.

On the other hand, with the above described method of the invention, if the exposure dose is assumed to be equal to the sum of the first two terms or $d_0 + d_1$ of the above equation, the time required for (a), (b) and (c) will be 2T+T+0.2T=3.2T. By referring to FIG. 4, it will be understood that the accuracy of correction is improved to be about three times as high as that of the conventional approximation technique, an accuracy level of thrice of that of the conventional approximation method can be achieved within a period of time only 1.6 times longer than the time required for the conventional method. If the first three terms of $d_0 + d_1 + d_2$ are used for the exposure dose, the time required for the calculation operations of (a), (b) and (c) to achieve an accuracy of correction six times as high as that of the conventional approximation method will be 2T+2×(T+0.2T) =4.4T, which is only 2.2 times of its counterpart of the conventional method.

Thus, the above described method of the invention can realize a remarkably improved level of accuracy, using at most only a time period twice as long as the time consumed for the conventional approximation method.

Thus, the formulas provided by the present invention accurately express an optimal exposure dose for the purpose of the invention, converges quickly and allows the used of the representative figure method so that a remarkably improved level of accuracy can be achieved with a time period twice at most as long as the time consumed for the conventional approximation method.

[IV] Getting to Solution (1) Introduction

Assume here the use of a popular energy threshold model (that is prepared by neglecting any characteristics of the resist to be used and assuming that the final pattern is defined only by an energy threshold). Also assume the use of a high voltage electron beam lithography system that is advantageous for producing high resolution high precision patterns. Correspondingly, assume that there is no front scattering and the beam resolution is equal to zero.

If electron beams strike a position at location x', the effective exposure dose (energy) E(x) of the resist at location x is expressed by the equation below.

$$E(x) = \delta(x-x') + \eta g(x-x') \qquad (8)$$

where the first term of the right side represents the direct exposure dose of the resist to electron beams and the second term represents the exposure dose of the resist to back scattering electron beams. Letter $\eta$ expresses the ratio of the two terms. Various specific expressions have been proposed for function g(x) by taking the type of substrate and the approximation technique to be used into consideration. A pair of typical expressions are shown below.

$$g(x) = \exp(-x^2)/\pi \qquad (9)$$

(double Gaussian approximation: in case of direct drawing, etc.)

$$g(x) = \exp(-x^2)/\pi + (\eta_k/\sigma_k^2) \cdot \exp(-x^2/\sigma_k^2)/\pi \qquad (10)$$

(triple Gaussian approximation: drawing using X-ray mask)

The length is standardized so as to make the amplitude of back scattering equal to 1. $\eta_k$ is the ratio of the first and second terms for back scattering and $\sigma_k$ is the amplitude of back scattering of the second term. An optimal exposure dose D(x) to be achieved by exposure dose correction can be obtained by solving the integral equation $$D(x)/2 + \int \eta D(x') \cdot g(x-x') dx' = 1 \quad (11)$$

under the following conditions. The range of integration is that of drawing.

$D(x)$=positive (drawing area) (positive exposure dose) (condition 1)

$D(x)$=0 (non-drawing area) (no exposure dose) (condition 2)

practical calculation time

A half of the first term of the left side of equation (11) is a parameter for providing a constant effective exposure dose at the terminal portions of all the patterns, which may be changed to $1/3$ or $2/3$ depending on the type of the resist and the developing conditions. If it is changed, the corresponding numerical values discussed hereinafter may also be changed.

While the above equation is linear and hence well adapted to the purpose of the invention, a pair of incidental conditions can complicate the matter.

Pavkovich got to his approximate solution in the following way. Since $D(x')$ fluctuates small, an approximation is prepared by neglecting fluctuations within the range of integration and $D(x')$ within the integration is replaced by $D(x)$ so that the integral formula of equation (11) may be approximately expressed by formula (12) below, provided that the range of integration is also that of drawing.

$$\int D(x')g(x-x')dx' \to D(x)\int g(x-x')dx' \quad (12)$$

Thus, equation (11) is transformed as follows.

$$D(x)/2 + \eta D(x)\int g(x-x')dx' = 1 \quad (13)$$

Pavkovich's approximate solution is obtained.

$$D(x) = 1/\{1/2 + \eta U(x)\},$$

$$U(x) = \int g(x-x')dx' \quad (14)$$

The error involved in the above replacement makes it impossible to provide a satisfactory correction accuracy. To the contrary, the present invention can provide accurate expressions because it takes the above error into consideration.

(2) Getting to the Solution

Since the following discussion does not rely on the approximation of function g, it can also be applied to X-ray masks, although double Gaussian approximate expression (9) will be used in the discussion because of its simpleness and popularity.

The following discussion is based on a perturbation theory, which is, however, not the known general perturbation theory of simple expansion of very small quantities but a new theory for "perturbation to be realized in a real space for the fluctuating frequency of exposure dose".

Exposure dose $D(x)$ is developed as follows by using an unknown function $d_n(x)$ as in the case of development of a Fourier series. Note that $\Sigma$ covers a rage of addition between n=0 and infinite.

$$D(x) = \Sigma d_n(x)\xi^n \quad (15)$$

As will be described below, the frequency of function $d_n$ to be obtained ultimately will increase in response to the increase of n. In this sense, the above equation is like the expansion of a Fourier series. The symbol of $\xi$ is used to represent the degree of perturbation, which will ultimately be made equal to 1. The following equation is obtained by substituting equation (11) with equation (15).

$$\Sigma\xi^n d_n(x)/2 + \eta\Sigma\xi^n\int d_n(x')g(x-x')dx' = 1 \quad (16)$$

The second term of the left side can be transformed as follows.

$$\eta\Sigma\xi^n\int d_n(x')g(x-x')dx' = \eta\Sigma\xi^n d_n(x)\int g(x-x')dx' + \eta\{\Sigma\xi^n\int\{d_n(x') - d_n(x)\}g(x-x')dx' \quad (17)$$

The above equation indicates that, if the first term of the right side is used to neglect the fluctuations in the integration of function $d_n$, there arises an error expressed by the second term of the right side. Hence, the second term is small than the first term and contains information on higher frequencies. On the basis of this physical understanding, the representative symbol of $\xi^n$ may be replaced by $\xi^{n+1}$ to obtain the following expression.

$$\eta\Sigma\xi^n\int d_n(x')g(x-x')dx' = \eta\Sigma\xi^n d_n(x)\int g(x-x')dx' + \eta\{\Sigma\xi^{n+1}\int\{d_n(x') - d_n(x)\}g(x-x')dx' \quad (18)$$

The following expression can be drawn by using the matching degree for symbol $\xi$ and substituting equation (16) with the above formula.

$$\Sigma\xi^n d_n(x)/2 + \eta\Sigma\xi^n d_n(x)\int g(x-x')dx' = 1 - \eta\{\Sigma\xi^n\int\{d_{n-1}(x') - d_{n-1}(x)\}g(x-x') \quad (19)$$

Thus, the following simple expressions are obtained for the unknown function of $d_n(x)$ with each degree of symbol $\xi$.

$$d_n(x)\{1/2 + \eta U(x)\} = \eta\{d_{n-1}(x)U(x) - V_n(x)\}(n\geq 1) d_0(x)\{1/2 + \eta U(x)\} = 1(n=0) \quad (20)$$

Where, $$U(x) = \int g(x-x')dx' \quad (21)$$

$$V_n(x) = \int d_{n-1}(x')g(x-x')dx' \quad (22)$$

are used for the above expressions. Thus, consequently the following solution can be obtained.

$$d_n(x) = \eta\{d_{n-1}(x)U(x) - V_n(x)\}/\{1/2 + \eta U(x)\}(n\geq 1) \quad (23)$$

$$d_0(x) = 1/\{1/2 + \eta U(x)\}(n=0) \quad (24)$$

If $n\geq 1$, the right side of the above equation corresponds to the fluctuating terms of higher degrees neglected in the operation of determining the value of $d_{n-1}$. Thus, the fluctuations of function $d_n$ will increase in response to the increase of n. In this sense, the expansion of formula (14) is like the development of a Fourier series.

Since the above special perturbation theory is new, its convergency and other characteristic features have to be rigorously examined from a mathematical point of view, although it seems to be convergent if viewed physically and intuitively for the following reason. Exposure dose $D(x)$ in equation (11) contributes to the effective does in the form of convolution with function $\exp\{-(x-x')^2\}$ and, therefore, the possible functional variations of exposure dose $D(x)$ can be as much as $\exp\{-(x-x')^2\}$ at most. If any, such variations are made very small through calculation operations for convolution to contribute less to the equation (for instance, a function that fluctuates violently around zero and a function that fluctuate slowly around zero are converged to zero by convolution).

[V] On convergency

With the obtained solution, the value of the function $d_n(x)$ decreases as that of n increases. This can be expressed by a term of the simplest first degree of $d_1(x)$.

$$d_1(x) = [\int \{d_0(x) - d_0(x')\} g(x-x') dx'] / \{\tfrac{1}{2} + \eta U(x)\} \quad (25)$$

The above formula can be transformed for the integration contained therein as follows, where Q represents the integration.

$$Q = g(x-x') / \{\tfrac{1}{2} + \eta U(x)\} - g(x-x') / \{\tfrac{1}{2} + \eta U(x')\} \quad (26)$$

The outcome of the above equation may be roughly evaluated by subjecting the second term to Tailor expansion around x for x−x' up to the first degree as follows.

$$Q = \eta\{(x-x') \cdot \nabla U(x)\} / \{\tfrac{1}{2} + \eta U(x)\}^2 \quad (27)$$

where · denotes the inner product and ∇ denotes the operators of partial differentiation (∂/∂x, ∂/∂y).

By using this for the integration in equation (25), $d_1'$ can be expressed by the following formula to roughly grasp function $d_1(x)$.

$$d_1' = \eta^2 \int \{(x-x') \cdot \nabla U(x)\} g(x-x') dx' / \{\tfrac{1}{2} + \eta U(x)\}^3 \quad (28)$$

The integration in the above equation can be further transformed by using formula (9) for g(x) as follows.

$$d_1' = (\eta^2/2)\{\nabla U(x) \cdot \nabla U(x)\} / \{\tfrac{1}{2} + \eta U(x)\}^3 \quad (29)$$

Thus, the ratio of $d_1'$ to the term of the 0-th degree, $d_0(x)$ can be expressed by the formula below.

$$(\eta^2/2)\{\nabla U(x) \cdot \nabla U(x)\} / \{\tfrac{1}{2} + \eta U(x)\}^2 \quad (30)$$

The above description applies to the terms of higher degrees so that it will be seen that the obtained solution is converged to the formula below.

$$[(\eta^2/2) / \{\tfrac{1}{2} + \eta U(x)\}^2]^n \quad (31)$$

According to a second aspect of the invention, there is provided a charged particle beam writing method for drawing a desired pattern by processing a first set of figure data for drawing the pattern on a stripe by stripe basis and irradiating the surface of a target with charged particles is characterized by comprising steps of: the first step of dividing said figure data for drawing the pattern into a plurality of stripes having predetermined respective regions; the second step of preparing a second set of figure data for drawing the pattern by adding data for a region greater than the amplitude of back scattering of charged particles of the figure data of at least one of the stripes located adjacent at least to an end of a desired stripe at least to said end of the desired stripe; the third step of calculating optimal exposure dose by calculating correction proximity effect for said second set of figure data; and the fourth step of drawing the pattern according to the figure data contained in said desired stripe on the basis of the calculated optimal exposure dose, wherein the second and third steps are conducted for another stripe simultaneously with said fourth step. It is preferable the second step is conducted simultaneously with the step of transforming design data into figure data for the pattern to be drawn.

According to the second aspect of the invention, there is also provided a charged particle writing system for drawing a desired pattern by processing a set of figure data for drawing the pattern on a stripe by stripe basis and irradiating the surface of a target with charged particles is characterized by comprising: means for preparing a new set of figure data for drawing the pattern by adding data for a region greater than the amplitude of back scattering of charged particles of the existing figure data of the stripes located adjacent at least to an end of a desired stripe at least to said end of the desired stripe; means for carrying out calculations for correcting the proximity effect for said new set of data to determine an optimal exposure dose: and means for drawing the pattern on the basis of the calculated optimal exposure dose. The means for preparing a new set of figure data includes a plurality of buffer memories for storing figure data of the pattern to be drawn on a stripe by stripe basis and an ancillary region adding circuit for adding to the opposite ends of a stripe the figure pattern of the adjacent stripes for a region grater than the amplitude of back scattering on the basis of the figure data stored in said plurality of buffer memories. A calculation of the optimal exposure dose by said calculation means and a drawing of the stripe by said drawing means are simultaneously carried out.

According to the second aspect of the invention, figure data are added to the outside of opposite ends of a stripe so that calculations for correcting the proximity effect can be carried out for each stripe to enhance the dimensional drawing accuracy at and near the boundaries of the opposite ends. Consequently, for instance, calculations necessary for correcting the proximity effect on a given stripe B to be drawn in a subsequent step can be carried out while another stripe A is being drawn. Therefore, the additional time required for all the calculations to be carried out for proximity effect correction for the entire pattern is only equal to the time required for the calculations for the first stripe because all the remaining calculations can be carried out while the drawing operation is going on to allow the entire drawing operation to be carried out at high speed.

Summarily, according to the first aspect of the invention, an ideally optimal exposure dose can be obtained very rapidly by determining an approximate exposure dose and a corrective value for the exposure dose and then a corrective value for the corrected exposure dose and so on. Furthermore, an optimal exposure dose can be obtained even faster by adding a corrective value as a weight to the newly determined approximate exposure dose, redoing calculations for a representative figure and determining another approximate optimal exposure dose, utilizing the obtained new representative figure.

According to the second aspect of the invention, figure data are added to the outside of opposite ends of a stripe so that calculations for correcting the proximity effect can be carried out for each stripe and the additional time required for all the calculations to be carried out for proximity effect correction for the entire pattern is only equal to the time required for the calculations for the first stripe because all the remaining calculations can be carried out while the drawing operation is going on to allow the entire drawing operation to be carried out at high speed. The net result will be a remarkably improved efficiency of the operation of the apparatus.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL
VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 3 is a flow chart that can be used for a charged particle beam writing method according to the invention;

FIGS. 8A through 8D are graphs showing the relationship between the error and the number of terms used for the calculations carried out for correcting the error;

Figure 15:
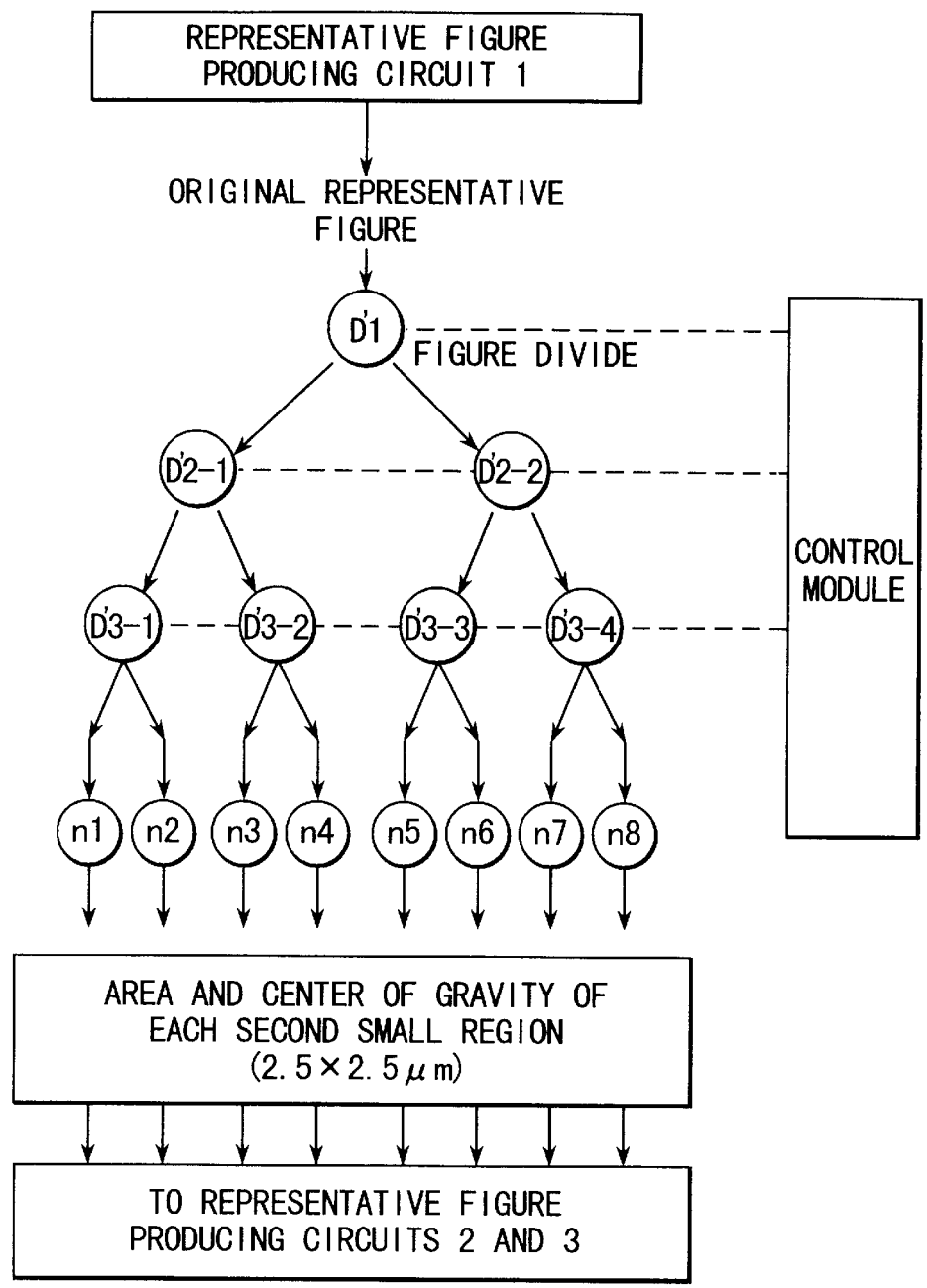
Figure 16:
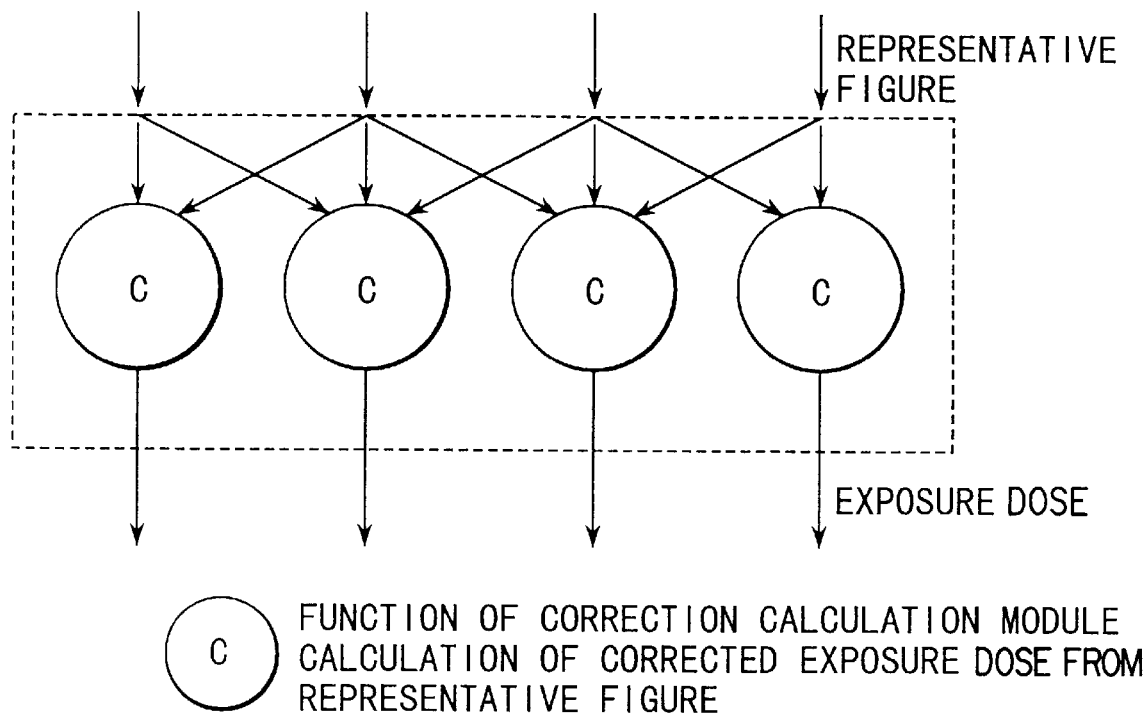
Figure 20:
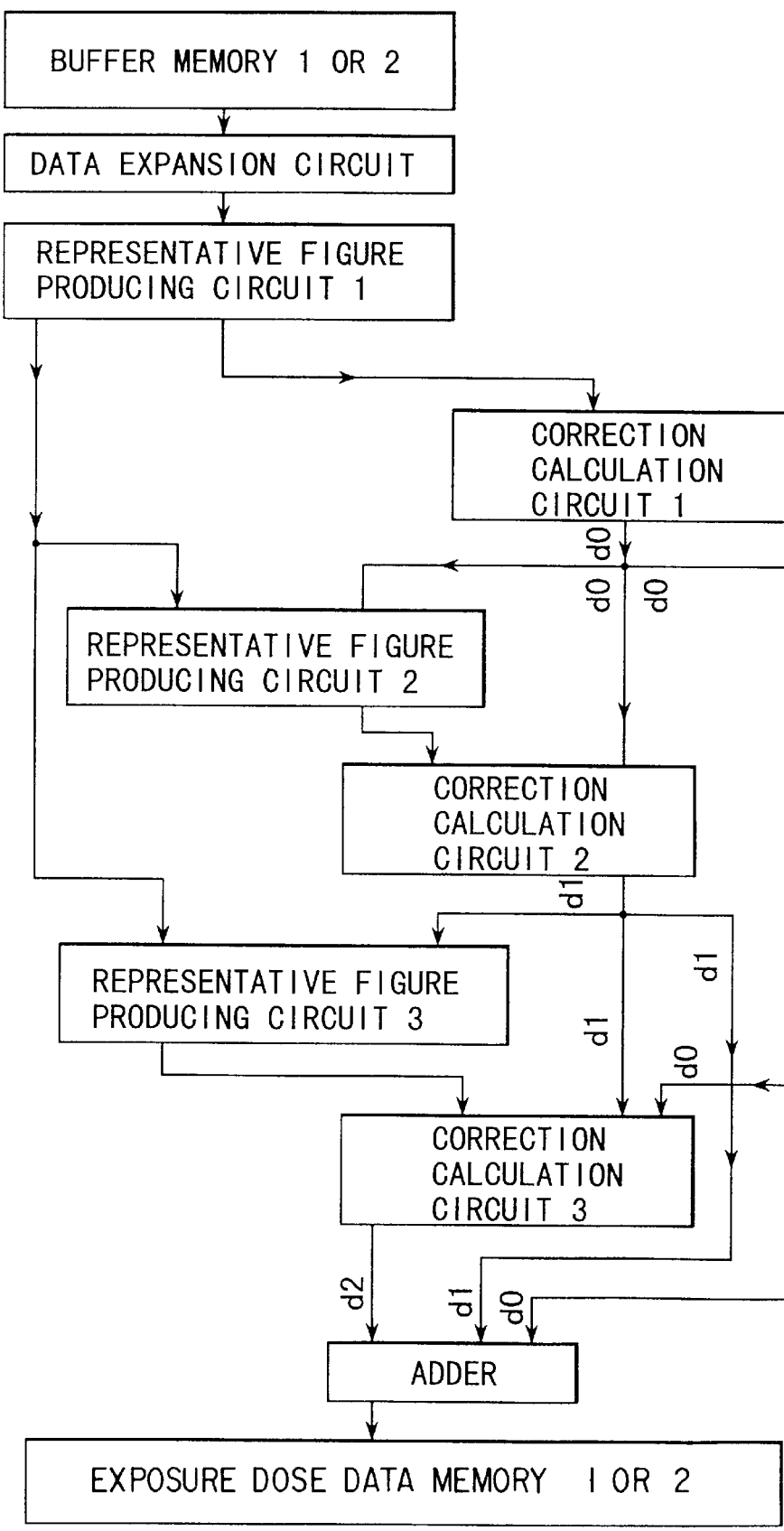
Figure 21:
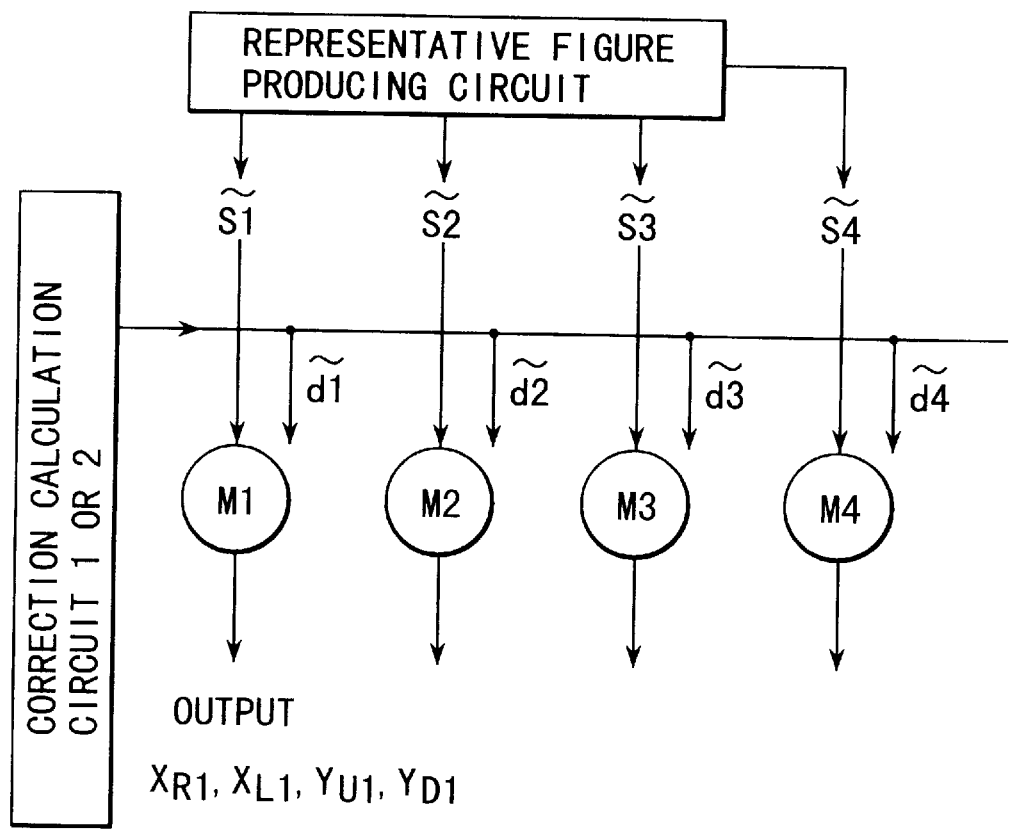
Figure 22:
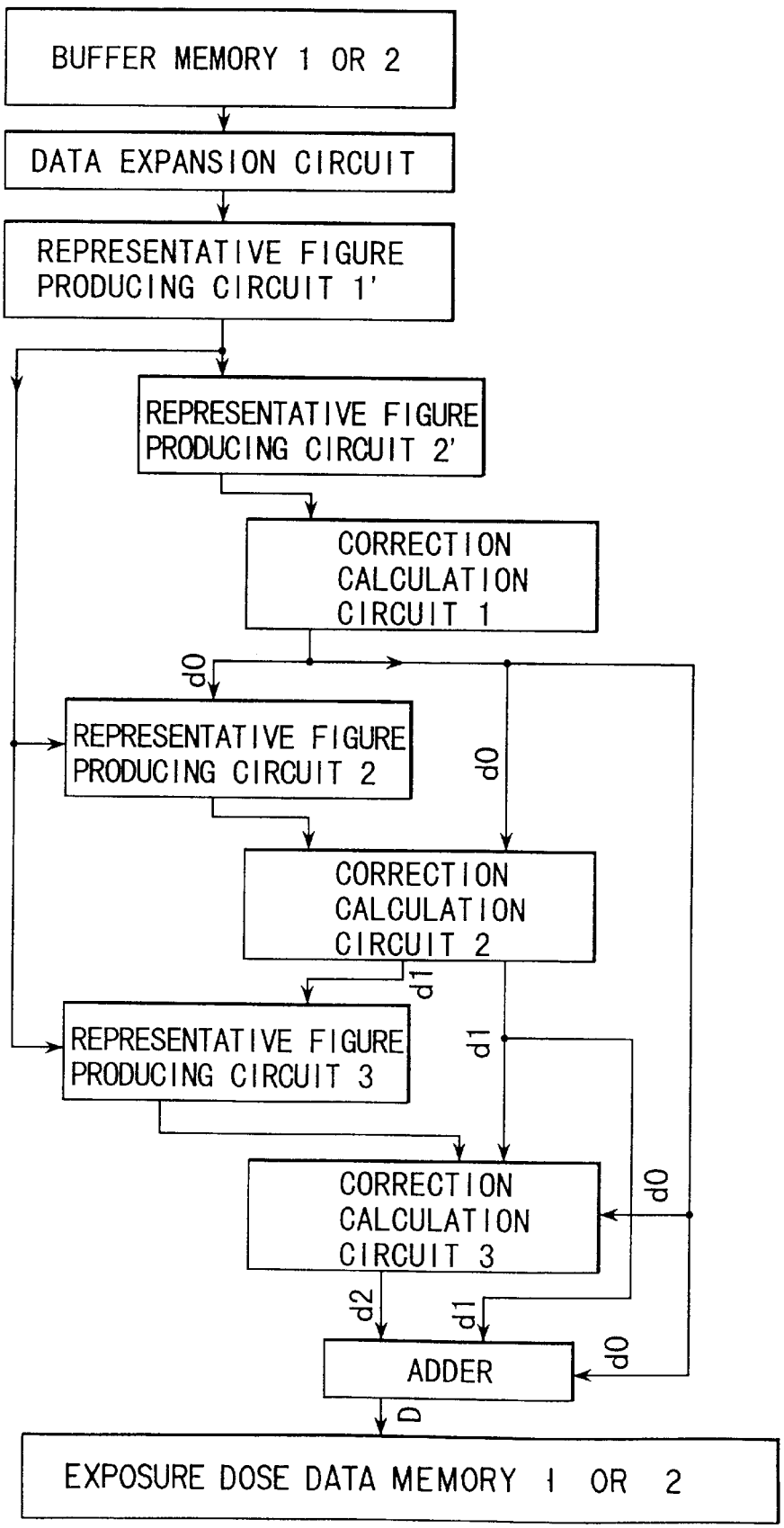
Figure 25:
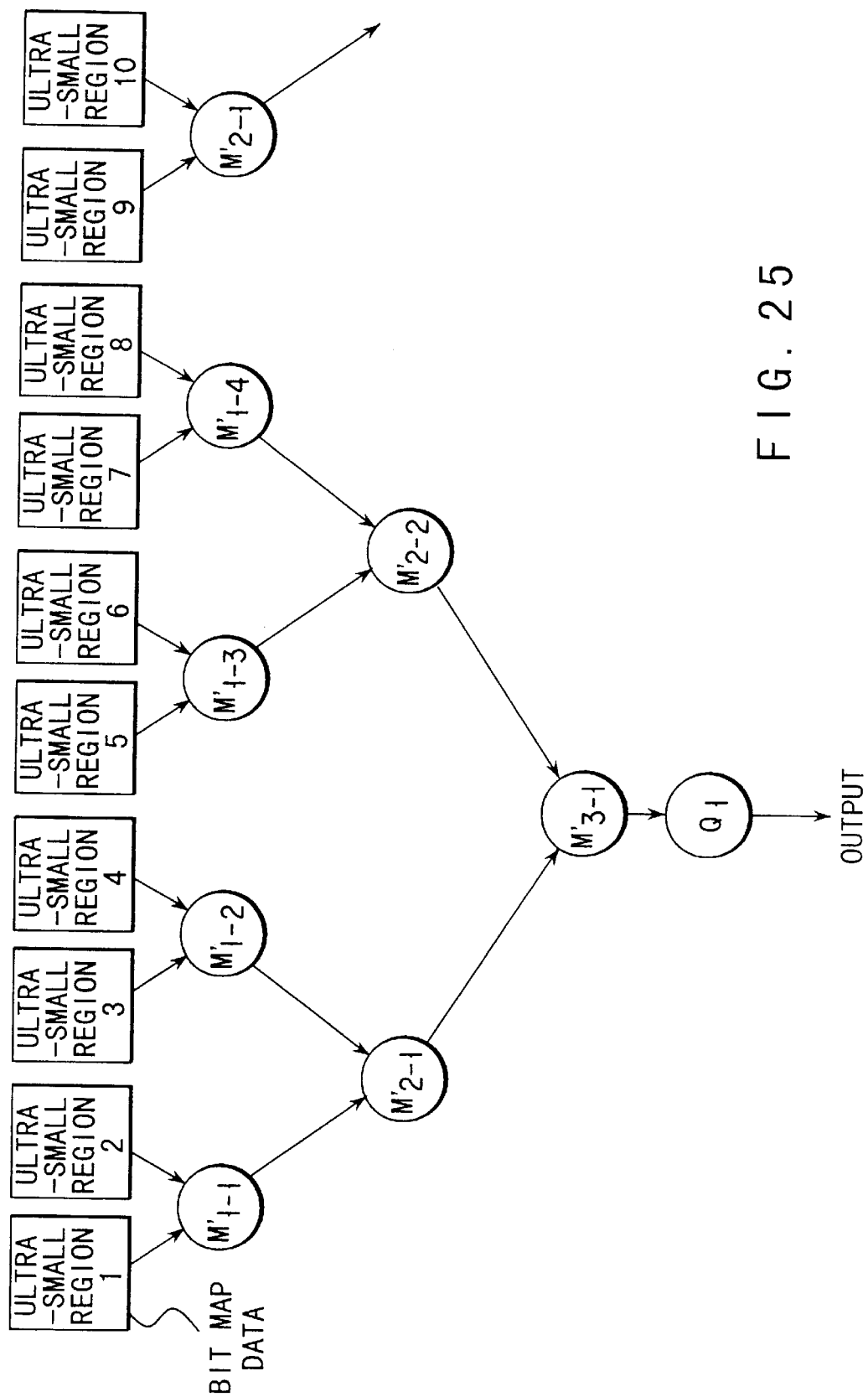
Figure 27:
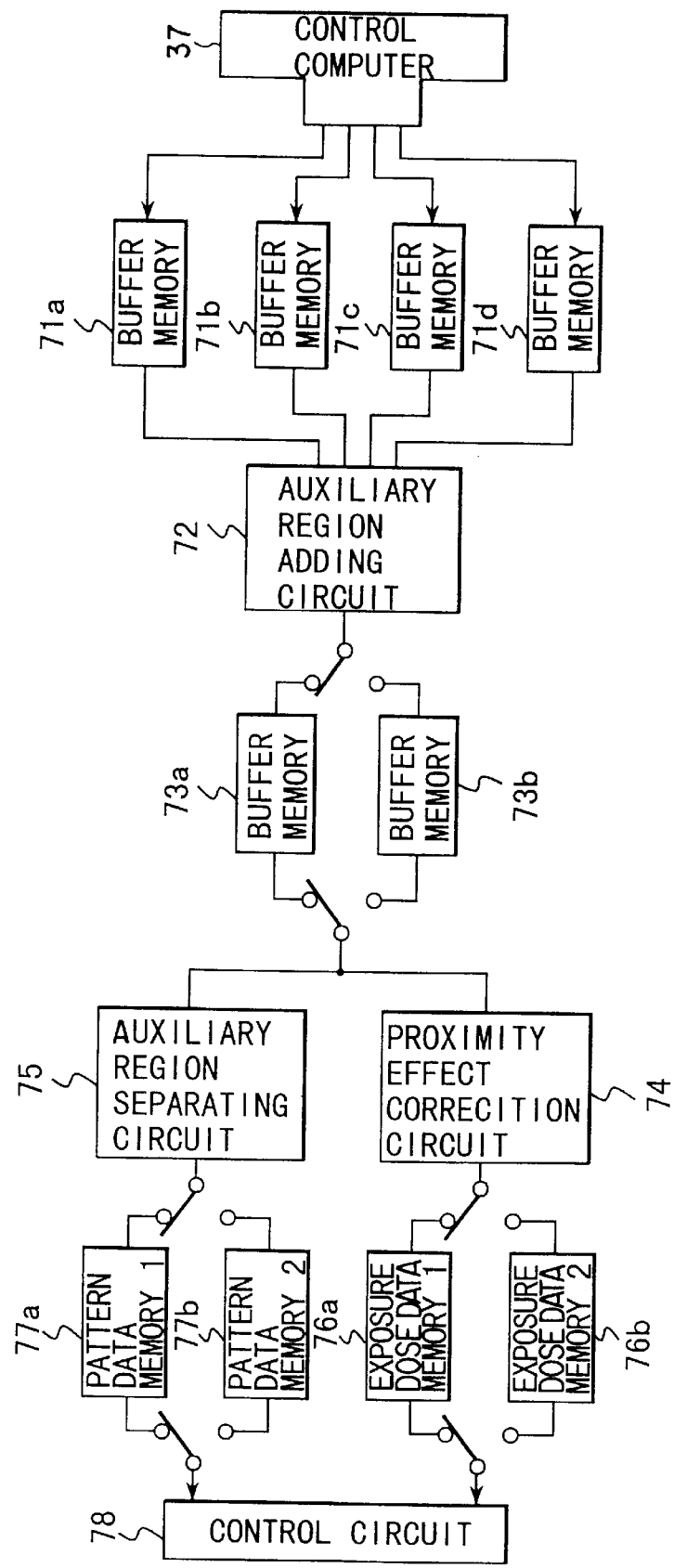
Figure 29A:
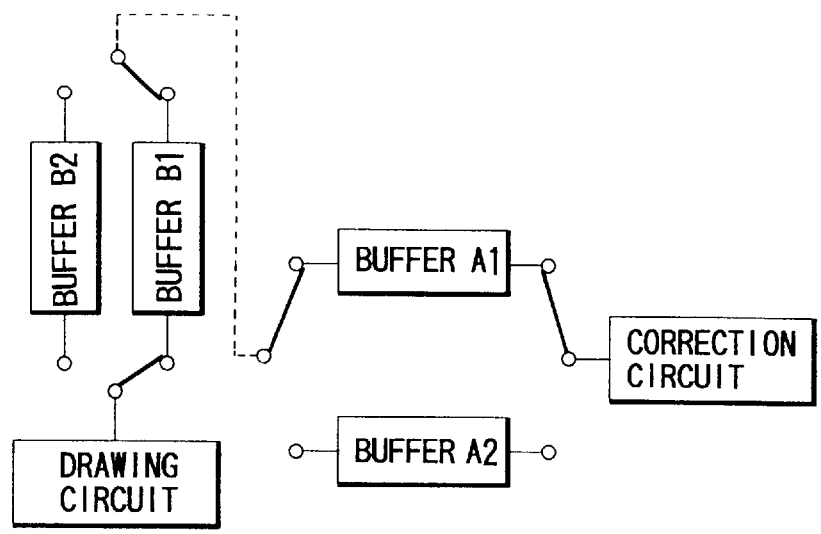
Figure 29B:
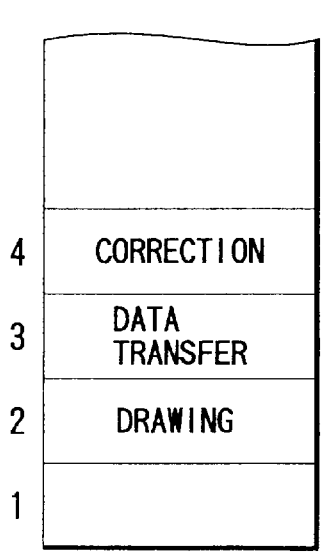
Figure 30:
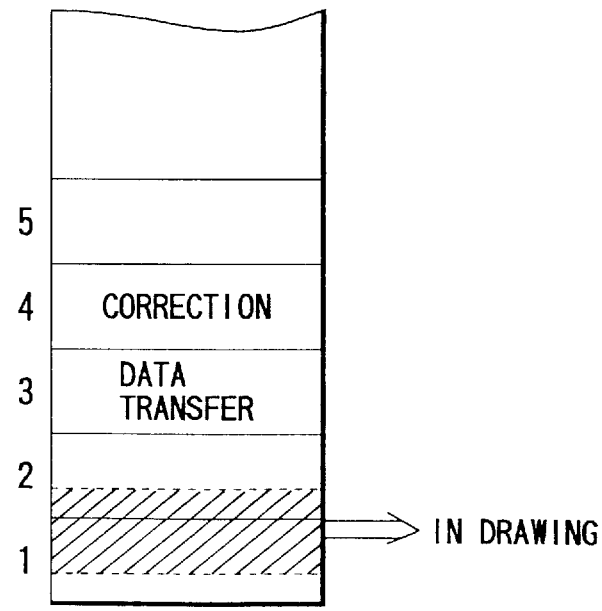

FIGS. 14A and 14B schematically illustrate a representative figure synthesizing circuit 1;

FIG. 15 schematically illustrates a representative figure dividing circuit of the invention;

FIG. 16 schematically illustrates a corrective value calculating circuit 1 for calculating the first approximate exposure dose;

FIG. 17 schematically illustrates representative figure synthesizing circuits 2 and 3;

FIG. 18 schematically illustrates the operation of gathering data on a second small region and preparing a new representative figure in a first small region;

FIG. 19 schematically illustrates corrective value calculating circuits 2 and 3;

FIG. 20 is a block diagram of a block diagram of the circuit for carrying out operations for proximity effect correction for the fifth embodiment of the invention;

FIG. 21 schematically illustrates representative figure synthesizing circuits 2 and 3;

FIG. 22 is a block diagram of a block diagram of the circuit for carrying out operations for proximity effect correction for the eight embodiment of the invention;

FIG. 23 schematically illustrates how an LSI pattern is subjected to bit expansion for the ninth embodiment of the invention;

FIG. 24 schematically illustrates a representative figure synthesizing circuit that utilizes a bit expansion circuit;

FIG. 25 illustrates in detail the operations subsequent to the bit expansion of FIG. 24;

FIG. 26 is a block diagram of the electron beam writing system according to the fourteenth embodiment of the invention;

FIG. 27 is a block diagram of a control circuit that can be used for the apparatus of FIG. 26;

FIG. 28 is a block diagram of another control circuit that can be used for the apparatus of FIG. 26;

FIGS. 29A and 29B are shows a case that a correction circuit is apart from drawing circuit; and FIG. 30 is an example of realizing a multi-drawing of the stripe.

DETAILED DESCRIPTION OF THE INVENTION

Now, the present invention will be described by referring to the accompanying drawings that illustrate preferred embodiments of the invention.

Figure 1:
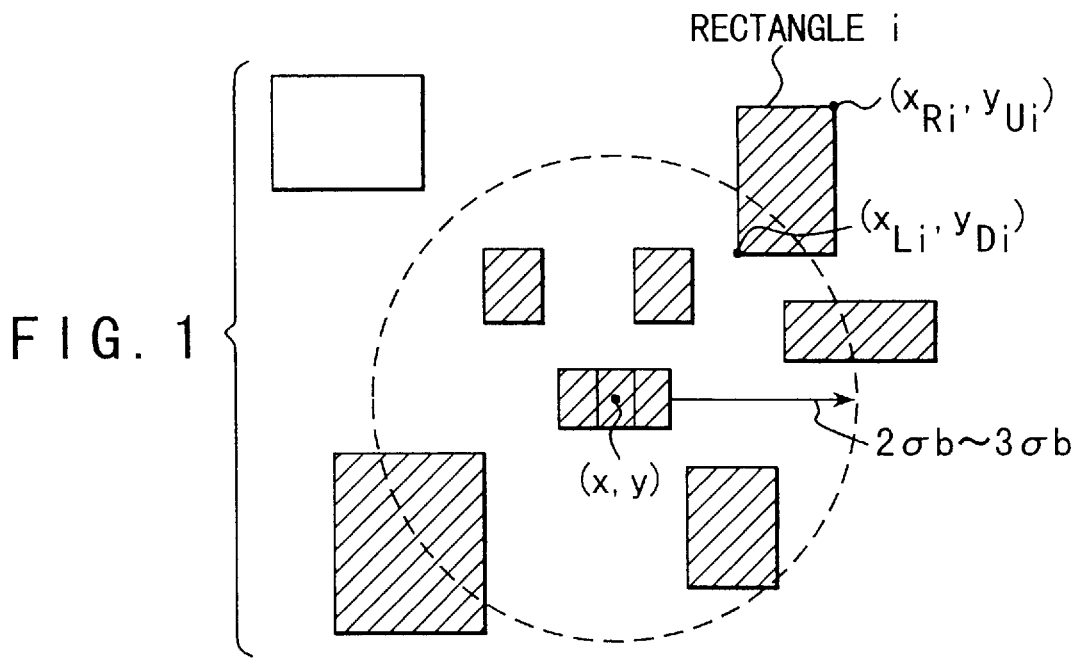
FIG. 1 is a schematic illustration showing regions to be referred to for an operation of proximity effect correction.
Figure 2A:
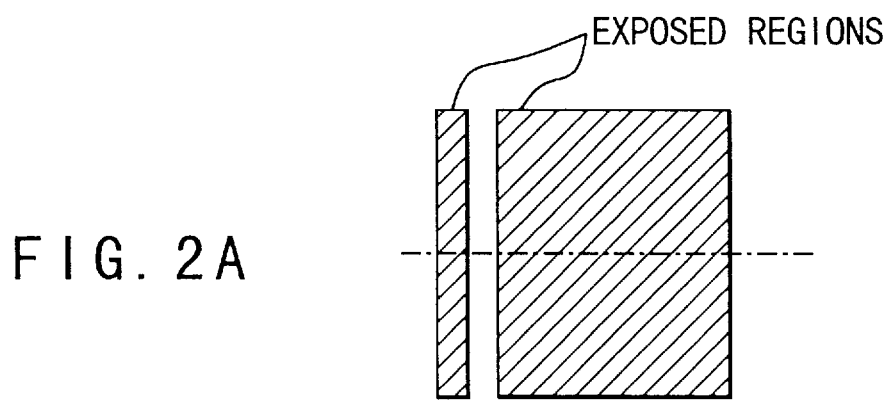
FIGS. 2A and 2B are schematic illustrations showing the error to be given rise to by a conventional approximation method.
Figure 2B:
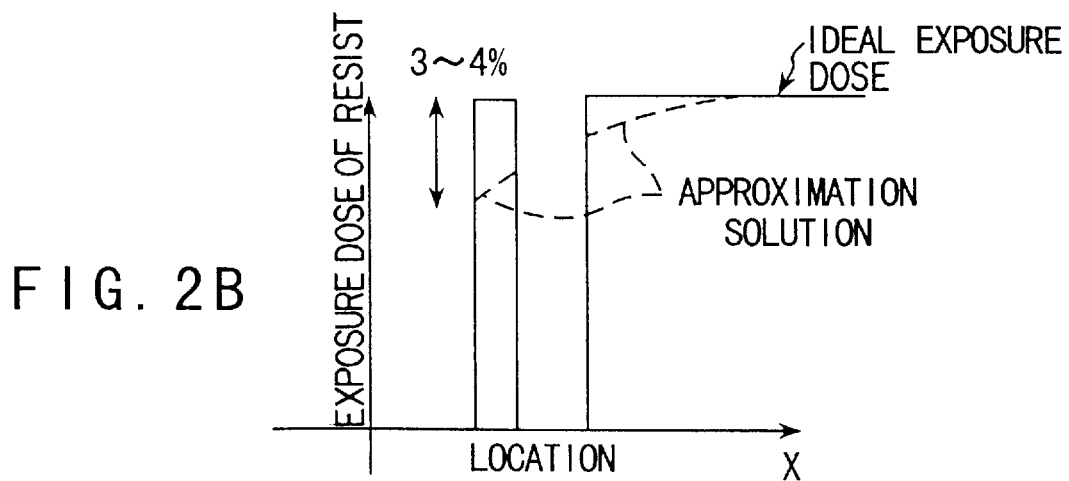
Figure 4:
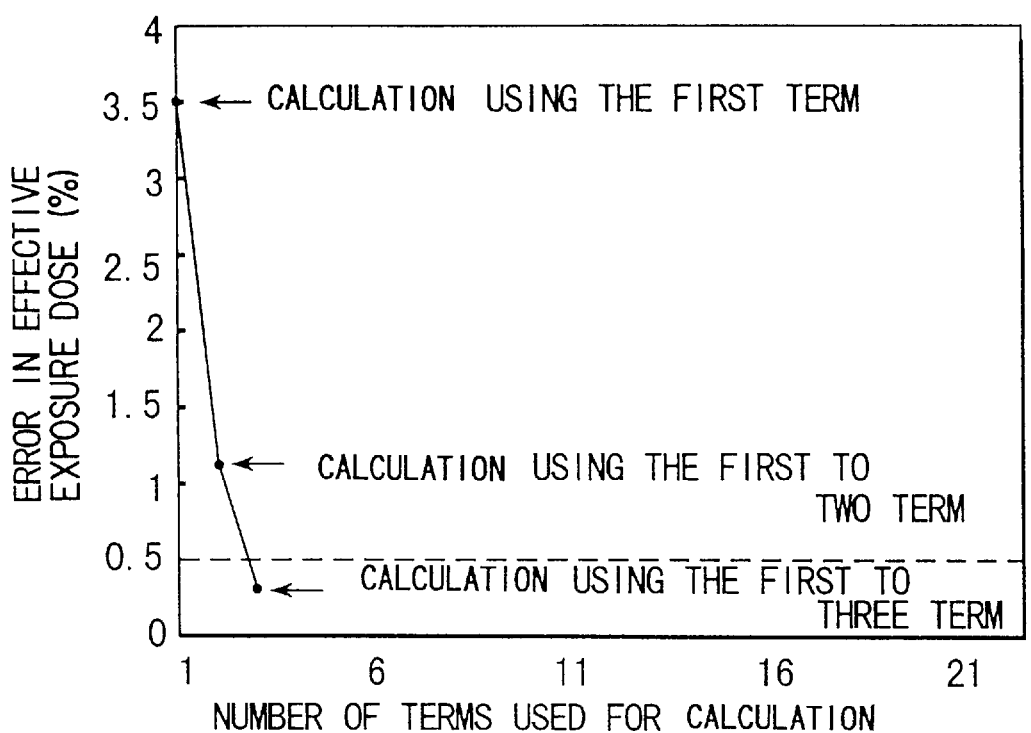
FIG. 4 is a graph showing the relationship between the number of terms to be used for calculations and the error given rise to by the calculations with a method according to the invention.
Figure 5:
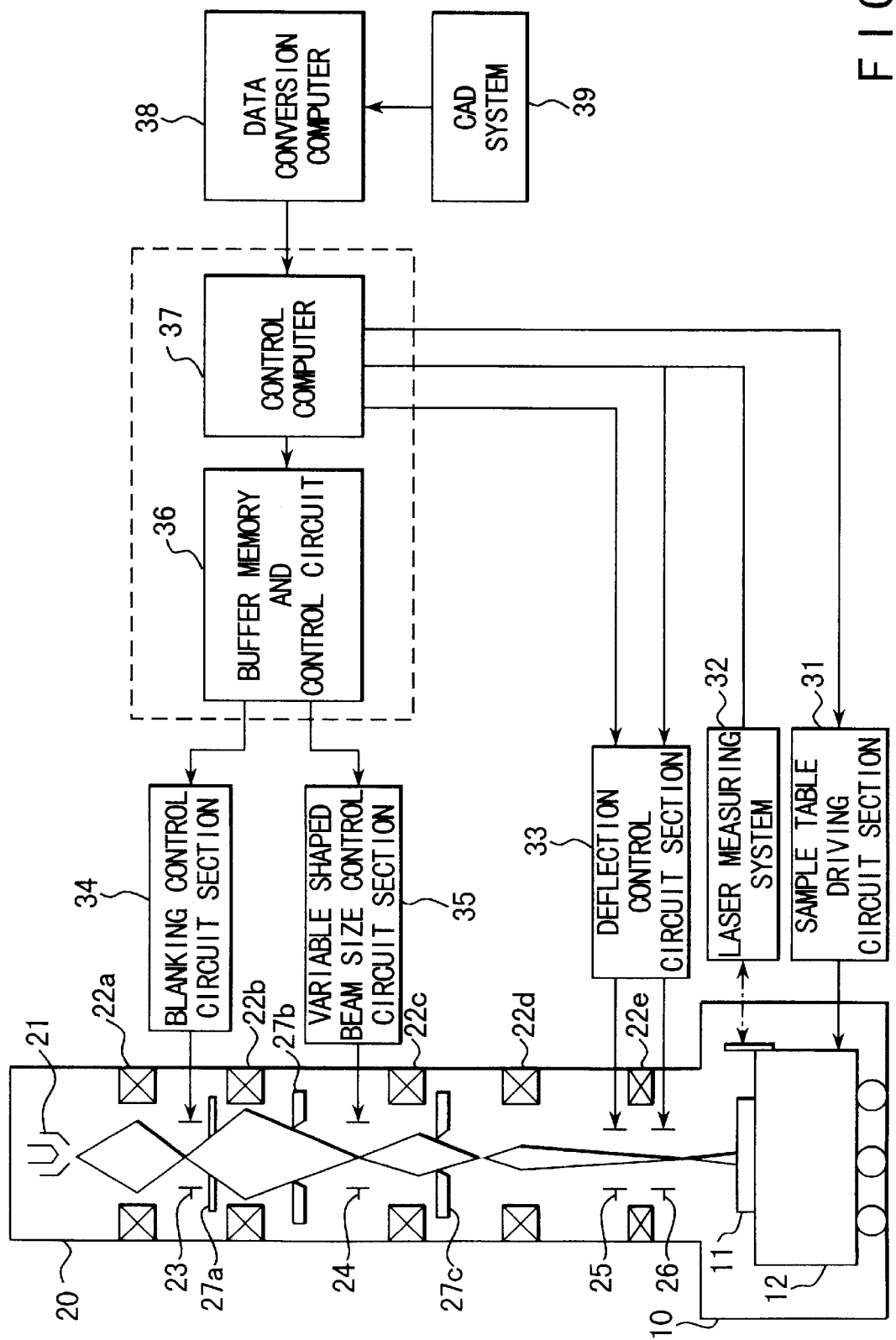
FIG. 5 is a schematic block diagram of the electron beam writing system used for the embodiments of the invention as will be described hereinafter.

FIG. 5 is a schematic block diagram of the electron beam writing system used for the embodiments of the invention as will be described hereinafter. The charged particle writing system comprises a target chamber 10, a target 11, a target table 12, an electron-optical bodytube 20, an electron gun 21, a number of lens systems 22a through 22e, a number of deflection systems 23 through 26, a blanking plate 27a and beam-shaping aperture masks 27b and 27c. It additionally comprises a target table drive circuit section 31, a laser length-measuring system 32, a deflection control circuit section, a blanking control circuit section 34, a variable shaped-beam dimension control circuit section 35, a buffer memory and control circuit 36, a control computer 37, a data conversion computer 38 and a CAD system.

Electron beams discharged from the electron gun 21 is subjected to an ON-OFF operation of the blanking deflector 23. The apparatus can modify the exposure dose depending on the position to be exposed to the exposure dose by controlling the exposure dose time. After passing through the blanking plate 27a, the beams are shaped into rectangular beams and the shaped-beams are dimensionally modified by means of the beam-shaping deflector 24 and the beam-shaping aperture masks 27b and 27c. Then, the shaped beams are deflected by the scanning deflectors 25 and 26 to scan the target 11 and draw a desired pattern. An acceleration voltage of 50 kV is typically applied to electron beams in the apparatus and the possible largest dimensions of variable shaped-beams that can be produces by the apparatus are 2 $\mu$m×2 $\mu$m for the length and the width of the rectangle.

Figure 6:
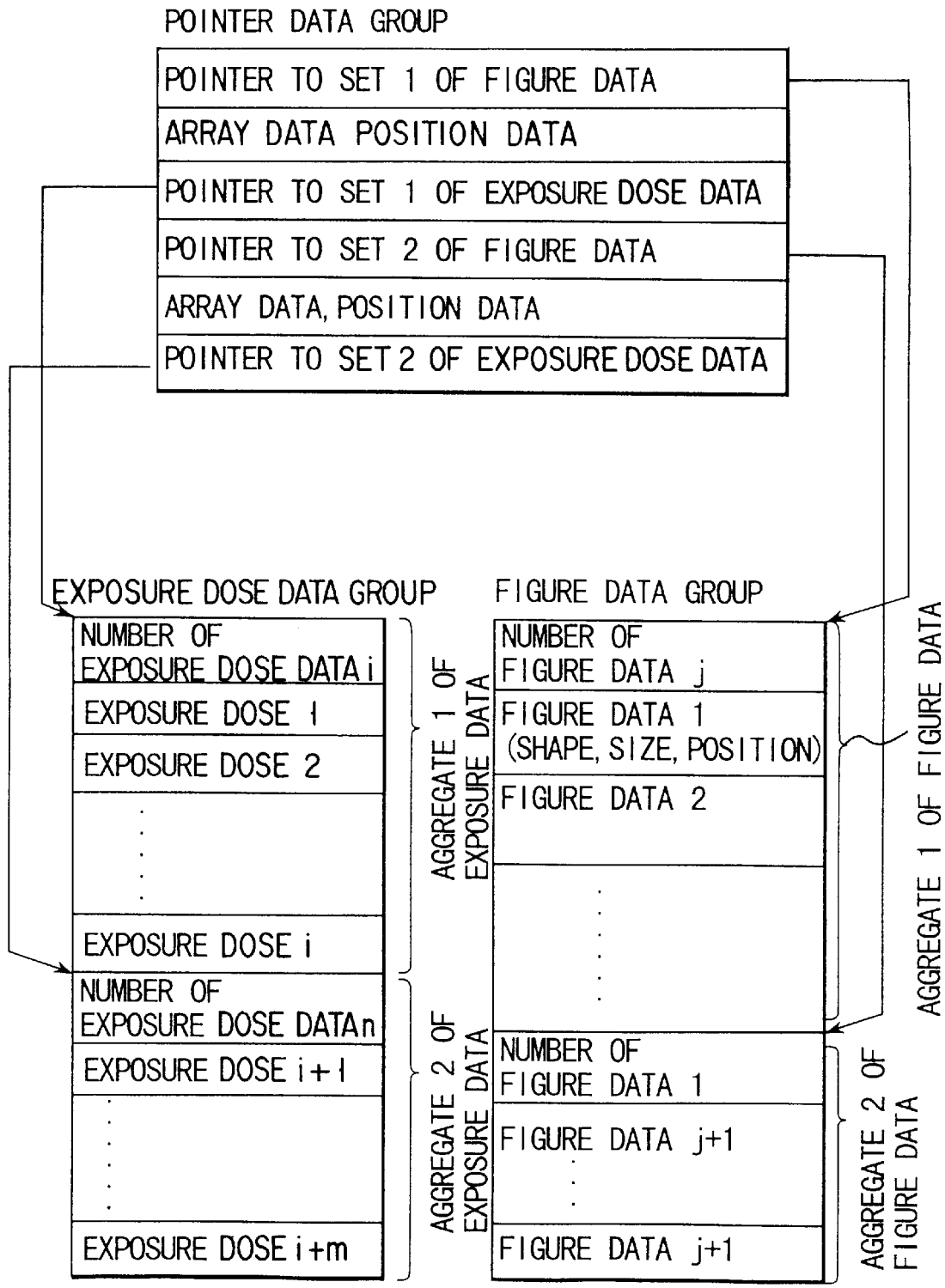
FIG. 6 is a schematic illustration of data groups to be used for the electron beam writing system, showing the configuration thereof.

FIG. 6 is a schematic illustration of data (EB data) to be used for an electron beam writing system as inputs, showing the configuration thereof. Note that they have a configuration adapted to data compression for proximity effect correction using a representative figure method (Japanese Journal of Applied Physics; T. Abe, S. Yamasakik, T. Yamaguchi, R. Yoshikawa & T. Takigawa, vol.30, p.2965 (1991)).

More specifically, the exposure dose is defined for each small region (e.g., 2 $\mu$m×2 $\mu$m) apart from figure data. Figure data are used to define figures before the shot is divided and data are compressed typically by defining repeated arrangements.

Each pointer in FIG. 6 is set for each sub-field of 40 $\mu$m×40 $\mu$m. For this data configuration, the control circuit 36 in FIG. 5 carries out the following processing operations while reading in the data of the pointer data groups.

(1) It expands data according to the positional and arrangement information supplied to it to determine the position of the figure being processed.

(2) It divides the figure data into shots, utilizing the outcome of (1).

(3) It determines the central value of each shot by calculation using a reference point (e.g., the lower left corner) of the corresponding sub-field.

(4) It determines a small region where the central value belongs.

(5) It selects a set of exposure dose data on the basis of the pointers to sets and obtains the exposure dose data corresponding to the small region determined by (4) from the set.

(6) It transmits the exposure dose corresponding to the data of the shot to each and every circuit.

Now, the electron beam beam writing method and the proximity effect correction method, in particular, using the above apparatus will be described.

(1st Embodiment)

FIGS. 7A through 7D illustrate the patterns used for the first embodiment of the invention and thereafter evaluated for the effect of proximity effect correction. The patterns had the smallest line width of 0.2 $\mu$m.

Assuming patterns to be directly drawn on an Si wafer and the use of 50 kV for acceleration voltage, g=0.8 and $\sigma_b$=10 $\mu$m for the amplitude of back scattering.

Formulas (1) through (5) were used without any modification for substituting representative figures to determine the exposure dose and the exposure dose of the resist was simulated.

Figures 7A, 7B:
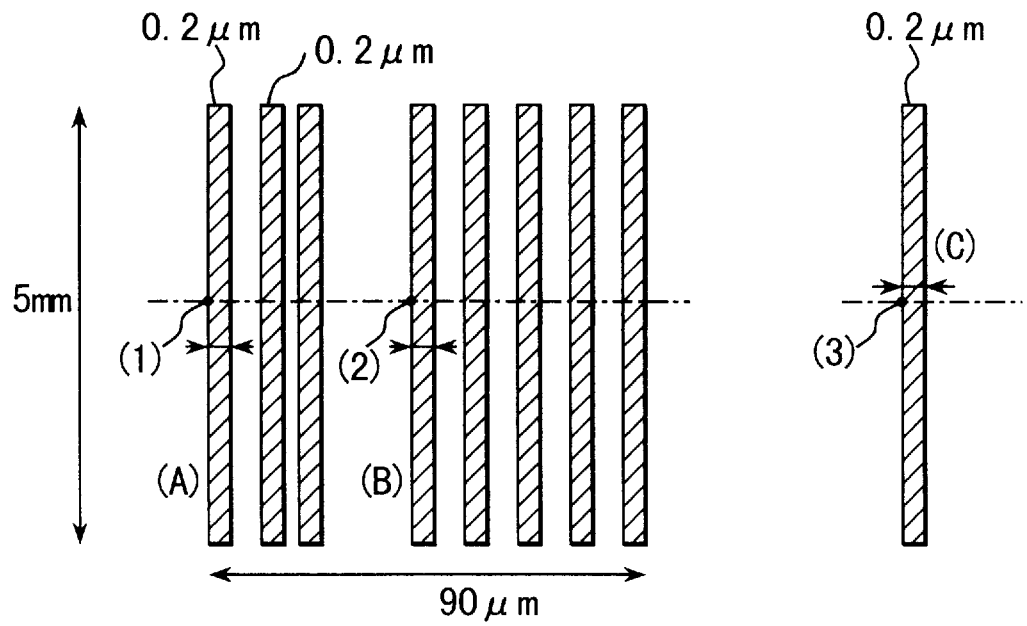
FIGS. 7A through 7D illustrate the patterns used for the first embodiment of the invention.
Figures 7C, 7D:
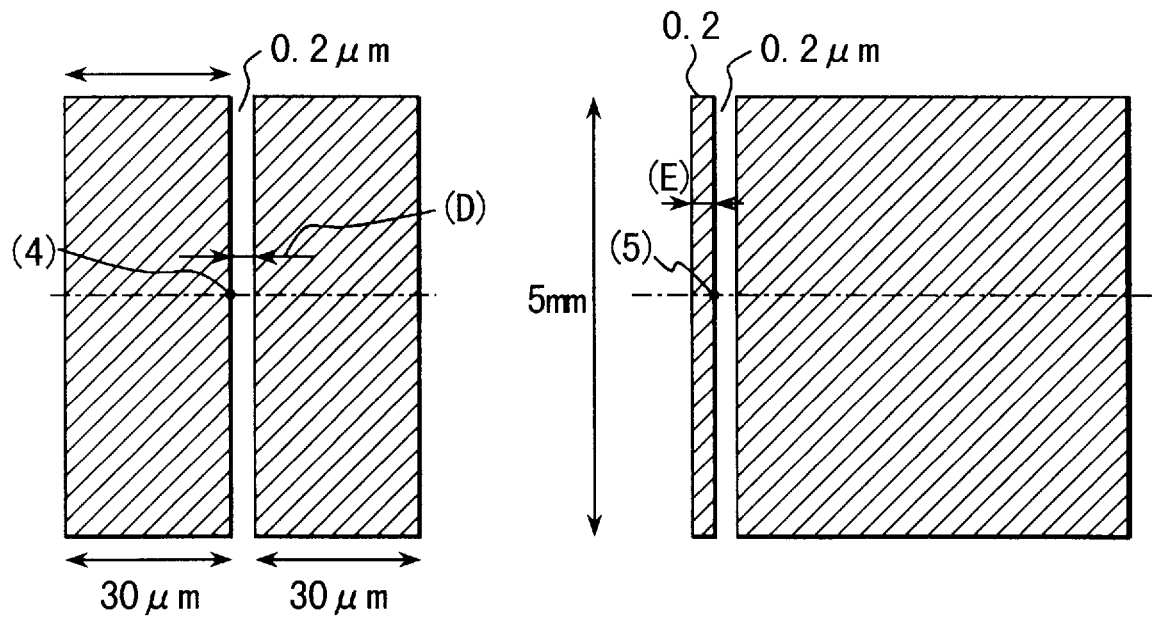
Figure 9A:
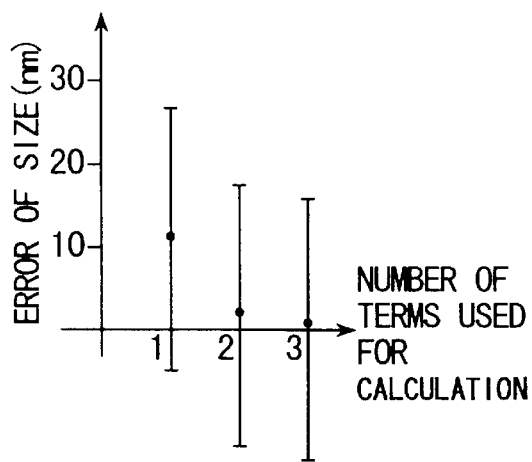
FIGS. 9A through 9E are also graphs showing the relationship between the error and the number of terms used for the calculations carried out for correcting the error.
Figure 9B:
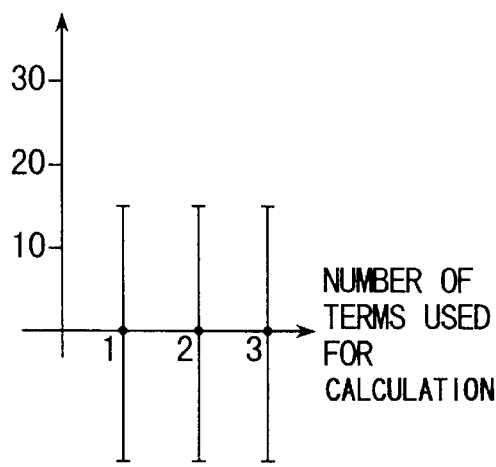
Figure 9C:
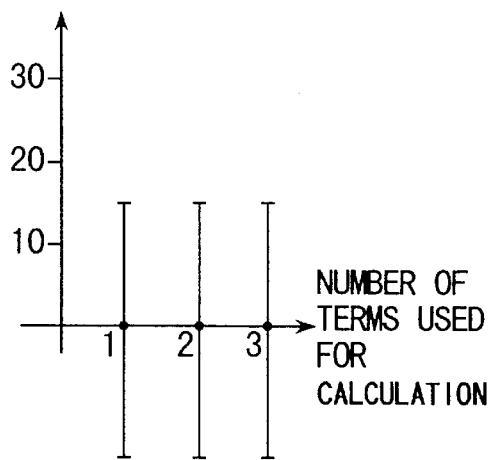
Figure 9D:
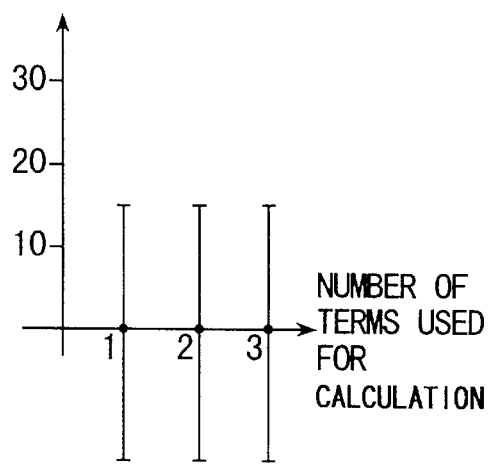
Figure 9E:
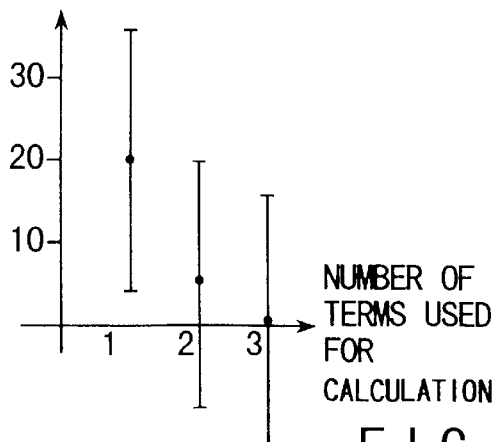

The exposure dose at location (4) in FIG. 7C was assumed to be equal to 1 and the deviations in the exposure dose at locations (1) through (3) and (5) were determined. FIGS. 8A through 8D illustrate the result. For all the patterns, the error in the exposure dose was equal to or less than 0.5% when the first through third terms of the formulas were used.

The accuracy of correction of the method of the present invention was experimentally determined by using the above electron beam writing system. The patterns of FIGS. 7A through 7D were used, although the areas to be exposed of the patterns were reduced by 0.03 $\mu$m at each lateral side before the correcting operation by taking the front scattering, the expansion of electron beams and other factors into consideration.

The exposure dose for each of the patterns was calculated by means of formulas (1) through (5) and EB data were prepared from the obtained values. Like the above simulation, $\sigma_b$=10 and $\eta$=0.8 were used as parameters for correction. These operations were carried out by using a computer different from the electron beam apparatus. Three different calculations, respectively using the first, the first and second and the first through third terms of formulas (1) through (5), were carried out.

The target was then subjected to electron beam lithography by using the prepared EB data. Chemical amplification type negative resist SAL having a film thickness of 0.5 $\mu$m was selected and applied directly onto the Si wafer. The exposure dose at and around location (4) of FIG. 7C was 8 $\mu$C/cm$^2$.

In the above experiment, the dimensions of (A), (B), (C), (D) and (E) were measured by means of a radial SEM when (D) came to show the intended width of 0.2 $\mu$m. FIGS. 9A through 9E summarily illustrate the obtained result.

The dark dots in FIGS. 9A through 9E shows the averages of dimensional errors, whereas the bars shows the measurement errors, which include those of the EB apparatus, those arising from the resist treating process and those of the SEM. It will be seen from the graphs that a satisfactory level of accuracy was achieved when the first two or three terms were used.

(2nd Embodiment)

The pattern for the element isolation layer of 16-Mbit DRAMs (with the smallest line width of 0.5 $\mu$m) was dimensionally reduced to ⅖ and a corresponding pattern with the smallest line width of 0.2 $\mu$m was prepared by means of CAD data. The areas to be exposed of the pattern were reduced (resized) by 0.02 $\mu$m at each lateral side and an optimal exposure dose was determined by calculation for the pattern, using the method of the invention. This will be described in greater detail hereinafter.

An engineering work station (EWS) having four CPUs with 50 MIPS was used for the calculation of the first to three terms of the formulas. The time consumed for the calculation was 2 minutes for the first term and 1.4 minutes for each of the second and third terms to make the total equal to 4.8 minutes. The first and second small regions were identical with a size of 2 $\mu$m. The output data of the calculation showed a configuration as described above.

Then, a pattern was drawn by means of the above apparatus and the prepared EB data. The target was prepared by applying chemical amplification type negative resist to a Si wafer to a film thickness of 0.5 $\mu$m.

After the pattern drawing operation, the sample was baked (post-exposure dose bake or PEB) and, after the developing operation, the pattern was observed at 30 sampling points for dimensional measurement to prove that the dimensional variance due to the proximity effect was up to 7 nm, which was within an ordinary measurement error, and could be corrected with a satisfactory level of correcting accuracy for the lithographic operation.

Figure 10:
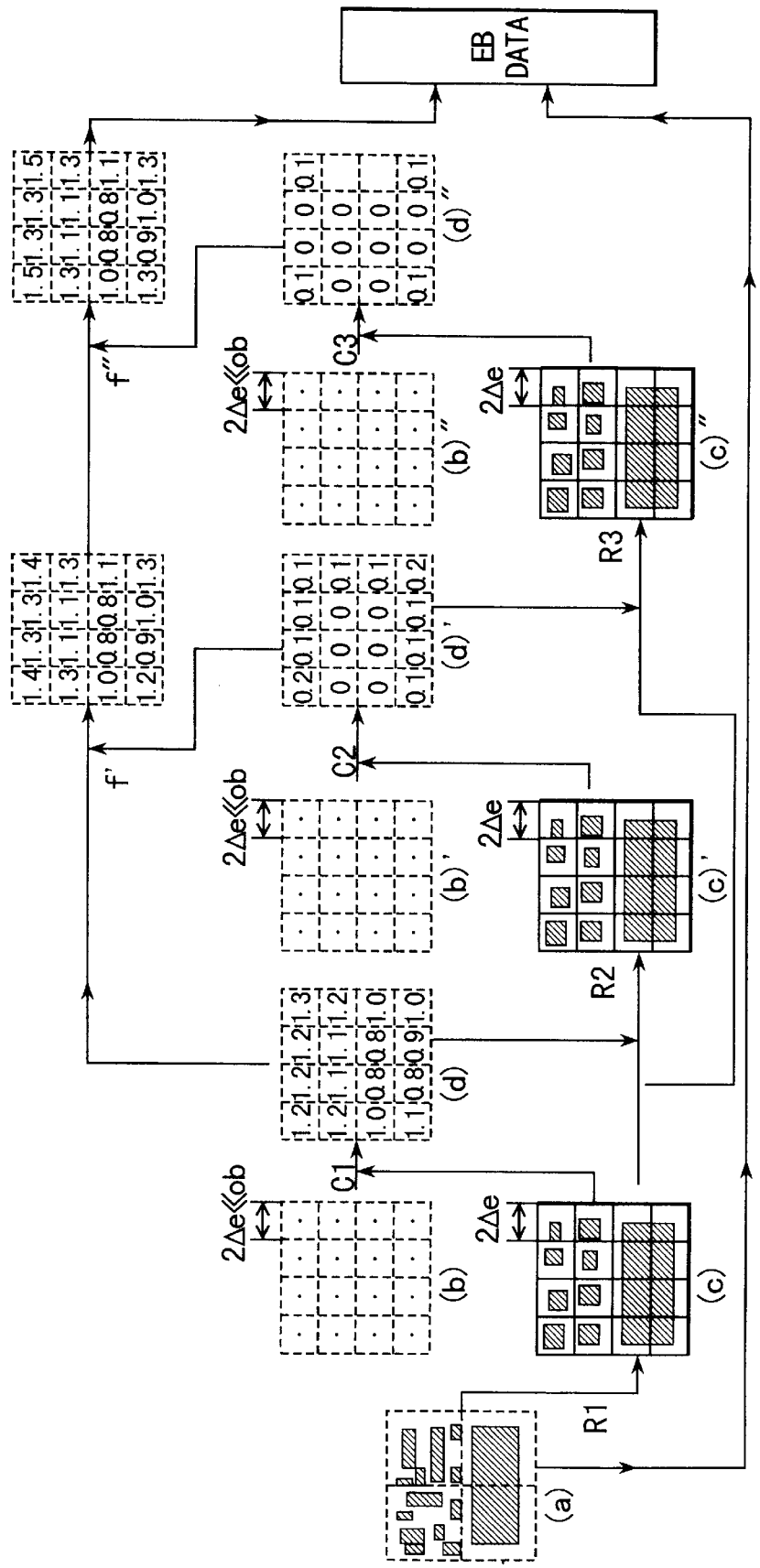
FIG. 10 is a flow chart for the second embodiment of the invention.

Now, the method used for exposure dose calculation in this embodiment will be described in detail by referring to FIG. 10.

(1) (R1)

The original LSI pattern (a) is divided into regions (first small regions) with a size of $\sigma_b/5 \times \sigma_b/5 \cdot (2 \times 2 \, \mu m)$ and the total surface area $S_{1i}$ of the pattern existing in each of the regions is determined.

Then, a representative figure having a same surface area is obtained for each region. The center of gravity of the representative figure is located at the center $(X_i, Y_i)$ of the small region. If figure i is rectangular, coordinates $(X_{Li}, Y_{Di})$ of the lower left corner and coordinates $(X_{Ri}, Y_{Ui})$ of the upper right corner may typically be determined in the following manner.

$$x_{Li}=X_i-(\tfrac{1}{2})(S_{1i})^{1/2}$$

$$x_{Ri}=X_i+(\tfrac{1}{2})(S_{1i})^{1/2}$$

$$Y_{Di}=Y_i-(\tfrac{1}{2})(S_{1i})^{1/2}$$

$$Y_{Ui}=Y_i+(\tfrac{1}{2})(S_{1i})^{1/2}$$

$(S_{1i})^{1/2}$ may be calculated either by functional calculation or by preparing a table for square roots and referring to it. The rectangle does not necessarily have to be turned into a square.

(2) (C1)

Assuming that the entire region in the inside of the LSI pattern is divided into small regions (second small regions) (e.g., $\sigma_b/5 \times \sigma_b/5 \cdot (2 \times 2 \, \mu m)$), each of which is sufficiently smaller than the amplitude of back scattering and the exposure dose corresponding to the first term is determined by calculation for the center $(x_j, y_j)$ of each of the small regions.

$$d_0(x_j,y_j)=1/\{(\tfrac{1}{2})+\eta \cdot U\}$$

$$U=\Sigma\{erf(x_{Ri}-x_j)-erf(x_{Li}-x_j)\}\times\{erf(y_{Ui}-y_j)-erf(y_{Di}-y_j)\}$$

$$erf = (\pi^{-\frac{1}{2}}) \int \exp(-u^2) du$$

The range of addition of $\ddot{a}$ corresponds to the representative figures determined by (1) and existing within a range between $(x_j, y_j)$ and a circle with a diameter of $2\sigma_b$ to $3_b$ (20 $\mu$m to 30 $\mu$m). The calculations for erf may be conducted for each value of the function or by preparing a table for the values of erf and referring to the table at the time of calculation.

(3) (R2)

Each of the representative figures obtained by (1) above is transformed in a way as described below. The value of $S_k{}^*$ is determined for each of the second small regions (with a size of $\sigma_b/5 \times \sigma_b/5$, 2×2 $\mu$m) by using the area $S_k$ determined in (1) and the first term of $d_{0k}$ for the exposure dose.

$$S_k{}^* = S_k \times d_{0k}$$

The obtained new value is used as area $S_k{}^*$ of the new representative figure.

The new representative figure i is rectangular and coordinates $(X_{Li}, Y_{Di})$ of the lower left corner and coordinates $(X_{Ri}, Y_{Ui})$ of the upper right corner are determined in the following manner as in (1) above.

$$x_{Li} = X_i - (\tfrac{1}{2})(S_{1i})^{1/2}$$

$$x_{Ri} = X_i + (\tfrac{1}{2})(S_{1i})^{1/2}$$

$$y_{Di} = Y_i - (\tfrac{1}{2})(S_{1i})^{1/2}$$

$$y_{Ui} = Y_i + (\tfrac{1}{2})(S_{1i})^{1/2}$$

The center of each small region is defined by $(X_i, Y_i)$.

(4) (C2)

The exposure dose corresponding to the first term $d_{2j}(x_j, y_j)$ is determined by using $U_j(x, y)$ determined in (2), $d_{0j}$, parameter g and the new representative figure defined in the first small region for the center $(x_j, y_j)$ of each of the second small regions.

$$V_{1j}(x_j, y_j) = \Sigma \{erf(x_{Ri} - x_j) - erf(x_{Li} - x_j)\} \times \{erf(y_{Vi} - y_j) - erf(y_{Di} - y_j)\}$$

$$d_{1j}(x_j, y_j) = \eta \{1/(1+\eta U(x_j, y_j))\} \times \{d_{0j} U(x_j, y_j) - V_{1j}(x_j, y_j)\}$$

where coordinates such as $x_{Ri}$ of $V_{1j}$ are those of the new representative figure obtained in (3).

(5) (f')

$d_{1j}$ determined in (4) is added to $d_{0j}$ obtained in (2).

(6) (R3)

Another new representative figure is determined as in (3). The representative figure obtained in (1) for the first time is used as original figure and the exposure dose of the second term $d_{1j}$ determined in (4) is used as weighting exposure dose.

(7) (C3)

As in (4), the exposure dose corresponding to the third term $d_{2j}(x_j, y_j)$ is determined by means of the representative figure obtained in (6) and the following equations.

$$d_{2j}(x_j, y_j) = \eta \{1/(1+\eta U(x_j, y_j))\} \times \{d_{1j} U(x_j, y_j) - V_{2j}(x_j, y_j)\}$$

$$V_{2j}(x_j, y_j) = \Sigma \{erf(x_{Ri} - x_j) - erf(x_{Li} - x_j)\} \times \{erf(y_{Vi} - y_j) - erf(y_{Di} - y_j)\}$$

(8) (f'')

The value determined in (7) is added to the value obtained in (5) to determine the exposure dose.

(3rd Embodiment)

The present invention is applied to reticles in this embodiment.

The pattern for 16M-bit DRAMs used in the preceding embodiment is enlarged until the smallest line width becomes equal to 0.6 $\mu$m. This corresponds to a quadrupled reticle of a device with the smallest line width of 0.5 $\mu$m (corresponding to a 1 to 4G-bit DRAM). A chip was defined by means of CAD by arranging the same pattern for 2×2=4 times. In terms of bits, this correspond to a 64M-bit DRAM.

A reversal pattern was employed because of the use of positive resist. Taking conversion differences due to etching into consideration, all the areas to be exposed of the pattern were reduced (resized) by 0.02 $\mu$m at each lateral side. An EWS having four CPUs with 50 MIPS was used for the proximity effect correction of the pattern.

The sizes of the first and second small regions were 10 $\mu$m and 2 $\mu$m respectively and parameters $k_1$ and $k_3$ were equal to ½ whereas $k_2$ and $k_4$ were equal to 0.8. The correcting procedures will be described in detail hereinafter. The time consumed for the calculation was 16 minutes for the first term and 10 minutes for each of the second and third terms to make the total equal to 36 minutes.

Then, a pattern was drawn on the reticle by using the obtained EB data and the electron beam writing system, exposed to light and photochemically developed to produce a resist pattern. Positive resist ZEP having a film thickness of 0.4 $\mu$m was used.

The prepared pattern was observed at 30 sampling points for dimensional measurement to prove that the dimensional variance due to proximity effect was up to 7 nm, which was within an ordinary measurement error. When anisotropically dry-etched with chromium, the dimensional variance was found to be less than 12 nm.

Figure 11:
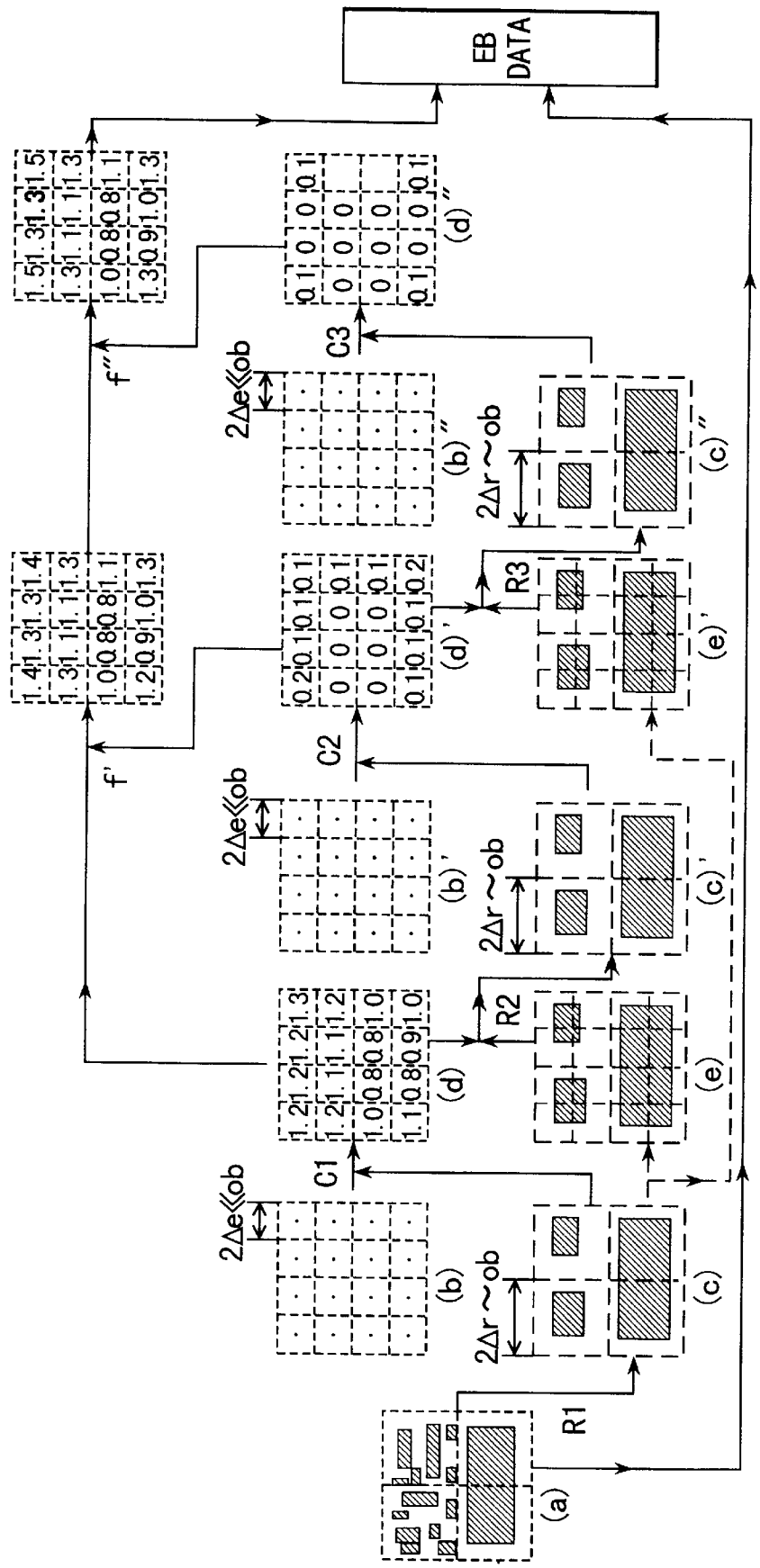
FIG. 11 is a flow chart for the third embodiment of the invention.

Now, the method used for exposure dose calculation in this embodiment will be described in detail by referring to FIG. 11. The difference between this embodiment and the second embodiment lies in the size of the first small regions. The first small regions of the second embodiment had a size equal to that of the second small regions and sufficiently smaller than the amplitude of back scattering (2×2 $\mu$m). On the other hand, while the second small regions of this embodiment had a size sufficiently smaller than the amplitude of back scattering, the size of its first small regions was approximately same as the amplitude of back scattering, which was about 10 $\mu$m.

(1) (R1)

The original LSI pattern (a) is divided into regions (first small regions) with a size of $\sigma_b/5 \times \sigma_b/5$ (10×10 $\mu$m) and the total surface area $(S_{1i})$ and the center of gravity $(G_{1xi}, G_{1yi})$ of the pattern existing in each of the regions are determined. If figure i is rectangular, coordinates $(X_{Li}, Y_{Di})$ of the lower left corner and coordinates $(X_{Ri}, Y_{Ui})$ of the upper right corner may typically be determined in the following manner.

$$x_{Li} = G_{1xi} - (\tfrac{1}{2})(S_{1i})^{1/2}$$

$$x_{Ri} = G_{1xi} + (\tfrac{1}{2})(S_{1i})^{1/2}$$

$$y_{Di} = G_{1yi} - (\tfrac{1}{2})(S_{1i})^{1/2}$$

$$y_{Ui} = G_{1yi} + (\tfrac{1}{2})(S_{1i})^{1/2}$$

$(S_{1i})^{1/2}$ may be calculated either by functional calculation or by preparing a table for square roots and referring to it. The rectangle does not necessarily have to be turned into a square.

(2) (C1)

Assuming that the entire region in the inside of the LSI pattern is divided into small regions (second small region) (e.g., $\sigma_b/5 \times \sigma_b/5 \cdot (2 \times 2 \ \mu m)$), each of which is sufficiently smaller than the amplitude of back scattering and the exposure dose corresponding to the first term is determined by calculation for the center $(x_j, y_j)$ of each of the small regions.

$$d_0(x_j,y_j)=1/\{(1/2)+\eta \cdot U(x_j,y_j)\}$$

$$U(x_j,y_j)=\Sigma\{erf(x_{Ri}-x_j)-erf(x_{Li}-x_j)\}\times\{erf(y_{Vi}-y_j)-erf(y_{Di}-y_j)\}$$

$$erf(x)=(\pi^{-1/2})\int \exp(-u^2)du$$

The range of addition of ä corresponds to the representative figures determined by (1) and existing within a range between $(x_j, y_j)$ and a circle with a diameter of $2\sigma_b$ to $3\sigma_b$ (20 μm to 30 μm). The calculations for erf may be conducted for each value of the function or by preparing a table for the values of erf and referring to the table at the time of calculation.

(3) (R2)

Each of the representative figures obtained by (1) above is transformed in a way as described below. Firstly, the representative figure of each of the first small regions is subdivided into second small regions as defined in (2) ($\sigma_b/5\times\sigma_b/5$, 2×2 μm). Then, the surface area $S_k$ and the center of gravity ($G_{kx}$, $G_{ky}$) of the small figure existing in each of the second regions are determined. Thereafter, the following values are calculated by using the first term $d_{0k}$ of the exposure dose determined in (2).

$$S_k'=S_k\times d_{0k}$$

$$G_{kx}'=S_k\times G_{kx}$$

$$G_{ky}'=S_k\times G_{ky}$$

Then, a new representative figure is determined by calculation for each of the first small regions. The surface area $S^*$ and the center of gravity ($G_x^*$, $G_y^*$) of the new small figure are determined by means of the obtained above values and the following equations.

$$S_k^*=\Sigma_{k'}$$

$$G_x^*=(\Sigma_{kx}')/S^*$$

$$G_y^*=(\Sigma_{ky}')/S^*$$

The range of addition of ä corresponds to all the second small regions ($\sigma_b/5\times\sigma_b/5$ to 2×2 μm) existing within the first small regions ($\sigma_b/5\times\sigma_b/5$ to 10×10 μm) for determining new representative figures.

The new representative figure i is rectangular and coordinates ($X_{Li}$, $Y_{Di}$) of the lower left corner and coordinates ($X_{Ri}$, $Y_{Ui}$) of the upper right corner are determined in the following manner as in (1) above.

$$x_{Li}=G_{1xi}-(1/2)(S_{1i})^{1/2}$$

$$x_{Ri}=G_{1xi}+(1/2)(S_{1i})^{1/2}$$

$$y_{Di}=G_{1yi}-(1/2)(S_{1i})^{1/2}$$

$$y_{Ui}=G_{1yi}+(1/2)(S_{1i})^{1/2}$$

(4) (C2)

The exposure dose corresponding to the first term $d_{2j}(x_j, y_j)$ is determined by using $U_j(x, y)$ determined in (2), $d_{0j}$, parameter g and the new representative figure defined in the first small region for the center $(x_j, y_j)$ of each of the second small regions.

$$V_{1j}(x_j,y_j)=\Sigma\{erf(x_{Ri}-X_i)-erf(x_{Li}-X_i)\}\times\{erf(y_{Vi}-Y_i)-erf(y_{Di}-Y_i)\}$$

$$d_{1j}(x_j,y_j)=\eta\{1/(1+\eta U(x_j,y_j))\times\{d_{0j}U(x_j,y_j)-V_{1j}(x_j,y_j)\}$$

where coordinates such as $x_{Ri}$ of $V_{1j}$ are those of the new representative figure obtained in (3).

(5) (f')

$d_{1j}$ determined in (4) is added to $d_{0j}$ obtained in (2).

(6) (R3)

Another new representative figure is determined as in (3) except that the representative figure obtained in (1) is used as figure before the subdivision and the second term of the formula for determining the exposure dose is used as exposure dose for weighting the subdivided figure. Alternatively, the figure obtained by subdividing the original representative figure into the second small regions may be used and corrective value $d_1$ for the exposure dose may be used weight to determine a new representative figure by calculation.

(7) (C3)

As in (4), the exposure dose corresponding to the third term $d_{2j}(x_j, y_j)$ is determined by means of the representative figure obtained in (6) and the following equations.

$$d_{2j}(x_j,y_j)=\eta\{1/(1+\eta U(x_j,y_j))\times\{d_{1j}U(x_j,y_j)-V_{2j}(x_j,y_j)\}$$

$$V_{2j}(x_j,y_j)=\Sigma(erf(x_{Ri}-x_j)-erf(x_{Li}-x_j))\times(erf(y_{Vi}-y_j)-erf(y_{Di}-y_j))$$

(8) (f")

The value determined in (7) is added to the value obtained in (5) to determine the exposure dose.

(4th Embodiment)

Figure 12:
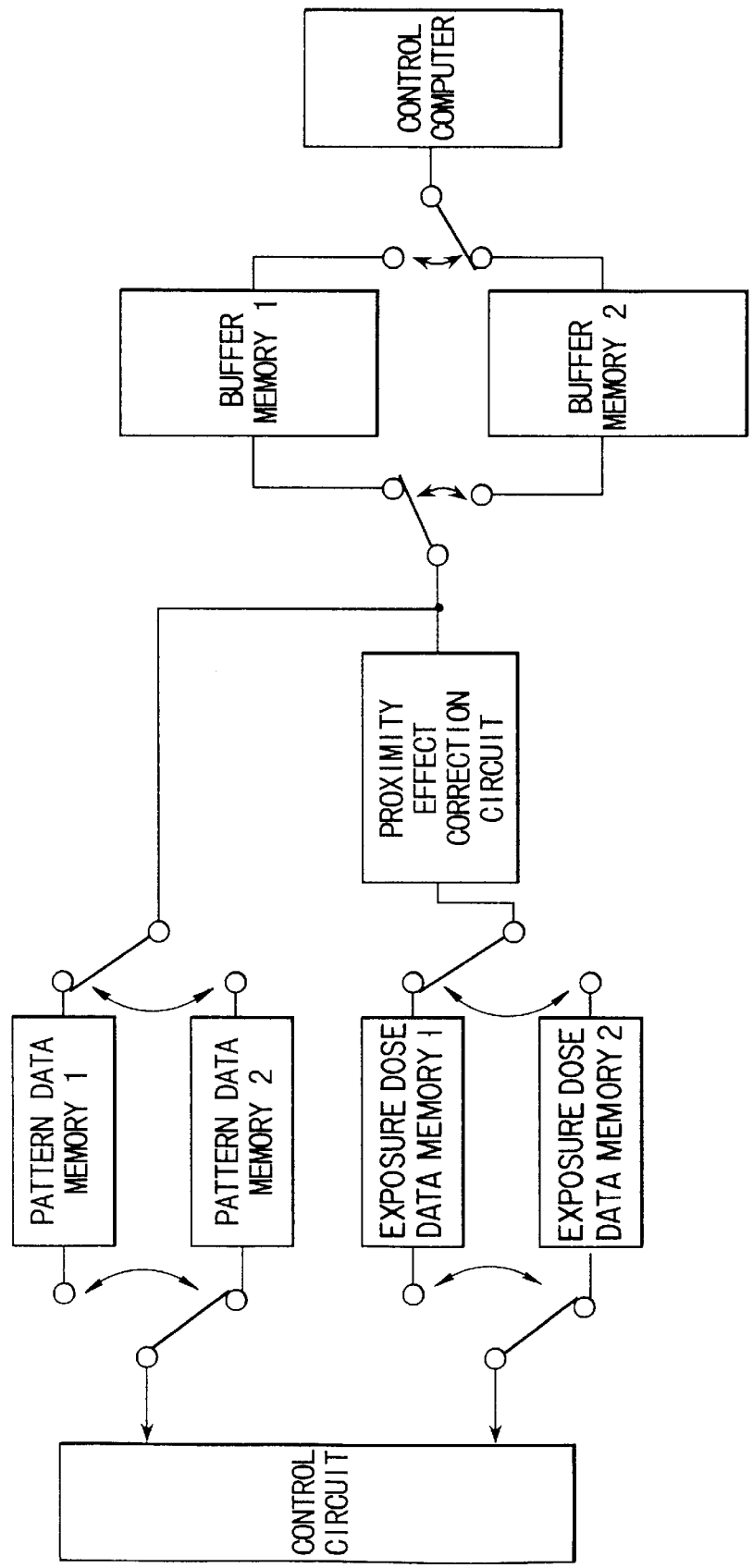
FIG. 12 is a block diagram of the circuit for carrying out operations for proximity effect correction for the fourth embodiment of the invention.

In this embodiment, a proximity effect correcting circuit is added to the control circuit section 36 of FIG. 5. FIG. 12 shows a block diagram of the circuit for carrying out operations for proximity effect correction for this embodiment.

The data for the LSI pattern to be drawn are transferred from the control computer to buffer memory 2 (buffer memory 1) on a stripe-by-stripe basis. The data on each stripe include not only those to be used for actually drawing the pattern but also additional data for all the patterns located outside it within a range of about 100 μm. These additional data are used only for correcting the proximity effect and not for the actual drawing operations.

During the transfer of data, the pattern data in the buffer memory 1 are sent to pattern data memory 1 (pattern data memory 2) and, at the same time, to proximity effect correcting circuit. The proximity effect correcting circuit calculates the correcting exposure dose for each region from the input pattern data and the result of calculation is sent to and stored in exposure dose data memory 1. The correcting operation will be described in detail hereinafter.

During the calculation operation, the pattern data stored in the pattern data memory 1 (pattern data memory 2) and the exposure dose data stored in the exposure dose data memory 2 (exposure dose data memory 1) are read and utilized for pattern drawing by the control circuit. The control operation may be conducted on a subfield basis or on the basis of several to hundreds subfields rather than on a stripe basis.

The input pattern data are compressed by utilizing a definition for repetition or arrangement. However, with the above described proximity effect correcting circuit (as will be described hereinafter), all the data are expanded and subjected to correcting calculations to determine the exposure dose for each of the small regions of 2.5×2.5 μm produced in the form of checkers on an entire stripe-shaped region for drawing. Therefore, the exposure dose data has a configuration different from that of FIG. 6 and the pointer data group does no not contain any pointer to an set of exposure dose data. Correspondingly, the processing procedures of the control circuit are altered as follows.

(1) It expands figure data.
(2) It divides the figure data into shots.
(3) It determines the center of each shot.
(4) It determines by calculation a small region where the center belongs.
(5) It reads in the exposure dose of the corresponding small region from the exposure dose data.
(6) It transmits the shot data and the exposure dose data to the next control circuit While subfields of 40×40 μm are selected by utilizing pointers and a corresponding small region is selected therefrom in the case of FIG. 6, no pointer is used in this embodiment and a small region is selected from the entire stripe-shaped drawing region (e.g., 500 μm×10 cm).

Now, the proximity effect correcting circuit will be described in detail.

Figure 13:
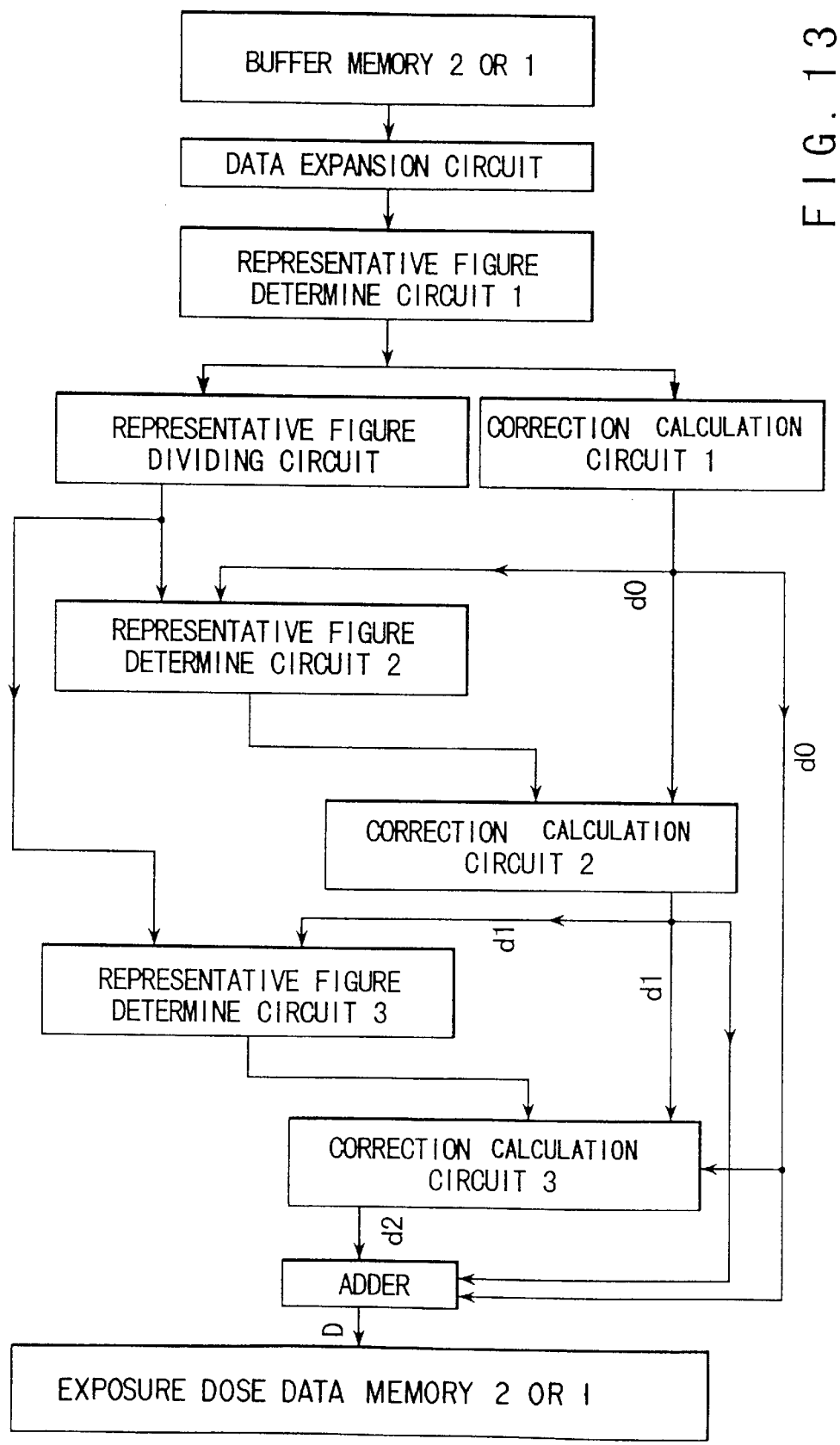
FIG. 13 is a block diagram of a proximity effect correcting circuit.

The circuit comprises as principal components a data expansion circuit, two representative figure producing circuits and two correcting calculation circuits. The arrangement of the circuits are illustrated in FIG. 13.

(1) data expansion circuit

This circuit is used to expand pattern data that have been compressed by repetitive or arrayal expressions.

(2) representative figure producing circuit 1

This circuit is used to prepare representative figures from the pattern data expanded by (1). The processing operations of this circuit are conducted on a subfield basis (40×40 μm). The subset field is divided into 10×10 μm regions. Then, after the pattern is correspondingly divided, the surface area of the pattern in each 10×10 μm region and its center of gravity are determined by calculation and a representative figure having the surface area and the center of gravity respectively same these are determined also by calculation.

FIGS. 14A and 14B schematically illustrate a representative figure producing circuit. Referring to FIGS. 14A and 14B, module D divide the patter on a region by region basis. Each figure is fed to module $D_1$ as input. The module $D_1$ divide a pattern located in a region of 40×40 μm into four unit regions. Thus, up to four figures are produced as output.

Module $D_{2-1}$ is responsible for the upper left region. The operation of this module corresponds to that of module $D_1$ and divides a pattern found in a region of 20×20 μm into portions corresponding to four regions of 10×10 μm.

Similarly, module $D_{2-2}$ is responsible for the upper right region of 20×20 μm and modules $D_{2-3}$ and $D_{2-4}$ are responsible for the lower left region of 20×20 μm and the lower right region of 20×20 μm. Thus, the operation of dividing the pattern into small regions by $D_1$ and $D_{2-1}$ through $D_{2-4}$ is completed.

Module P determines by calculation the area and the center of gravity of the pattern in each small region and then prepare a representative figure. More specifically, it carries out calculations of $$S=\Sigma S_i^*, G_x'=\Sigma G_{xi}^* \text{ and } G_y'=\Sigma G_{yi}$$

with data for individual figures i that are sequentially fed as inputs. After completing the operation of processing all the input patterns within a subfield, it carries out calculations of $$G_x=G_x'/S,\ G_y=G_y'/S$$

with data fed by the controller. The values of S, $G_x$ and $G_y$ represents the area and the location of the center of gravity in the small region.

The area and the center of gravity of each subdivided figure are obtained by calculation in a manner as described below.

(case 1) rectangle (dimensions: w and h, the coordinates of the lower left corner: x* and y*)

$$(area)=S_i=w\times h$$

$$(center\ of\ gravity)=G_{xi}^*=x^*+w/2$$

$$G_{yi}^*=y^*+w/2$$

(case 2) rectangular equilateral triangle 1 (the lower left corner being rectangular with coordinates of (x*, y*), two equal sides having a length of 1)

$$(area)=S_i=1\times\tfrac{1}{2}$$

$$(center\ of\ gravity)=G_{xi}^*=\tfrac{1}{3}+x^*$$

$$G_{yi}^*=\tfrac{1}{3}+y^*$$

(case 3) rectangular equilateral triangle 2 (the lower right corner being rectangular with coordinates of (x*, y*), two equal sides having a length of 1)

$$(area)=S_i=1\times\tfrac{1}{2}$$

$$(center\ of\ gravity)=G_{xi}^*=x^*-\tfrac{1}{3}$$

$$G_{yi}^*=y^*+\tfrac{1}{3}$$

(case 4) rectangular equilateral triangle 3 (the lower left corner being rectangular with coordinates of (x*, y*), two equal sides having a length of 1)

$$(area)=S_i=1\times\tfrac{1}{2}$$

$$(center\ of\ gravity)=G_{xi}^*=x^*+\tfrac{1}{3}$$

$$G_{yi}^*=y^*-\tfrac{1}{3}$$

(case 5) rectangular equilateral triangle 2 (the lower right corner being rectangular with coordinates of (x*, y*), two equal sides having a length of 1)

$$(area)=S_i=1\times\tfrac{1}{2}$$

$$(center\ of\ gravity)=G_{xi}^*=x^*-\tfrac{1}{3}$$

$$G_{yi}^*=y^*-\tfrac{1}{3}$$

Any geometric figure is divided into one or more than one rectangular equilateral triangles and/or rectangles, each of which is then processed for determining the area and the center of gravity according to an appropriate one of (case 1) through (case 5).

The circuit then determines the following values on the basis of the obtained area(s) and center(s) of gravity and transmits them to the representative figure dividing circuit and the correcting calculation circuit 1.

$$x_{Rj}=G_{xj}+\{(S_i)^{1/2}/2\}$$

$$x_{Lj}=G_{xj}-\{(S_i)^{1/2}/2\}$$

$$y_{Uj}=G_{yj}+\{(S_i)^{1/2}/2\}$$

$$y_{Dj}=G_{yj}-\{(S_i)^{1/2}/2\}$$

These values ($x_{Lj}$, $y_{Dj}$) and ($x_{Rj}$, $y_{Uj}$) correspond to the coordinates of the lower left corner and the upper right corner.

(3) representative figure dividing circuit (regional dimensions of 10×10 μm)

The representative figure prepared by the representative figure producing circuit 1 is divided into second regions, which are sufficiently smaller than the amplitude of back scattering of 10 μm and about 2.5×2.5 μm.

For the above example, data for up to nine figures are produced out of a representative figure (in each first regions) the circuit receives as input. FIG. 15 schematically illustrates the circuit. Basically, it has a circuit configuration similar to that of the figure dividing section of the representative figure producing circuit 1 described in (2) above. It divides 10×10 μm into four 5×5 μm in the first stage and subsequently each 5×5 μm into four 2.5×2.5 μm.

The operation of this circuit differs from that of the circuit of (2) in the following two points.

(A) (2), a large number of figures are sequentially fed to module $D_1$ because a number of LSI patterns are found in each subfield. With this circuit, on the other hand, only a single graph is fed to module $D_1$ because each of the first regions contains only a single representative figure.

(B), with this circuit, each of the second regions (with dimensions of 2.5×2.5 μm) contains a single divided figure and hence there is no need of arithmetic operations. The output of this circuit includes the area S and the center of gravity (x*, y*) for each of the second regions and is transmitted to the representative figure producing circuits 2 and 3.

(4) correction calculating circuit 1

The first optimal exposure dose is determined for each of the second regions by using the representative figures prepared for each of the first regions by the representative figure producing circuit 1.

A correcting calculation module is arranged for each of the second small regions (with dimensions of 2.5×2.5 μm) and determines by calculation the first optimal exposure dose on the basis of the representative figures existing around it (and prepared for each of the first small regions with dimensions of 10×10 μm, the output of (2)). The optimal exposure dose can be determined by carrying out the following calculations for the center (x, y) of each of the second small regions.

$$d_0(x_j, y_j) = 1/(\tfrac{1}{2} + \eta V)$$

$$U = \Sigma \{erf(x_{Ri} - x_j) - erf(x_{Li} - x_j)\} \times \{erf(y_{Vi} - y_j) - erf(y_{Di} - y_j)\}$$

$$erf = (\pi^{-\tfrac{1}{2}}) \int \exp(-u^2) du$$

The range of addition of Σ corresponds to the representative figures determined by (1) and existing within a range between $(x_j, y_j)$ and a circle with a diameter of $2\sigma_b$ to $3\sigma_b$ (20 μm to 30 μm). The calculations for erf may be conducted for each value of the function or by preparing a table for the values of erf and referring to the table at the time of calculation. The obtained first approximate optimal exposure dose is then transmitted to the representative figure producing circuit 2, the corrective calculation circuit 2 and the adder.

(5) representative figure producing circuits 2 and 3

Since these are functionally identical, only the producing circuit 2 will be described here by referring to FIG. 17.

The representative figure (output of the representative figure dividing circuit) prepared for each of the second small regions with dimensions of 2.5×2.5 μm and the exposure dose determined in the preceding step (in the case of the representative figure producing circuit 2) or the corrective value for the exposure dose determined in the preceding step (in the case of the representative figure producing circuit 3) are used as input for this circuit.

Each module M determines the following values, using the input data.

$$S_j'' = S_j^* \times d_j^*$$

$$G_{xj}'' = G_{xj}^* \times d_j^* \times S_j^*$$

$$G_{yj}'' = G_{yj}^* \times d_j^* \times S_j^*$$

where $S_j^*$ represents the area of the subdivided representative figure arranged in second small region j and $(G_{xj}, G_{yj})$ represents its center of gravity. The geometric center of second small region j may be used in place of the center of gravity.

In the case of the representative figure producing circuit 2, input $d_j^*$ is the output of the corrective calculation circuit 1 and equal to the first approximate does $d_0$. In the case of the representative figure producing circuit 3, on the other hand, input $d_j^*$ is the output of the corrective calculation circuit 1 and equal to the corrective value $d_0$ for the optimal exposure dose.

Then, the following values are calculated by using the values determined by the above calculations.

$$S_1' = \Sigma_j''$$

$$G_{xi}' = \Sigma_{xj}''$$

$$G_{yi}' = \Sigma_{yj}''$$

Then, $M_{1-1}$ operates for processing four second small regions with dimensions of 2.5×2.5 μm and determining $S_1'$ and $G_{x1}'$ in a region of 5×5 μm and produces the outcome as output. $M_2^*$ operates for processing four regions with dimensions of 5×5 μm and determining $S_1'$ and $G_{x1}'$ in the corresponding first region of 10×10 μm and produces the outcome as output. Module $Q_1$ determines the center of gravity $(G_{x1}, G_{yl})$ of the first small region by means of $$G_{x1} = G_{xj}'/S_1'$$

$$G_{yl} = G_{yj}'/S_1'$$

The area $S_1$ of the first small region is equal to $S_1'$.

Then, module $Q_1$ determines the following values, using $S_1, G_{x1}$ and $G_{y1}$, and produces the outcome to the corrective calculation circuit 2 (corrective calculation circuit 3) as output.

$$x_{Ri} = G_{xi} + (\tfrac{1}{2})(S_{li})^{1/2}$$

$$x_{Li} = G_{xi} - (\tfrac{1}{2})(S_{li})^{1/2}$$

$$y_{Ui} = G_{yi} + (\tfrac{1}{2})(S_{li})^{1/2}$$

$$y_{Di} = G_{yi} + (\tfrac{1}{2})(S_{li})^{1/2}$$

$(x_{Ri}, y_{Ui})$ and $(x_{Li}, y_{Di})$ correspond respectively to the upper right corner and the lower left corner if the representative figure is a rectangle.

(6) corrective calculation circuits 2 and 3

Since the corrective calculation circuits 2 and 3 are functionally identical, only the corrective calculation circuit 2 will be described here by referring to FIG. 19.

The representative figure corrected by the weight of a exposure dose (in the case of circuit 2) or the corrected representative figure corrected further by the weight of a exposure dose (in the case of circuit 3) and the first approximate optimal exposure dose $d_0$ are used as input for this circuit.

Then, the circuit produces as output corrective value $d_1$ (circuit 2) or $d_2$ for the exposure dose. Modules C in FIG. 19 are assigned respectively to the second small regions of about 2.5×2.5 μm and determine the following values, using the input data.

Firstly, it determines by calculation value $$V_j^*(x_j, y_j) = \Sigma(erf(x_{Ri} - x_j) - erf(x_{Li} - x_j)) \times (erf(y_{Vi} - y_j) - erf(y_{Di} - y_j))$$

where coordinates $(x_j, j)$ used for the exposure dose calculation represent the center of the second small region and $(x_{Ri}, y_{Vi})$ and $(x_{Li}, y_{Di})$ correspond respectively to the upper right corner and the lower left corner of the representative figure (rectangle) prepared in (5). The range of addition of $\Sigma$ corresponds to the representative figures determined by (1) and existing within a range between $(x_{ji}, y_j)$ and a circle with a diameter of $2\sigma_b$ to $3\sigma_b$ (20 μm to 30 μm).

A corrected exposure dose is determined by using the result of the above calculation for $V_j^*$.

Before carrying out arithmetic operations using specific values, the above formula should be modified as follows for the calculation circuit 2.

In equation $$d_{1j}(x_j, y_j) = \eta \times d_{0j}(x_j, y_j) \times \{d_{0j}U(x_j, y_j) - V_j^*(x_j, y_j)\}$$

U is eliminated by using $$d_{0j} = 1/\{(\tfrac{1}{2}) + \eta U(x_j, y_j)\}$$

to obtain $$d_{1j}(x_j, y_j) = 1 - \{d_{0j}(x_j, y_j)/2\} - \eta d_{0j}(x_j, y_j) V_j^*(x_j, y_j)$$

or $$d_{1j}(x_j, y_j) = 1 - d_{0j}[(\tfrac{1}{2}) - gV_j^*(x_j, y_j)].$$

The circuit determines the first approximate optimal exposure dose by using this formula and values such as $d_0$ and V.

The above formula should also be modified as follows for the calculation circuit 3.

$$d_{2j}(x_j, y_j) = d_{1j}(1 - d_{0j}/2) - \eta d_{0j}(x_j, y_j) V_j^*(x_j, y_j)$$

The circuit determines the second corrective value by using this formula and values such as $d_0$, $d_1$ and V.

(7) adder

This circuit carries out the operation of adding the first approximate exposure dose $d_0$ and the corrective values $d_1$ and $d_2$ for it and stores the obtained result in the corresponding exposure dose data memory.

(5th Embodiment)

This embodiment differs only partly from the above described fourth embodiment. The difference mainly lies in that, in this embodiment, representative figures always have dimensions of about 2.5×2.5 μm and are used for corrective calculations. On the other hand, a large representative figure is used for each region of 10×10 μm for corrective calculations.

This embodiment is substantially same as the fourth embodiment particularly in terms of stripe-based processing operations and the operation of adding all the pattern data existing within an area of about 100 μm on the outside of each of the lateral sides of the stripe. FIG. 20 is a block diagram of the circuit for carrying out operations for proximity effect correction for this embodiment.

(1) data expansion circuit

This circuit is used to expand pattern data that have been compressed by repetitive or arrayal expressions.

(2) representative figure producing circuit 1

This circuit is used to prepare representative figures from the pattern data expanded by (1). The processing operations of this circuit are conducted on a subfield basis (40×40 μm). The subset field is divided into 2.5×2.5 μm regions. Then, after the pattern is correspondingly divided, the surface area of the pattern in each 2.5×2.5 μm region is determined by calculation and a representative figure having the surface area same this is determined also by calculation.

The representative figure producing circuit has a configuration substantially as shown in FIGS. 14A and 14B. Referring to FIGS. 14A and 14B, module D divide the patter on a region by region basis. Each figure is fed to module $D_1$ as input. The module $D_1$ divide a pattern located in a region of 40×40 μm into four unit regions. Thus, up to four figures are produced as output.

Module $D_{2-1}$ is responsible for the upper left region. The operation of this module corresponds to that of module $D_1$ and divides a pattern found in a region of 20×20 μm into portions corresponding to four regions of 10×10 μm.

Similarly, module $D_{2-2}$ is responsible for the upper right region of 20×20 μm and modules $D_{2-3}$ and $D_{2-4}$ are responsible for the lower left region of 20×20 μm and the lower right region of 20×20 μm. Thus, up to four stages of telescopic module structure are arranged and the pattern is divided into small regions of 2.5×2.5 μm by means of this circuit. Module P determines by calculation the area of the pattern in each small region and then prepare a representative figure.

More specifically, it carries out calculations of $$S = \Sigma S_i^*$$

with data for individual figures i that are sequentially fed as inputs.

The area and the center of gravity of each subdivided figure are obtained by calculation in a manner as described below.

(case 1) rectangle (dimensions: w and h, the coordinates of the lower left corner: x* and y*)

$$(\text{area}) = S_i = w \times h$$

(case 2) rectangular equilateral triangle (the rectangular corner having coordinates of (x*, y*), two equal sides having a length of L)

$$(\text{area}) = S_i = L \times L/2$$

(case 3) polygonal having an angle of 45-degree

The polygonal is divided into one or more than one rectangular equilateral triangles and/or rectangles, each of which is then processed for determining the area and the center of gravity according to an appropriate one of (case 1) and (case 2).

The circuit then determines the following values on the basis of the obtained area(s) and center(s) of gravity and transmits them to the representative figure dividing circuit and the correcting calculation circuit 1.

$$x_{Rj} = G_{xj} + \{(S_i)^{1/2}/2\}$$

$$x_{Lj} = G_{xj} - \{(S_i)^{1/2}/2\}$$

$$y_{Ui} = G_{yj} + \{(S_i)^{1/2}/2\}$$

$$y_{Di} = G_{yj} - \{(S_i)^{1/2}/2\}$$

These values $(x_{Lj}, Y_{Di})$ and $(x_{Rj}, Y_{Ui})$ correspond to the coordinates of the lower left corner and the upper right corner. $(G_{xj}, G_{yj})$ represent the coordinates of the center of small region j of 2.5×2.5 μm.

(4) correction calcualting circuit 1

The first optimal exposure dose is determined for each small region by using the representative figures prepared for each of the first regions by the representative figure producing circuit 1.

A correcting calculation module is arranged for each of the second small regions (with dimensions of 2.5×2.5 μm)

and determines by calculation the first optimal exposure dose on the basis of the representative figures existing around it (and prepared for each of the small regions with dimensions of 2.5×2.5 μm, the output of (2)). The optimal exposure dose can be determined by carrying out the following calculations for the center (x, y) of each of the second small regions.

$$d_0(x_j, y_j) = 1/(\frac{1}{2} + \eta V)$$

$$V = \Sigma \{erf(x_{Ri}-x_j) - erf(x_{Li}-x_j)\} \times \{erf(y_{Vi}-y_j) - erf(y_{Di}-y_j)\}$$

$$erf = (\pi^{-\frac{1}{2}}) \int \exp(-u^2) du$$

The range of addition of ä corresponds to the representative figures determined by (1) and existing within a range between $(x_j, y_j)$ and a circle with a diameter of $2\sigma_b$ to $3\sigma_b$ (20 μm to 30 μm). The calculations for erf may be conducted for each value of the function or by preparing a table for the values of erf and referring to the table at the time of calculation. The obtained first approximate optimal exposure dose is then transmitted to the representative figure producing circuit 2, the corrective calculation circuit 2 and the adder.

(5) representative figure producing circuits 2 and 3

Since these are functionally identical, only the producing circuit 2 will be described here by referring to FIG. 22.

The surface area $S_j^*$ (output of the representative figure dividing circuit) of small region j with dimensions of 2.5×2.5 μm and the exposure dose determined in the preceding step (in the case of the representative figure producing circuit 2) or the corrective value $d_j^*$ for the exposure dose determined in the preceding step (in the case of the representative figure producing circuit 3) are used as input for this circuit.

Each module M determines the following value, using the input data.

$$S_j'' = S_j^* \times d_j.$$

where $S_j''$ represents the area of the new representative figure.

In the case of the representative figure producing circuit 2, input $d_j^*$ is the output of the corrective calculation circuit 1 and equal to the first approximate does $d_0$. In the case of the representative figure producing circuit 3, on the other hand, input $d_j^*$ is the output of the corrective calculation circuit 1 and equal to the corrective value $d_0$ for the optimal exposure dose.

Then, the following values are calculated by using the values determined by the above calculations.

$$x_{Ri} = G_{xj} + (\frac{1}{2})(S_j'')^{1/2}$$

$$x_{Li} = G_{xj} - (\frac{1}{2})(S_j'')^{1/2}$$

$$y_{Ui} = G_{yj} + (\frac{1}{2})(S_j'')^{1/2}$$

$$y_{Di} = G_{yj} + (\frac{1}{2})(S_j'')^{1/2}$$

$(G_{xj}, G_{yj})$ represent the coordinates of the center of the small region of 2.5×2.5 μm. $(x_{Ri}, y_{Ui})$ and $(x_{Li}, y_{Di})$ correspond respectively to the upper right corner and the lower left corner if the representative figure is a rectangle.

The circuit transmits the values of the two sets of coordinates to the corrective calculation circuit or 3.

(6) corrective calculation circuits 2 and 3

Since the corrective calculation circuits 2 and 3 are functionally almost identical, only the corrective calculation circuit 2 will be described here by referring to FIG. 19.

The representative figure corrected by the weight of a exposure dose (in the case of circuit 2) or the corrected representative figure corrected further by the weight of a exposure dose (in the case of circuit 3) and the first approximate optimal exposure dose $d_0$ are used as input for this circuit.

Then, the circuit produces as output corrective value $d_1$ (circuit 2) or $d_2$ for the exposure dose. Modules C in FIG. 19 are assigned respectively to the second small regions of about 2.5×2.5 μm and determine the following values, using the input data.

Firstly, it determines by calculation value $$V_j^*(x_j,y_j) = \Sigma\{erf(x_{Ri}-x_j)-erf(x_{Li}-x_j)\} \times \{erf(y_{Vi}-y_j)-erf(y_{Di}-y_j)\}$$

where coordinates $(x_j, _j)$ used for the exposure dose calculation represent the center of the second small region and $(x_{Ri}, y_{Vi})$ and $(x_{Li}, y_{Di})$ correspond respectively to the upper right corner and the lower left corner of the representative figure (rectangle) prepared in (5). The range of addition of $\Sigma$ corresponds to the representative figures determined by (1) and existing within a range between $(x_j, y_j)$ and a circle with a diameter of $2\sigma_b$ to $3\sigma_b$ (20 μm to 30 μm).

A corrected exposure dose is determined by using the result of the above calculation for $V_j^*$.

In the case of corrective calculation circuit 2, it uses the formula below as described earlier by referring to the fourth embodiment.

$$d_{1j}(x_j, y_j) = 1 - d_0[(\frac{1}{2}) - \eta V_j^*(x_j, y_j)].$$

The circuit determines the first approximate optimal exposure dose by using this formula and values such as $d_0$ and V.

In the case of corrective calculation circuit 3, it uses the formula below.

$$d_{2j}(x_j, y_j) = d_{1j}(1 - d_{0j}/2) - \eta d_{0j}(x_j, y_j) V_j^*(x_j, y_j)$$

The circuit determines the second corrective value by using this formula and values such as $d_0$, $d_1$ and V.

(7) adder

This circuit carries out the operation of adding the first approximate exposure dose $d_0$ and the corrective values $d_1$ and $d_2$ for it and stores the obtained result in the corresponding exposure dose data memory.

(6th Embodiment)

The formulas for determining the optimal exposure dose may be transformed in various different ways.

As described above by referring to the fourth and fifth embodiments, equation (3) can be transformed as follows.

$$\begin{aligned}d_n(x) &= \eta d_0(x)\{d_{n-1}(x) \cdot U(x) - V_n(x)\}\\ &= \eta d_0(x)[d_{n-1}(x)\{(1/(d_0(x)\eta) - 1/(2\eta)\} - V_n(x)]\\ &= \eta d_{n-1}(x)(1 - d_0(x)/2) - \eta d_0(x) \cdot V_n(x)\end{aligned}$$

Here, V(x) is eliminated by utilizing $$d_0(x) = 1/(\frac{1}{2} + \eta U(x))$$

Or, equation (3) may firstly be simplified as follows.

$$d_n(x) = \eta d_0(x) \int \{d_{n-1}(x) - d_{n-1}(x')\} \exp(-(x-x')^2) dx' \quad (3)'$$

While the inside of the integration is expressed by using the corrective value (for the exposure dose) of $d_{n-1}(x)$ obtained in the preceding step, it may be replaced by the exposure dose of $D_{n-1}(x)$ also obtained in the preceding step.

$$d_n(x) = \eta d_0(x) \int \{D_{n-1}(x) - D_{n-1}(x')\} \exp(-(x-x')^2) dx' \quad (3)''$$

where $D_n$ is the exposure dose up to the n-th degree or $D_n = D_{n-1} + d_n$.

The above replacement is permissible because the difference between (3)' and (3)'' is negligible for higher orders. In fact, it was proved by simulation that the accuracy level of (3)' and that of (3)'' are substantially the same.

As described below, the representative figure method can be utilized with (3)'' as well as with (3)' to say nothing of using representative figures for U(x). Equation (3)'' can be transformed as follows.

$$d_n(x) = \eta d_0(x)\{D_{n-1}(x)U(x) - V_n^*(x)\}$$

$$V_n^*(x) = \int \exp(-(x-x')^2) \cdot D_{n-1}(x')dx' \qquad (3)'''$$

The difference between $V_n^*(x)$ and $V_n(x)$ of (5) lies only in that $D_{n-1}(x')$ of the former is replaced by $d_{n-1}(x')$ of the latter. Thus, the representative figure method can be used with $V_n^*(x)$ as well as with $V_n(x)$.

More specifically, the following processing operations have to be carried out. The original representative figure designed for the first small regions (with a size of $\sigma_b \times \sigma_b$: about $10 \times 10\,\mu m$) is subdivided into the second small regions (with a size of $\sigma_b/5 \times \sigma_b/5$: about $2 \times 2\,\mu m$) the surface area of each of the second regions is weighted by $D_{n-1}(x')$. Then, the surface area and the center of gravity of each of the first regions are determined by calculation to prepare a new representative figure, which is used for the equation below.

$$V_n^*(x) = \int \exp(-(x-x')^2)dx'/\pi$$

For determining regulation coefficients $\eta \cdot d_0(x)$, any of the approximate exposure doses $D_1 = d_0(x)$, $D_2 = d_0 + d_1$, $D_3 = d_0 + d_1 + d_3$, ... obtained in the preceding step may be used in place of V(x). In other words, $\eta d_0(x)$ may be replaced by $\eta(d_0 + d_1)$ or by $\eta \times \{1/(\frac{1}{2}) + \eta(d_0 + d_1)\}$ because the difference that may arise by using $D_2$, $D_3$, ... is minimized by using U(x).

Still alternatively, the functions may be modified further. For instance, functional equations below may also be used.

$$d_0(x) = 1/[\frac{1}{2} + \eta\{V(x) + \alpha V(x)^2\}]$$

$$d_i(x) = \eta \times d_0(x) \times \int [\{d_{n-1}(x) + \beta d_{n-1}(x)^2\} - \{d_{n-1}(x') + \beta d_{n-1}(x')^2\}]dx'$$

or $$d_0(x) = 1/[\frac{1}{2} + \eta\{D(x) + \alpha D(x)^2\}]$$

$$d_i(x) = \eta \times [\frac{1}{2} + \eta\{D(x) + \gamma D(x)^2\}] \times \int [\{D_{n-1}(x) + \sigma D_{n-1}(x)^2\}X - \{D_{n-1}(x') + \sigma D_{n-1}(x')^2\}]dx'$$

Furthermore, $d_0$, $d_1$, $d_2$, ... may be determined in the following way.

Firstly, $d_0$ is determined as follows.

(1) A table showing the relationship between U and $d_0$ is prepared in advance. For example, the following equations may be used.

$$d_0(x_j, y_j) = 1/\{(\frac{1}{2}) + \eta V\}$$

$$d_0(x_j, y_j) = 1/\{(\frac{1}{2}) + \eta V + \sigma V^2 + \ldots\}$$

Optimal values for $\eta$, $\Sigma$ and other parameters have to be determined in advance.

Alternatively, optimal functions may be prepared for U and $d_0$ in advance by carrying out experiments and a table may be prepared for them without using the above functional relationship.

(2) The calculation operation proceeds as follows.

(i) U is determined.

(ii) $d_0$ is determined by using the table of (1) above.

The value of $d_2$ may be determined by using the equation below.

$$d_{2j} = \eta^* \times D_j^* \times \{d_{1j}U(x_j, y_j) - V_{2j}(x_j, y_j)\}$$

where $g^*$ may be same as g used for $d_{0j}$ above or may be modified to show a different value in order to utilize the effect of accelerating the calculation speed. However, note that the modified value should desirably be close to the value of g used for $d_{0j}$.

While the equation below may be used for $D_j^*$ as described above $$D_j^* = 1/[(\frac{1}{2}) + \eta U(x_j, y_j)]$$

or the equation below may alternatively be used.

$$D_j^* = D_{1j} = d_{0j} + d_{1j}$$
$$= 1/[(1/2) + \eta U(x_j, y_j)] + d_{1j}$$

The values for the above formulas may be determined by means of a table as in the case of $d_{0j}$ or by means of functional transformations.

The procedures of (1) through (5) do not necessarily have to be followed for calculation operations. Alternatively, it may be so arranged that the calculation operations are terminated automatically by calculating a given finite number of terms as described earlier. For instance, the calculation operations for formula (1) may be carried out only for the first two or three terms.

Still alternatively, it may be so arranged that, while the number of terms to be subjected to calculation operations is increased and the exposure doses selected at respective individual positions change accordingly, the operations are terminated when the rates of change fall under a predetermined level (e.g., 1%) for all the positions.

Or, it may be so arranged that the exposure dose E(x) of the resist at location x is expressed by the equation below.

$$E(x) = D(x)/2 + \eta\int D(x')g(x-x')dx'$$
$$= D(x)/2 + (\eta/\pi)\int D(x')\exp(-(x-x')^2)dx'$$

The second term is same as $V_n^*$ of formula (3)'''. The first term is the exposure dose obtained by calculation. Thus, it is easy to determine the value of E(x), while increasing the number of terms to be subjected to calculation operations. The calculation operations may be terminated when the rate of change in the value of E(x) that varies with location is found below a predetermined level (e.g., 0.5%) for all the positions.

Furthermore, formulas (2) through (5) may be transformed appropriately. For example, formula (2) may be transformed equivalently as follows.

$$d_0(x) = C/(C/2 + \eta C \cdot U(x))$$

where C is a constant.

Or, it may be transformed unequivalently as follows.

$$d_0(x) = C'/(p + kU(x))^n$$

where C', p, k and n are constants. Note that the ratio k/p is equal to $2\eta$ in formula (2).

Thus, the ratio may contain information including the magnitude $\eta$ of proximity effect. The ratio does not necessarily have to be set to $2\eta$ and may be subjected to regulating modifications according to various conditions including the resolution of electron beams irradiated onto the substrate.

C' and n can provide a certain level of correcting accuracy if they are not modified extremely (e.g., multiplied by ten). In this sense, they provide freedom of choice to a certain degree, although the constants desirably have respective values close to those shown below and indicated earlier.

$$C'=1, p=\tfrac{1}{2}, k=\eta \text{ and } n=1$$

Changes around 10 to 20% in the values may accelerate the calculation speed. The above statement applies also to formulas (3), (4) and (5). For instance, formulas (3) and (3)' may be transformed as follows.

$$d_n(x)=N_n(x)\times\{d_{n-1}(x)U(x)-V_n(x)\}$$

$$d_n(x)=N_n(x)\times\{D_{n-1}(x)U(x)-V_n^*(x)\}$$

$$N_n(x)=C_{2(n)}/\{k_{3(n)}+k_{4(n)}U(x,y)\}^{m2(n)}$$

Constants $C_{2(n)}$, $k_{3(n)}$, $k_{4(n)}$ and $m2(n)$ may be regulated appropriately. These constants may be made to vary depending on calculation term (n) before they are regulated individually.

Desirably, they have respective values close to those listed below.

$$C_{2(n)}=1, k_{3(n)}=\tfrac{1}{2}, k_{4(n)}=\eta \text{ and } m_{2(n)}=1$$

They may be so regulated that they show their respective values close to the above listed ones to consequently accelerate the calculation speed. Furthermore, the corrective value $d_i$ may be determined in a manner as shown below.

$$d_i(x)=N_n(x)\times[1/\{1-(d_{n-1}(x)U(x)-V_n(x))\}-1]$$

or $$d_i(x)=N_n(x)\times[1/\{1-(d_{n-1}(x)U(x)-V_n(x)^*)\}-1]$$

Since $d_{n-1}(x)U(x)-V_n(x)$ and $D_{n-1}(x)U(x)-V_n(x)^*$ respectively represent values smaller than 1, the range of approximation of the first degree and the above equations agree with each other for these values. These equations may be regulated further in terms of coefficient, constant and exponent.

(7th Embodiment)

In the second and third embodiments, the representative figure (C) prepared for the first time was used for preparing a new representative figure (C'') for the calculation operations on the third term. The representative figure (C) may be replaced by the representative figure (C') prepared for the calculation operations on the second term. The fourth and fifth embodiments may also be subjected to similar modifications.

In most of the embodiments described above, the center of each small region is used to determine and evaluate the exposure dose. However, the geometrical center may be replaced by the center of gravity of the pattern located within the small region. The center of gravity may be that of the original pattern or that of the newly prepared representative figure.

Furthermore, while the center of gravity is calculated for each newly formed representative figure in the above description, the center of gravity of the representative figure prepared for the first time may be used in the succeeding steps because the value of the positional change given rise to by weighting the exposure dose is slight and of a higher order.

While error function erf is used for the calculation operations on U and $V_n$ in the third and fifth embodiments, the following equations may alternatively be used.

$$U(x_j,y_j)=\Sigma \exp\{-(X_i^*-x_j)^2\}\times\exp\{-(Y_i^*-y_j)^2\}\times S_i$$

$$V_{1j}=\Sigma \exp\{-(X_i^*-x_j)^2\}\times\exp\{-(Y_i^*-y_j)^2\}\times S_i$$

$$V_{2j}=\Sigma \exp\{-(X_i^*-x_j)^2\}\times\exp\{-(Y_i^*-y_j)^2\}\times S_i$$

where $S_i$ is the total area of the pattern located within first small region i. Thus, the center of first small region (j) is expressed by coordinates $(X_i^*, Y_i^*)$.

Each of the first small regions ($2\times2$ $\mu$m, $2.5\times2.5$ $\mu$m) is dimensionally far smaller than the amplitude of back scattering.

(8th Embodiment)

As described earlier by referring to the seventh embodiment, the fourth and fifth embodiments may be modified in various different ways.

For example, while the corrective calculation operations of the fourth and fifth embodiments are conducted on a stripe basis for drawing a pattern, they may alternatively be conducted for a specific region in each stripe such as an area equal to the stripe width$\times$120 $\mu$m.

Furthermore, in the fourth embodiment, a representative figure is prepared for each of the first small regions of 10 $\mu$m$\times$10 $\mu$m on the basis of the original LSI pattern and the representative figure was divided further to produce a new representative figure for each of the second small regions. However, a representative figure for each of the second small regions of 2.5$\times$2.5 $\mu$m may alternatively be prepared from the original LSI pattern in the first place and, thereafter, a representative figure may be produced for each of the first small regions of 10$\times$10 $\mu$m.

FIG. 22 illustrates the circuit of the eighth embodiment for carrying out operations for proximity effect correction. This circuit differs from that of the fourth embodiment in that the representative figure producing circuit 1 and the representative figure dividing circuit of the fourth embodiment are replaced by representative figure producing circuits 1' and 2'. The representative figure producing 1' prepares directly a representative figure for each of the second small regions of 2.5$\times$2.5 $\mu$m from the original LSI pattern.

While the target is divided into small regions of 10$\times$10æm in the fourth embodiment, this embodiment is provided with a dividing circuit operating in four stages to produce small regions of 2.5$\times$2.5 $\mu$m. While the area and the center of gravity of each second small region may be determined by calculation operations similar to those of the fourth embodiment, the center of gravity may be replaced by the geometrical center of the second small region because the error incurred by the replacement is very small.

The representative figure producing circuit 2' of this embodiment is almost same as the representative figure producing circuit 2 of the fourth embodiment. It coordinates 16 second small regions of about 2.5$\times$2.5 $\mu$m to produce a representative figure in a first small region of 10$\times$10 $\mu$m.

The difference between the representative figure producing circuit 2 of the fourth embodiment and the representative figure producing circuit 2' of this embodiment is that the approximate exposure dose is not weighted by the representative figure producing circuit 2'. In other words, the representative figure producing circuit 2' may be realized by using the representative figure producing circuit 2 of the fourth embodiment and defining all the approximate exposure doses applied to it as input to be equal to 1.

(9th Embodiment)

Any of the component circuits of the above embodiments may be modified appropriately.

For instance, while a tree structure is used for the figure dividing module to prepare representative figures in the fourth and fifth embodiments in order to realize a high speed operation, alternatively, each of the subfields of 40×40 μm may be divided into very small regions of 0.1×0.1 μm (to 0.8×0.8 μm) and data may be prepared to show if a pattern exists in each of the very small regions (FIG. 23) so that representative figures may be produced by using such data.

This alternative procedures will be described by referring to FIG. 24. A bit map expansion circuit firstly resets the related memories to 0 to indicate that no figure exists in any of the very small regions. Then, it determines if a figure exists in each of the very small regions for the data supplied sequentially for the original LSI pattern and, if a figure is there, it set the related memory to 1.

After completing the above operation for all the figures in the subfields, it determines representative figures on the basis of the presence on absence of a figure in each of the subfields in the following manner. Firstly, a representative figure is prepared in each of the first small regions (10×10 μm) as in the case of the fourth embodiment. Assume here that each of the very small regions has a size of 0.6125 μm. This function can be achieved by means of a circuit having a configuration as described by referring to FIG. 17 for the fourth embodiment. FIG. 25 shows the circuit designed for this embodiment.

$M_{1-1}'$ carries out calculations operations for the following equations on four adjacently located very small regions of 0.6125 μm×0.6125 μm.

$$S_j(2)^* = \Sigma S_i(1)^*$$

$$G_{xj}(2)^* = \Sigma S_i(1)^* \times x_j^*$$

$$G_{yj}(2)^* = \Sigma S_i(1)^* \times y_j^*$$

The range of addition of Σ corresponds to the sum of the four very small regions and $S_i(1)^*$ represents bit map expansion data, which is equal to 1 when a pattern exists in a very small region and 0 when no pattern exists. Coordinates of $(x_j^*, y_j^*)$ represent the geometrical center of the very small region.

Similarly, $M_{2-1}'$ carries out calculations operations for the following equations on four adjacently located very small regions of 0.125 μm×0.125 μm.

$$S_j(3)^* = \Sigma S_i(2)^*$$

$$G_{xj}(3)^* = \Sigma S_i(2)^* \times G_{xi}(2)^*$$

$$G_{yj}(3)^* = \Sigma S_i(2)^* \times G_{yi}(2)^*$$

Similar operations are carried out sequentially to finally obtain the following values for each of the first small regions of 10×10 μm.

$$S_j^* = \Sigma S_i(1)^*$$

$$G_{xj}^* = \Sigma S_i(1)^* \times x_j^*$$

$$G_{yj}^* = \Sigma S_i(1)^* \times y_j^*$$

Then, module Q1 determines the center of gravity ($G_{xj}$, $G_{yj}$) of each of the first small regions (10×10 μm) as follows.

$$G_{xj}^* = G_{xj}^*/S_i$$

$$G_{yj}^* = G_{yj}^*/S_i$$

Then, the circuit carries out calculation operations for the following formulas on the basis of the above values and the area of $S_j^*$ to produce data on $(x_{Rj}, y_{Uj})$ and $(x_{Lj}, y_{dj})$ as output.

$$x_{Rj} = G_{xj} + \{(S_j^*)^{1/2}/2\}$$

$$x_{Lj} = G_{xj} - \{(S_j^*)^{1/2}/2\}$$

$$y_{Uj} = G_{yj} - \{(S_j^*)^{1/2}/2\}$$

$$y_{Dj} = G_{yj} + \{(S_j^*)^{1/2}/2\}$$

Representative figures can be determined by calculation for the eighth embodiment by means of bit map processing operations.

The bit map processing operation of this embodiment differs from the above described one in that calculation operations are terminated by the second small regions of about 2.5×2.5 μm and no center of gravity is determined correspondingly. Thus, the following procedures are used.
(1) An operation of bit map expansion is carried out.
(2) The surface area is determined by calculation for each of the second small regions of 2.5×2.5 μm.

FIG. 25 illustrates the configuration of the circuit used for the above operations. Alternatively, the operation can be realized by determining the number of ON(1)s added to each of the very small regions (0.6125×0.6125) existing in the small regions of 2.5×2.5 μm.
(10th Embodiment)

In the above described embodiments, corrective calculation operations are conducted in parallel for the second small regions for determining the exposure dose.

Conversely, the operations may be conducted in parallel for representative figures. Namely, calculation operations are conducted on formula $$\int \exp\{-(x-x')^2\}dx'$$

for each of the second small regions (having its center at x) located within a peripheral area of 2σ to 3σ of a representative figure and the obtained result is added to the second small region to carry out additions of U or $V_n$ for all the representative figures to determine the corrective value for the first approximate optimal exposure dose or the approximate optimal exposure dose.

The above procedures may be further modified as follows. Memory M for storing U or $V_n$ is cleared to zero in advance. Assume here that the coordinates of the upper right corner and that of the lower left corner of representative figure j are respectively $(x_{Rj}, Y_{Uj})$ and $(x_{Lj}, Y_{Dj})$. Then calculation operations for the formulas below are carried out.

$$\phi x,i,j = erf(x_{Rj}-X_i) - erf(x_{Lj}-X_i)$$

$$\phi y,i,j = erf(y_{Uj}-Y_i) - erf(y_{Dj}-Y_i)$$

where $X_i$ ($Y_i$) is the x(y)-coordinate of the center of each of the second small regions of 2.5×2.5 μm located within the corresponding subfield of 40×40 μm.

A total of 40/2.5=17 different solutions can be obtained for $\phi_{x,i,j}$ and also for $\phi_{y,i,j}$. Contribution $\Delta U^*$ of representative figure j to U(k, l) or $V_n$(k, l) is determined by calculation, using the solutions of $\phi_{x,i,j}$ and $\phi_{y,i,j}$ and added to the content of memory M. (k, l) denotes the small region that is the k-th along the x-direction and the l-th along the y-direction.

By carrying out the above processing operation for all the peripheral representative figures, memory M comes to store the value of U(k, l) or $V_n$(k, l).

The above operations can be carried out in parallel to realize an enhanced rate of operation. For instance, representative figures may be processed in parallel. A high speed operation can be realized by means of a pipe line processing technique or by means of a vector processing technique.

(11th Embodiment)

In the preceding embodiments, corrective operations are realized by means of parallel processing and modules having a tree structure. However, the present invention is not limited thereto. For example, each stripe may be divided into several to tens of several longitudinal and/or transversal sections (to be referred to as substripes hereinafter), to which respective modules are assigned to carry out processing operations in parallel for all the stripes.

The data for the substripes are prepared in advance by means of a conversion system. Such a conversion system may add pattern data for about a 100 μm area outside the boundary of each substripe to the data of the substripe for corrective calculations. The added pattern data are ignored when the drawing operation is carried out by means of an EB system.

The modules for processing substripes may include (those for producing representative figures), (those for determining a corrective value for the first approximate exposure dose), (those for modifying representative figures) and (those for determining a corrective value for the exposure dose). Alternatively, they may comprise microprocessors, memories and data transferring functional features and representative figures may be prepared by means of programs stored in the microprocessors.

(12th Embodiment)

Formulas (1) through (5) (or formulas obtained by transforming any of them) are used for corrective calculation operations in the preceding embodiments and a technique of "carrying out processing operations while transforming representative figures" is used for raising the operating speed.

However, the technique of "carrying out processing operations . . . " may be applied to other corrective calculations methods independently from formulas (1) through (5) (or formulas obtained by transforming any of them). This will be described below by way of examples.

Journal of Vacuum Science & Technology B11, p2746, (1003) (T. R. Groves) describes the following two calculation methods. Assume that D(x) represents an optimal exposure dose for location (x).

$$D(x)=\Sigma d_{(u)}(x) \quad (1)$$

$$d_{(0)}(x)=1/(1+\eta)$$

$$d_{(1)}(x)=\eta d_{(0)}(x)-\int d_{(0)}(x')\cdot g'(x-x')dx' \quad (*1)$$

$$d_{(u+1)}(x)=-\int d_{(u)}(x')\cdot g'(x-x') dx' \quad (*2)$$

$$D(x)=\Sigma d_{(u)}(x) \quad (2)$$

$$d_{(0)}(x)=1/(1+k\eta)$$

$$d_{(1)}(x)=k\eta d_{(0)}(x)-\int d_{(0)}(x')\cdot g'(x-x') dx' \quad (*3)$$

$$d_{(u+1)}(x)=-\int d_{(u)}(x')\cdot g'(x-x') dx' \quad (*4)$$

where k is the density of pattern and has a value between 0 and 1. The range of addition of ä is between 0 and infinite.

With any of these two calculation methods, most of the time is spent for the integrating operations for formulas (1*) to (*4). However, these operations can be carried out at higher speed by transforming the representative figures in the course of the operations. This is because all the integral portions appearing in the calculation operations for $d_{(i)}(x)$ have the form of $$\int d_{(i-1)}(x')\cdot g(x-x')dx'$$

and all the description on the proximity effect holds true here as will be understood by transforming the formula to $$\int g(x-x')\cdot [d_{(i-1)}(x')\cdot g(x-x')dx']$$

The operational procedures are practically same as those described above for the preceding embodiments. Take, for example, formula (2), those of this embodiment differ from the preceding procedures in that: 1): formula (5) is replaced by formulas (*3) and (*4) or $$d_{(1)}(x)=U(x)\,\eta d_{(0)}(x)-V_1{}^*(x)$$

$$d_{(u)}(x)=-V_{(u)}{}^*(x)$$

$$V_{(u)}{}^*=\Sigma\{erf(x_{Ri}-x_j)-erf(x_{Li}-x_j)\}+\{erf(y_{Vi}-y_j)-erf(y_{Di}-U_j)\}$$

obtained by transforming formulas (*3) and (*4), 2): the calculations on $d_i$ is looped for i as means for confirming the convergence and 3): the operations of the circuit are looped corresponding to 2) if the circuit is configured as in the fourth and fifth embodiments.

(13th Embodiment)

While the surface area is used as a value for characterizing the pattern in each small region in any of the preceding embodiments and a representative figure is prepared by using the value. Furthermore, the value is used for corrective calculation operations. However, the surface area does not necessarily have to be used for the purpose of the invention.

This embodiment does not use any surface area. Assume that the entire area of the pattern to be formed is divided into the first small regions and any of the small regions do not overlap with each other and each of the small regions is dimensionally smaller than the amplitude of back scattering. If small region i has dimensions of $2\Delta i \times 2\Delta i^*$ and the surface area of the pattern existing in the inside of the small region is Si, then the pattern density ρi of the small region is expressed by $Si/(2\Delta I\times 2\Delta i^*)$.

If the pattern density is used in place of the surface area, the calculation operations can be conducted in the following way. For the purpose of simplicity, only the first two terms of formula (1) will be used for calculation operations.

(1) The area to be drawn is divided into the first small regions and the pattern density qi of each of the small regions is determined.

(2) An approximate value of the first degree is determined as follows.

(i) Approximate value U(xi) is determined for the back scattering.

$$U(xi)=\Sigma\,\exp\,\{-(X_i-x_j')\}\cdot\rho(x_j')$$

where the sum is calculated at least for all the first small regions found within a circle having its center at $x_i$ or for all the first small regions located at least partly within the circle.

(ii) Approximate value of the first degree $d_0$ is determined by means of U.

$$d_0(xi)=1/\{\tfrac{1}{2}+\eta U(x)\}$$

(3) The density qi is modified to qi' by using the formula below.

$$\rho i'=\rho i\times d_0(xi)$$

(4) Approximate value of the second degree $d_0+d_1$ is determined as follows.

(i) Corrective value $d_1$ is determined.
    (a) Approximate value $V_1$ of back scattering due to $d_0$ is determined by means of the formula below.

$$V_1(x_i)=\Sigma\,\exp\,\{-(x_i-x_j')^2\cdot\rho'(x_j')\}$$

(b) Corrective value $d_1$ is determined as follows.

A value of n=1 is used for the formula described in the sixth embodiment along with the formula below.

$$d_1(x_i) = \eta d_0(x_i)\{1 - d_0(x_i)/2\} - \eta d_0(x_i) \cdot V_1(x_i)$$

(ii) $d_0 + d_1$ is calculated to provide an approximate value of the second degree.

A computer may be used on an off-line basis for the above calculation operations. Alternatively, a circuit similar to the one described by referring to the fifth and eight embodiments may be used.

(14th Embodiment)

FIG. 26 is a block diagram of the electron beam writing system used in this fourteenth embodiment of the invention. The components similar to those of FIG. 5 are denoted respectively by the same reference symbols and will not be described any further.

This apparatus differs from the apparatus of FIG. 5 in the configuration of the control circuit section 70. Otherwise, the two apparatus are identical. FIG. 27 is a block diagram of a control circuit section that can be used for the apparatus of this embodiment.

The control circuit section 70 comprises four buffer memories 71a through 71d for temporarily store LSI pattern data on a stripe basis, an auxiliary region addition circuit 72 for addition data on auxiliary regions to the pattern data, a pair of buffer memories 73a and 73b for temporarily store the pattern data including the data for auxiliary regions added thereto, a proximity effect correcting circuit 74 for determining the corrective exposure dose for correcting the proximity effect for each region, an auxiliary region separating circuit 75 for separating the data for auxiliary regions and data for the regions of the proper pattern, a pair of exposure dose data memories 76a and 76b, a pair of pattern data memories 77a and 77b and a control circuit 78 for controlling the blanking control circuit section 34 and the variable shaped beam dimension control circuit section 35 on the basis of the data of the memories 76 and 77.

The data on the LSI pattern are sequentially transmitted from the control computer 37 to the buffer memories 71a, 71b, 71c and 71d on a stripe-by-stripe basis. As data are transmitted to the buffer memory 71d, the auxiliary region addition circuit 72 selects the buffer memories 71a, 71b and 71c and retrieves the pattern data for the upper auxiliary regions from the buffer memory 71a, the proper pattern data from the buffer memory 71b and the pattern data for the lower auxiliary regions from the buffer memory 71c and combines them into a set of pattern data that include data for the auxiliary regions.

Both the upper auxiliary regions and the lower auxiliary regions correspond to the amplitude of back scattering of electron beams. Therefore, the pattern data including those for the auxiliary regions contain the data on the adjacent stripes of each stripe to compensate the influence of back scattering. Thus, the calculation operations of determining proximity effect correcting values conducted on a stripe-by-stripe basis can realize a highly precise correction. Note that the use of upper and lower auxiliary regions that are greater than the amplitude of back scattering of electron beams does not give rise to any problem. In some cases, pattern data for three consecutive stripes may be used.

The pattern data of a stripe including those for the auxiliary regions are then transferred from the auxiliary region addition circuit 72 to the buffer memory 73a (or 73b). The pattern data including those for the auxiliary regions stored in the buffer memory 73a are then transferred to the proximity effect producing circuit 74 and, at the same time, to the auxiliary region separating circuit 75. The proximity effect producing circuit 74 calculates the corrective does for each region from the pattern data it receives. Simple approximation formulas (such as described in J. M. Parkovich, Journal of Vacuum Science and Technology B4, p159 (1986)) may be used here. The results of the calculation operations are then sent to the exposure dose data memory 76a (or 76b), which stores the transmitted data.

On the other hand, the auxiliary region separating circuit 75 separates the data for the proper pattern and those for the auxiliary regions contained in the pattern data including those for the auxiliary regions because the auxiliary regions are used only by the proximity effect producing circuit 74 and not for the drawing operation. The pattern data for the proper pattern that are free from the data for the auxiliary regions are then transmitted to the pattern data memory 77a (or 77b), which stores the transmitted data.

In the same way, another set of pattern data including those for the auxiliary regions are prepared by the auxiliary region addition circuit 72 on the basis of the data stored in the buffer memories 71b, 71c and 71d and transmitted to the buffer memory 73b. At this time, another set of pattern data for the stripe next to the one stored in the buffer memory 71d are sent to the buffer memory 71a. Then, in a manner as described above, the proximity effect producing circuit 74 calculates the corrective exposure dose for each region from the supplied pattern data and transmits the outcome to the exposure dose data memory 76b, which stores the transmitted data. On the other hand, the auxiliary region separating circuit 75 separates the data for the proper pattern and those for the auxiliary regions contained in the pattern data including those for the auxiliary regions and the pattern data for the proper pattern that are free from the data for the auxiliary regions are then transmitted to the pattern data memory 77b, which stores the transmitted data.

During the calculation operations, the pattern data obtained previously and stored in the pattern data memory 77a and the exposure dose data stored in the exposure dose data memory 76a are read by the control circuit 78 for drawing operations.

The above operational procedures are repeated by appropriately switching the buffer memories 73a and 73b, the exposure dose data memories 76a and 76b and the buffer memories 77a and 77b so that a pattern may be drawn continuously on a stripe-by-stripe basis.

As described above, since a drawing operation and a calculation operation of proximity effect correction are conducted simultaneously, the additional time required for all the calculations to be carried out for proximity effect correction for the entire pattern is only equal to the time required for the calculations for the first stripe. If, for example, the time required for the calculations for proximity effect correction and the time required for the drawing operation are both an hour and a total of 100 stripes are used, then the time consumed for a single stripe may be 36 seconds. Therefore, the extra time required for the overall drawing operation is only 36 seconds to make the total time equal to 1 hour and 36 seconds. Thus, the present invention allows a very fast proximity effect correcting operation.

While the data for one or more than one auxiliary regions are added to the data for each stripe by the control circuit section 70 in the above embodiment, the auxiliary region addition circuit 72 may be omitted if the data for auxiliary regions are added to the pattern data prepared on a stripe-by-stripe basis. More specifically, it may be so arranged that the data for auxiliary regions are added to the pattern data prepared on a stripe-by-stripe basis by the data conversion computer 38 when the design data (CAD data) are transformed into figure drawing data and the data containing those for the auxiliary regions are transferred to the control circuit section 70.

The control circuit section 70 of this embodiment may be modified to show a configuration as illustrated in FIG. 28. In the arrangement of FIG. 28, the auxiliary region separating circuit 75 is replaced by a drawing pattern data selection circuit 79 that selects data from those stored in the buffer memory 71 and transmits them to the pattern data memory 77.

In the case of FIG. 27, data on auxiliary regions are added to the pattern data prepared on a stripe-by-stripe basis by the auxiliary region addition circuit 72 but they are not necessary for actual drawing operations so that an auxiliary region separation circuit 75 has to be provided to remove them from the data for the proper pattern. In the arrangement of FIG. 28, on the other hand, the auxiliary region addition circuit 75 is unnecessary because the pattern data are singled out by the drawing pattern data selection circuit 79 before the data for the auxiliary regions are added to the data for the proper pattern.

[other possible embodiments]

The present invention is not limited to the above embodiments. While the above embodiments are described in terms of electron beam writing system using variable shaped beams, the present invention can be applied to writing system of other types. Additionally, the present invention is also applicable to ion beam writing system that uses not electron beams but ion beams.

FIG. 29A shows a case that a correction circuit is apart from drawing circuit. In this case, it is necessary to transfer data between circuits. FIG. 29B shows the sequence thereof. In FIG. 29B, the correction circuit calculates corrected exposure dose of the stripe 4 during drawing the stripe 2, and the figure data of the stripe 3 is transferred from the correction circuit to the drawing circuit.

FIG. 30 shows an example of realizing a multi-drawing of the stripe in addition to the above case. The multi-drawing of the stripe is a method of drawing the figure by gradually shifting the drawing area (stripe). FIG. 30 shows the case of drawing near the boundary of stripes 1 and 2. In FIG. 30, the correction circuit calculates corrected exposure dose of the stripe 4, and the figure data of the stripe 3 is transferred from the correction circuit to the drawing circuit.

Furthermore, the present invention is not limited to charged particle writing system. For example, the present invention can be used for applications other than preparing a resist patter directly on a wafer. Such applications may include those for preparing X-ray masks, masks for optical steppers and reticles. The above embodiments may be changed or modified without departing from the spirit and scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A charged particle beam writing method for determining an optimal exposure dose for each position in a pattern to be drawn on a target before actually drawing the pattern by irradiating the target with charged particles and drawing the pattern with the obtained optimal exposure doses, comprising:

the first step of determining the first approximate optimal exposure dose for each position on said target;

the second step of determining the second optimal exposure dose for each position on said target by determining a corrective value di for correcting said first approximate optimal exposure dose obtained by multiplying the error in the exposure dose of the position produced when exposed to said first approximate optimal exposure dose by a regulation coefficient of a value substantially equal to the exposure dose U(x, y) to back scattering charged particles and adding said corrective value to said first approximate optimal exposure dose, said exposure dose being variable as a function of the location (x, y) of the position;

the third step of repeating one of (1) the second step for a predetermined number of times, (2) the second step until each of said second approximate optimal exposure doses tends to converge, and (3) the second step until all the errors in said second approximate optimal exposure doses are found within a predetermined value.

2. A charged particle beam writing method according to claim 1, wherein, if the exposure dose of the applied resist at location (x', y') is g(x−x', y−y') when charged particles are made to strike a single position (x, y) and the exposure dose to back scattering charged particles at location (x, y) is expressed by $$U(x,y)=\int g(x-x',y-y')$$

when the entire pattern is exposed to a unique and even exposure dose, the first approximate optimal exposure dose for location (x, y) of each position to be used in said first step is set to $$C_1/(K_1+K_2U(x,\ y))^{m1}$$

and the error in the exposure dose to be used in said second step is made equal to $$\int\{d_{i-1}(x,y)-d_{i-1}(x',y')\}g(x-x',y-y')\ dx'dy'$$

where $d_{i-1}$ is the corrective value obtained by the immediately preceding step or equal to $$\int\{D_{i-1}(x,y)-D_{i-1}(x',y')\}g(x-x',y-y')\ dx'dy'$$

using $D_{i-1}$ is the exposure dose obtained by the immediately preceding step, the corrective value $d_i$ being obtained by multiplying the error in the exposure dose by a regulation coefficient of $$C_2/(K_3+K_4U(x,\ y))^{m2}$$

or $$C_2/(K_3+K_4\tilde{D})(x,\ y))^{m2}$$

where $\tilde{D}(x,\ y)$ is one of the several approximate exposure doses obtained by said second step, $C_1$ is a constant to be regulated in correspondence to the level of standard exposure dose, $K_1$ and $K_3$ are constants for regulating the influence of the resolution of charged particles and that of the front scattering and have respective values between 0.2 and 1.0, $K_2$ and $K_4$ are values, each expressing a degree of proximity effect and having a value between 0.5η and 3η where η is the ratio of the exposure dose of the resist to forward scattering charged particles to that of the resist to back scattering charged particles when the resist has a overall area entirely exposed to charged particles and sufficiently greater than the area exposed to back scattering charged particles, and n and m are exponents having appropriate respective values between 0.5 and 3.

3. A charged particle beam writing method according to claim 2, wherein, for determining the exposure dose U(x, y) to back scattering charged particles, the entire area to be lithographed is divided into small regions (first small regions), each being substantially equal to or smaller than the area exposed to back scattering charged particles to determine several different values characteristic to more than one element patterns existing inside each of the small regions, and the exposure dose U(x, y) is determined by using said several characteristic values or by determining one to several simple figures having several characteristic values same as said several characteristic values and using these figures in place of the original LSI pattern.

4. A charged particle beam writing method according to claim 3, further comprising steps of determining by calculation one of the effective exposure dose U and ηU to back scattering charged particles, an approximate optimal exposure dose and a corrective value for effectively correcting the approximate optimal exposure dose for each small region (second small region) sufficiently smaller than the area exposed to back scattering charged particles and used to divide the entire area to be lithographed;

as operation of calculating the error in the exposure dose, determining a corrective value for correcting the approximate optimal exposure dose or a new approximate optimal exposure dose either by using the characteristic values for each of the first small regions determined in the preceding step (a) or by using new characteristic values obtained by determining new characteristic values characterizing each of said first small regions, using the corrective value $d_{i-1}$ obtained in the immediately preceding step or the weight of the approximate optimal exposure dose $D_{i-1}$ obtained in the preceding steps, or by determining new figures obtained from said new characteristic values to replace the original figures in each of the first small regions for each of the minute regions in the figures produced on the basis of said characteristic values; and carrying out a weighting operation for each of the locations (a), using the second small regions as units.

5. A charged particle beam writing method according to claim 4, wherein, in one of said step of determining correction amounts and said step of determining approximate optimal exposure dose, the first regions have surface areas sufficiently smaller than the amplitude σ of the back scattering and the characteristic values are obtained by multiplying the surface area of the pattern in each of said first small regions by the corrective value $d_{i-1}$ obtained in the immediately preceding step or the weight of the approximate optimal exposure dose $D_{i-1}$ obtained in the preceding steps.

6. A charged particle beam writing method according to claim 4, wherein, in the above step of determining new characteristic values, the first small regions have surface areas between ½ and 2 times of the amplitude σ of the back scattering and the characteristic values characterizing each of said first small regions are surface area=$\Sigma S_j$, center of gravity x=$(\Sigma G_{xj} S_j)/(\Sigma S_j)$, and center of gravity y=$(\Sigma G_{yj} S_j)/(\Sigma S_j)$ where, σ covers all the second small regions located within the first small regions, $S_j$ represents the new surface area of the inside of each of said second small regions effectively obtained by multiplying the surface area of the pattern found within the second small region j that is sufficiently smaller than the amplitude å of the back scattering existing in each of the first small regions by the corrective value $d_{i-1}$, and $G_{xj}$ and $G_{yj}$ represent the center of gravity of said pattern.

7. A charged particle beam writing method according to claim 3, wherein said several characteristic values are those representing the surface areas of all the element patterns existing in the first small regions or the centers of gravity of the all the element patterns existing in the first small regions.

8. A charged particle beam writing method according to claim 7, further comprising steps of determining by calculating one of the effective exposure dose U and ηU by back scattered charged particles, an approximate optimal exposure dose and a corrective value for effectively correcting the approximate optimal exposure dose for each small region (second small region) sufficiently smaller than the area exposed to back scattering charged particles and used to divide the entire area to be lithographed;

as operation of calculating the error in the exposure dose, determining a corrective value for correcting the approximate optimal exposure dose or a new approximate optimal exposure dose either by using the characteristic values for each of the first small regions determined in the preceding step (a) or by using new characteristic values obtained by determining new characteristic values characterizing each of said first small regions, using the corrective value $d_{i-1}$ obtained in the immediately preceding step or the weight of the approximate optimal exposure dose $D_{i-1}$ obtained in the preceding steps, or by determining new figures obtained from said new characteristic values to replace the original figures in each of the first small regions for each of the minute regions in the figures produced on the basis of said characteristic values; and carrying out a weighting operation for each of the locations (a), using the second small regions as units.

9. A charged particle beam writing method according to claim 8, wherein, in one of said step of determining correction amounts and said step of determining approximate optimal exposure dose, the first regions have surface areas sufficiently smaller than the amplitude σ of the back scattering and the characteristic values are obtained by multiplying the surface area of the pattern in each of said first small regions by the corrective value $d_{i-1}$ obtained in the immediately preceding step or the weight of the approximate optimal exposure dose $D_{i-1}$ obtained in the preceding steps.

10. A charged particle beam writing method according to claim 8, wherein, in the above step of determining new characteristic values, the first regions have surface areas between ½ and 2 times of the amplitude σ of the back scattering and the characteristic values characterizing each of said first small regions are surface area=$\Sigma S_j$, center of gravity x=$(\Sigma G_{xj} S_j)/(\Sigma S_j)$, and center of gravity y=$(\Sigma G_{yj} S_j)/(\Sigma S_j)$ where, σ covers all the second small regions located within the first small regions, $S_j$ represents the new surface area of the inside of each of said second small regions effectively obtained by multiplying the surface area of the pattern found within the second small region j that is sufficiently smaller than the amplitude å of the back scattering existing in each of the first small regions by the corrective value $d_{i-1}$, and $G_{xj}$ and $G_{yj}$ represent the center of gravity of said pattern.

11. A charged particle beam writing method according to claim 2, wherein, for determining the exposure dose U(x, y) to back scattering charged particles, the entire area to be lithographed is divided into small regions (first small regions), each being substantially equal to or smaller than the area exposed to back scattering charged particles to determine several different values characteristic to more than one element patterns existing inside each of the small regions, and the exposure dose U(x, y) is determined by using said several characteristic values or by determining one to several simple figures having several characteristic values same as said several characteristic values and using these figures in place of the original LSI pattern.

12. A charged particle beam writing method according to claim 11, further comprising steps of determining by calculation one of the effective exposure dose U and ηU to back scattering charged particles, an approximate optimal exposure dose and a corrective value for effectively correcting the approximate optimal exposure dose for each small region (second small region) sufficiently smaller than the area exposed to back scattering charged particles and used to divide the entire area to be lithographed;

as operation of calculating the error in the exposure dose, determining a corrective value for correcting the approximate optimal exposure dose or a new approximate optimal exposure dose either by using the characteristic values for each of the first small regions determined in the preceding step (a) or by using new characteristic values obtained by determining new characteristic values characterizing each of said first small regions, using the corrective value $d_{i-1}$ obtained in the immediately preceding step or the weight of the approximate optimal exposure dose $D_{i-1}$ obtained in the preceding steps, or by determining new figures obtained from said new characteristic values to replace the original figures in each of the first small regions for each of the minute regions in the figures produced on the basis of said characteristic values; and carrying out a weighting operation for each of the locations (a), using the second small regions as units.

13. A charged particle beam writing method according to claim 12, wherein, in one of said step of determining correction amounts and said step of determining approximate optimal exposure dose, the first regions have surface areas sufficiently smaller than the amplitude σ of the back scattering and the characteristic values are obtained by multiplying the surface area of the pattern in each of said first small regions by the corrective value $d_{i-1}$ obtained in the immediately preceding step or the weight of the approximate optimal exposure dose $D_{i-1}$ obtained in the preceding steps.

14. A charged particle beam writing method according to claim 12, wherein, in the above step of determining new characteristic values, the first regions have surface areas between ½ and 2 times of the amplitude σ of the back scattering and the characteristic values characterizing each of said first small regions are surface area=$\Sigma S_j$, center of gravity x=$(\Sigma G_{xj}S_j)/(\Sigma S_j)$, and center of gravity y=$(\Sigma G_{yj}S_j)/(\Sigma S_j)$ where, σ covers all the second small regions located within the first small regions, $S_j$ represents the new surface area of the inside of each of said second small regions effectively obtained by multiplying the surface area of the pattern found within the second small region j that is sufficiently smaller than the amplitude å of the back scattering existing in each of the first small regions by the corrective value $d_{i-1}$ and $G_{xj}$ and $G_{yj}$ represent the center of gravity of said pattern.

15. A charged particle beam writing method according to claim 11, wherein said several characteristic values are those representing the surface areas of all the element patterns existing in the first small regions or the centers of gravity of the all the element patterns existing in the first small regions.

16. A charged particle beam writing method according to claim 15, further comprising steps of determining by calculation one of the effective exposure dose U and ηU to back scattering charged particles, an approximate optimal exposure dose and a corrective value for effectively correcting the approximate optimal exposure dose for each small region (second small region) sufficiently smaller than the area exposed to back scattering charged particles and used to divide the entire area to be lithographed;

as operation of calculating the error in the exposure dose, determining a corrective value for correcting the approximate optimal exposure dose or a new approximate optimal exposure dose either by using the characteristic values for each of the first small regions determined in the preceding step (a) or by using new characteristic values obtained by determining new characteristic values characterizing each of said first small regions, using the corrective value $d_{i-1}$ obtained in the immediately preceding step or the weight of the approximate optimal exposure dose $D_{i-1}$ obtained in the preceding steps, or by determining new figures obtained from said new characteristic values to replace the original figures in each of the first small regions for each of the minute regions in the figures produced on the basis of said characteristic values; and carrying out a weighting operation for each of the locations (a), using the second small regions as units.

17. A charged particle beam writing method according to claim 16, wherein, in one of said step of determining correction amounts and said step of determining approximate optimal exposure dose, the first regions have surface areas sufficiently smaller than the amplitude σ of the back scattering and the characteristic values are obtained by multiplying the surface area of the pattern in each of said first small regions by the corrective value $d_{i-1}$ obtained in the immediately preceding step or the weight of the approximate optimal exposure dose $D_{i-1}$ obtained in the preceding steps.

18. A charged particle,beam writing method according to claim 16, wherein, in the above step of determining new characteristic values, the first regions have surface areas between ½ and 2 times of the amplitude σ of the back scattering and the characteristic values characterizing each of said first small regions are surface area=$\Sigma S_j$, center of gravity x=$(\Sigma G_{xj}S_j)/(\Sigma S_j)$, and center of gravity y=$(\Sigma G_{yj}S_j)/(\Sigma S_j)$ where, σ covers all the second small regions located within the first small regions, $S_j$ represents the new surface area of the inside of each of said second small regions effectively obtained by multiplying the surface area of the pattern found within the second small region j that is sufficiently smaller than the amplitude å of the back scattering existing in each of the first small regions by the corrective value $d_{i-1}$, and $G_{xj}$ and $G_{yj}$ represent the center of gravity of said pattern.

19. A charged particle beam writing method for drawing a desired pattern by processing a first set of figure data for drawing the pattern on a stripe by stripe basis and irradiating the surface of a target with charged particles comprising steps of:

the first step of dividing said figure data for drawing the pattern into a plurality of stripes having predetermined respective regions;

the second step of preparing a second set of figure data for drawing the pattern by adding data for a region greater than the amplitude of back scattering of charged particles of the figure data of at least one of the stripes located adjacent at least to an end of a desired stripe at least to said end of the desired stripe;

the third step of calculating optimal exposure dose by calculating correction proximity effect for said second set of figure data; and the fourth step of drawing the pattern according to the figure data contained in said desired stripe on the basis of the calculated optimal exposure dose, wherein the second and third steps are conducted for another stripe simultaneously with said fourth step.

20. A charged particle beam writing method according to claim 19, wherein said second step is conducted simultaneously with the step of transforming design data into figure data for the pattern to be drawn.

* * * * *